United States Patent [19]

Sunami et al.

[11] Patent Number: 5,357,131
[45] Date of Patent: Oct. 18, 1994

[54] SEMICONDUCTOR MEMORY WITH TRENCH CAPACITOR

[75] Inventors: Hideo Sunami, Hinodemachi; Tokuo Kure, Kokubunji; Yoshifumi Kawamoto, Kanagawa; Masao Tamura; Masanobu Miyao, both of Tokorozawa, all of Japan

[73] Assignee: Hitachi, Ltd., Tokyo, Japan

[21] Appl. No.: 93,033

[22] Filed: Jul. 19, 1993

Related U.S. Application Data

[60] Continuation of Ser. No. 753,944, Sep. 3, 1991, abandoned, and a continuation-in-part of Ser. No. 180,770, Apr. 12, 1988, abandoned, which is a continuation of Ser. No. 726,978, Apr. 25, 1985, abandoned, which is a continuation-in-part of Ser. No. 654,459, Sep. 26, 1984, abandoned, said Ser. No. 753,944, is a continuation-in-part of Ser. No. 636,720, Jan. 2, 1991, abandoned, which is a division of Ser. No. 201,100, May 31, 1988, Pat. No. 4,984,030, which is a division of Ser. No. 904,397, Sep. 8, 1986, Pat. No. 4,751,557, which is a continuation of Ser. No. 474,002, Mar. 10, 1983, abandoned.

[30] Foreign Application Priority Data

| Mar. 10, 1982 | [JP] | Japan | 57-36418 |
| Sep. 28, 1983 | [JP] | Japan | 58-177952 |
| Dec. 28, 1983 | [JP] | Japan | 58-246948 |
| Apr. 25, 1984 | [JP] | Japan | 59-81750 |

[51] Int. Cl.⁵ ............................. H01L 27/108
[52] U.S. Cl. .............................. 257/301; 257/302; 257/305
[58] Field of Search ............... 357/23.6, 23.6 G; 257/301, 305, 302

[56] References Cited

U.S. PATENT DOCUMENTS

| 3,962,713 | 6/1976 | Kendall et al. | 357/55 |
| 4,271,418 | 6/1981 | Hiltpold | 357/41 |
| 4,327,476 | 5/1982 | Iwai et al. | 357/23.6 |
| 4,353,086 | 10/1982 | Jaccodine et al. | 357/41 |
| 4,409,608 | 10/1983 | Yoder | 357/55 |
| 4,424,526 | 1/1984 | Dennard et al. | 357/23.6 |
| 4,432,006 | 2/1984 | Takei | 357/23.6 |
| 4,460,911 | 7/1984 | Salters | 357/41 |
| 4,462,040 | 7/1984 | Ho et al. | 357/41 |
| 4,467,450 | 8/1984 | Kuo | 257/302 |
| 4,538,166 | 8/1985 | Nakano | 357/23.6 |
| 4,751,557 | 6/1988 | Sunami et al. | 357/23.6 |
| 4,937,641 | 6/1990 | Sunami et al. | 257/302 |
| 5,021,842 | 6/1991 | Koyanagi | 257/305 |

Primary Examiner—Robert Limanek
Attorney, Agent, or Firm—Antonelli, Terry, Stout & Kraus

[57] ABSTRACT

A semiconductor memory wherein a part of each capacitor is formed on side walls of an island region surrounded with a recess formed in a semiconductor substrate, and the island region and other regions are electrically isolated by the recess.

5 Claims, 42 Drawing Sheets

SEMICONDUCTOR MEMORY WITH TRENCH CAPACITOR

This application is a continuation of application Ser. No. 753,944, filed on Sep. 3, 1991 (now abandoned), which is a continuation-in-part of Ser. No. 07/636,720 filed Jan. 2, 1991 (now abandoned), which is a divisional of Ser. No. 07/201,100 filed May 31, 1988 (now U.S. Pat. No. 4,984,030), which is a divisional of Ser. No. 06/904,397, filed Sep. 8, 1986 (now U.S. Pat. No. 4,751,557), which is a continuation of Ser. No. 07/474,002 filed Mar. 10, 1983 (now abandoned); and a continuation-in-part of Ser. No. 07/180,770 filed Apr. 12, 1988 (now abandoned) which is a continuation of Ser. No. 06/726,978 filed Apr. 25, 1985 (now abandoned), which is a continuation-in-part of Ser. No. 06/654,459 filed Sep. 26, 1984 (now abandoned).

BACKGROUND OF THE INVENTION

1. Field of the Invention

The present invention relates to semiconductor memories, and more particularly to a semiconductor memory which permits a remarkable increase in the capacitance of a storage capacitor portion without the necessity of increasing a plane area, particularly with regard to one-transistor type DRAMs.

2. Description of the Prior Art

Regarding MOS dynamic memories, enhancements in the density of integration have been achieved at a proportion of about four times in three years since a dynamic random access memory (hereinbelow, abbreviated to "dRAM") of 1 kb was sold early in the 1970's. However, 16-pin DIPs (dual in-line packages) have been chiefly used as packages for receiving memory chips, and besides, the sizes of cavities for receiving the chips have been limited. Therefore, the size of the memory chip has increased to only, at most, 1.4 times in spite of the quadrupled magnitude integration. Accordingly, the area of a memory cell corresponding to one bit which is the unit memory capacity has decreased remarkably with the enhancement of the density of integration and has become as small as about ⅓ with the quadrupled magnitude of integration. The capacitance C of a capacitor is denoted by $C = \epsilon A/t$ (where $\epsilon$: the dielectric constant of an insulating film, A: the area of the capacitor, and t: the thickness of the insulating film), so that when the area A becomes ⅓, also the capacitance C becomes ⅓ as long as the quantities $\epsilon$ and t are held constant. The magnitude of a signal, S as the storage capacitor is proportional to the quantity of charges, Q, which in turn is the product between the capacitance C and a voltage V. Therefore, when A becomes small, Q decreases proportionally, and S decreases accordingly.

Letting N denote noise, the S/N (signal-to-noise) ratio becomes small with decrease in S, and this poses a serious problem in circuit operations. It has accordingly been common practice to compensate the decrement of A by the decrement of t. As the scale has enlarged (the density of integration has risen) to 4 kb, 16 kb and 64 kb, the thickness of a typical SiO₂ film has gradually decreased to 100 nm, 75 nm and 50 nm by way of example.

Further, it has recently been confirmed that charges of about 200 fC are generated within a Si substrate by α-particles which are emitted from radioactive heavy. metals(U, Th etc.) contained in the package etc., and that they form noise. From the standpoint of a high reliability operation, it has become difficult to render the signal magnitude Q below approximately 200 fC.

Accordingly, it has become practice to make the insulating film still thinner. It has then turned out that the dielectric breakdown of the insulating film is problematic. The dielectric breakdown field of SiO₂ is $10^7$ V/cm at the maximum. Accordingly, an SiO₂ film 10 nm thick is nearly permanently broken down or is deteriorated by applying 10 V thereto. When the reliability over a long term is taken into account, the smallest possible voltage below the maximum breakdown voltage needs to be used. It is therefore difficult to make the insulating film of the capacitor very thin.

That is, in order to enhance the density of integration of a semiconductor memory without incurring such problems as the lowering of the S/N ratio, the disturbance ascribable to the α-particles and the dielectric breakdown, the required area of a memory cell must be reduced by keeping or increasing the electrode area of a capacitor without thinning the insulating film of the capacitor.

In this regard, however, the storage capacitor portion of the conventional dynamic memory has been formed of a semiconductor substrate, and an insulating film and a plate (conductor film) which are stacked and deposited on the surface of the semiconductor substrate. In order to simultaneously reduce the required area of the memory cell, accordingly, there is no other way than decreasing the electrode area of the capacitor. This has formed a serious hindrance to the enhancement of the density of integration of the semiconductor memory.

To the end of solving such problems, it has been proposed to form a recess in a semiconductor substrate and to utilize the recess for a capacitor (Japanese Patent Application Publication No. 56-48976, Japanese Patent Application Laying-open No. 51-130178 and Japanese Patent Application Laying-open No. 58-154256). The proposal, however, does not refer to the decrease of the area of an isolation region among semiconductor elements. The required area of a semiconductor memory must be further reduced in order to fabricate an integrated circuit having an extraordinarily high density of integration.

SUMMARY OF THE INVENTION

An object of the present invention is to solve the problems of the prior arts, and to provide a semiconductor memory well-suited to an integrated circuit which requires a very small area and which has an extraordinarily nigh density of integration.

Another object of the present invention is to provide a semiconductor memory having capacitors and isolation regions the required areas of which are very small.

In order to accomplish the objects, according to the present invention, the side walls of an island region enclosed with a recess are utilized as a part of a capacitor, and the recess is used for the electrical isolation between the island region and another region.

Also, in order to cope with the serious aspects of the disturbance by α-particles, the worsening of the S/N ratio and the problem of the dielectric breakdown voltage, which are attendant upon the microminiaturization of memory cells, the present invention provides a method according to which, even when the memory cell is microminiaturized, the area A of a capacitor is held or increased without reducing the thickness of an insulator film.

The purpose of this aspect of the present invention consists in that the side wall part of a recess dug in a Si substrate is used as the major part of the electrode surface of a capacitor, whereby the electrode area is enlarged without enlarging a plane area. Thus, a desired capacitor capacitance can be attained without increasing the breakdown of an insulator film ascribable to the thinning of the insulator film. In addition, a switching transistor is formed on the Si substrate, whereby the Si substrate can be entirely utilized for the formation of the capacitor.

BRIEF DESCRIPTION OF THE DRAWINGS

FIGS. 63 to 106 are diagrams showing further embodiments of the present invention, in which FIG. 63, FIG. 72, FIGS. 79 and 80, FIGS. 90 and 91, FIG. 94 and FIG. 100 are plan views, FIGS. 64 to 68, FIG. 70, FIGS. 73 to 75, FIGS. 81 to 83, FIG. 89, FIG. 92, FIG. 93, FIGS. 95 to 99 and FIGS. 101 to 105 are sectional views, FIG. 69, FIG. 71, FIGS. 76 to 78 and FIGS. 84 to 88 are bird's-eye views, and FIG. 106 is a graphical representation.

DETAILED DESCRIPTION OF THE PREFERRED EMBODIMENTS

Figure 1:
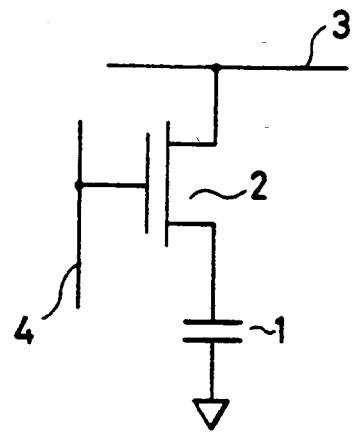
FIGS. 1, 2 and 3 are connection diagrams for explaining the operations of a semiconductor memory.

FIG. 1 is a diagram showing the arrangement of a 1-transistor type dynamic memory cell. The memory cell is constructed of a capacitor 1 for storing charges, and a switching MOS transistor 2. The drain of the switching transistor 2 is connected to a bit line 3, and the gate thereof is connected to a word line 4.

Figure 2:
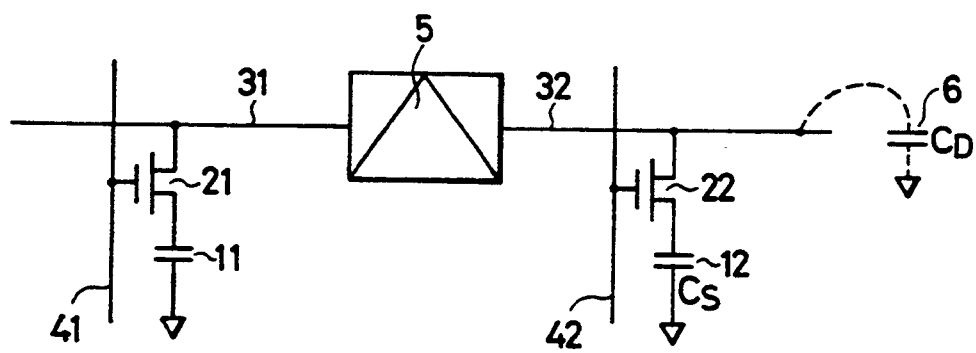

In operation, the signal charges stored in the capacitor 1 are read out by means of the switching transistor 2. In constructing an actual memory of n bits, a memory array is configured. Methods therefor are broadly classified into the following two. FIG. 2 illustrates the first method, and shows the so-called "open bit line" configuration in which bit lines 31 and 32 are arrayed on both the sides of a sense amplifier 5 for differentially deriving a signal. Only one bit line 31 electrically intersects a single word line 41, and the difference between the signals of the bit lines 31 and 32 is detected by the sense amplifier 5.

Figure 3:
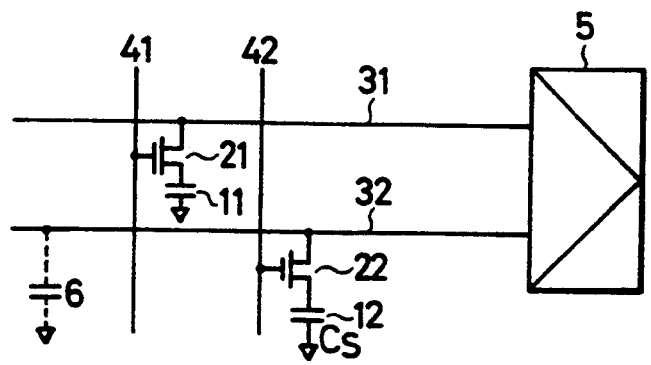

FIG. 3 illustrates the second method, and shows the so-called "folded bit line" configuration. Two bit lines 31 and 32 connected to a sense amplifier 5 are arrayed in parallel, and a single word line 41 intersects the two bit lines 31 and 32.

While the embodiments of the present invention to be described later will refer principally to the case of the folded bit line configuration, the present invention is not restricted thereto but is similarly applicable to the open bit line configuration.

Letting $C_D$ denote the value of the parasitic capacitance 6 of the bit line 32 and $C_S$ the capacitance of the capacitor 12 of the memory cell as shown in FIG. 2 or FIG. 3, one of the major figures of merit of the memory array becomes $C_S/C_D$. The S/N (signal-to-noise) ratio of the memory array is in 1-to-1 correspondence with $C_S/C_D$, and is enhanced by increasing the capacitance $C_S$ of the capacitor of the memory cell and decreasing the parasitic capacitance $C_D$ of the bit line 3.

Figure 4:
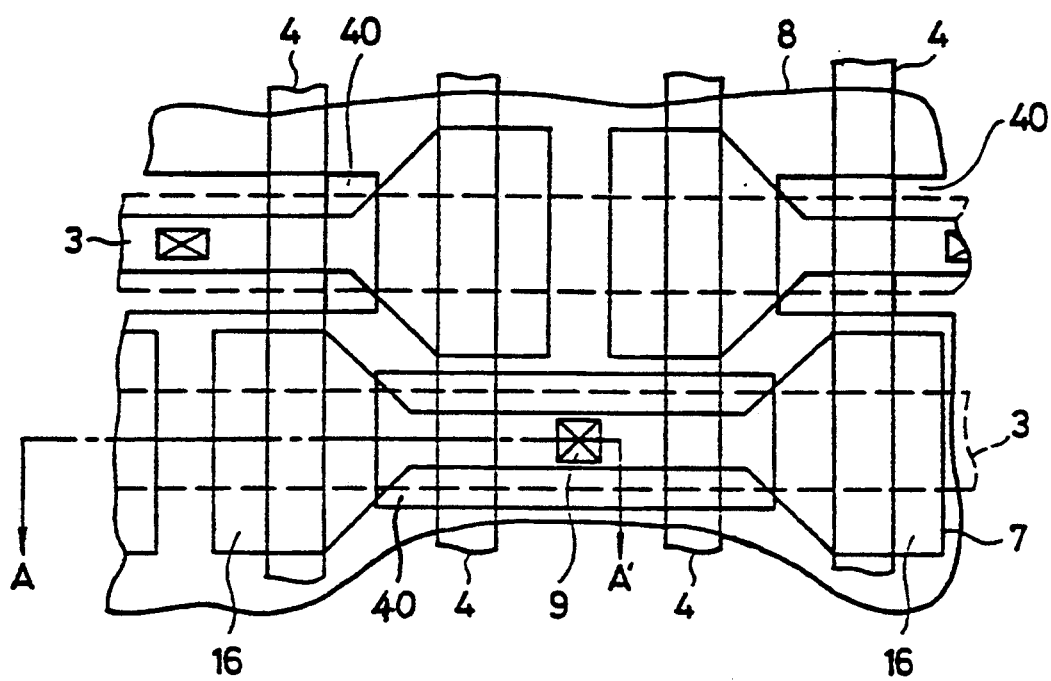
FIGS. 4 and 5 are views showing the essential portions of the plan and sectional structures of the prior-art semiconductor memory, respectively.
Figure 5:
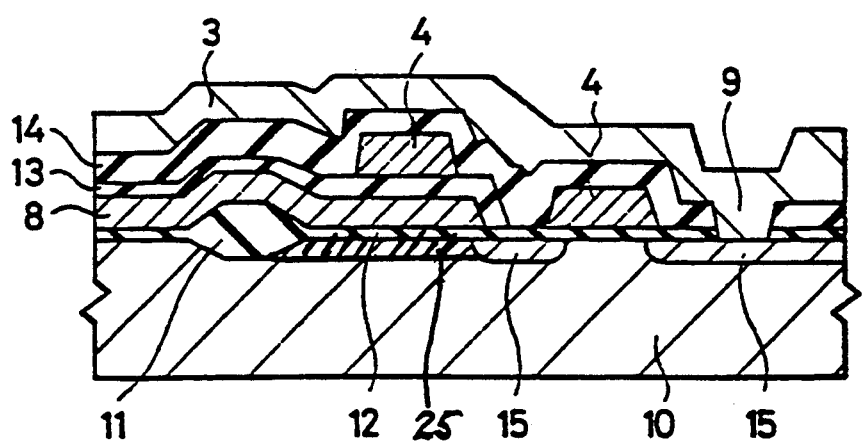

FIG. 4 shows an example of the plan structure of the prior-art memory cell of the folded bit line system. A part of an active region 7 surrounded with a thick field oxide film 11, which is usually at least 100 nm thick, is covered with a plate 8 in order to form capacitors in the area 16. The plate 8 is selectively removed in a part 40 in which the switching transistor, and a contact hole 9 for connecting the drain to the bit line on a Si substrate are to be formed. In this part, the word lines 4 are deposited, and the switching transistor 2 is formed. In order to facilitate understanding, FIG. 5 shows a sectional view taken along A—A' in FIG. 4.

The prior-art dynamic memory is fabricated as stated below. For the sake of convenience, the transistors are exemplified as the n-channel type. In order to form p-channel type transistors, the conductivity types of the Si substrate and diffused layers may, in general, be reversed to those in the case of the n-channel type.

On the selected areas of the p-type Si substrate 10 having a resistivity of approximately 10 Ω·cm, a field $SiO_2$ film 11 usually having a thickness of approximately 100–1000 nm is formed by, e.g., the well-known and so-called LOCOS process which employs $Si_3N_4$ for an oxidation-resistant mask. Thereafter, a gate oxide film 12 which is 10–100 nm thick is formed on the Si substrate 10 by the thermal oxidation or the like. If desired, a capacitor electrode 25 can be formed as an n+ type layer by selective doping of P or As. Subsequently, the plate 8 which is made of, e.g., polycrystalline Si doped with phosphorus or As is deposited on selected areas, and the surface of the plate 8 made of the polycrystalline Si is oxidized to form a first inter-layer oxide film 13. Thereafter, the word lines 4 which are made of, e.g., polycrystalline Si, refractory metal silicide or a pure refractory metal (such as Mo and W) are deposited. When phosphorus, As or the like is subsequently ion-implanted, n+-type diffused layers 15 are formed in those parts of the active region on which neither the plate 8 nor the word line 4 is deposited, and they serve as the source and drain of each switching transistor 2. Using the well-known CVD process, a PSG (phosphosilicate glass) film 14 is deposited to a thickness of 500–1000 nm. The bit lines 3 typified by Al electrode buses are deposited on selected areas after the contact holes 9 have been formed in parts where the bit lines 3 are to be connected with the diffused layers 15.

In the prior-art memory cell thus formed, the area 16 of the capacitor 1 to form a storage capacitance becomes small when the size of the memory cell decreases, as seen from FIG. 4. Accordingly, unless the gate oxide film 12 is thinned, the capacitor capacitance $C_S$ becomes small as explained before, which poses a serious problem in the memory operation.

The present invention eliminates the aforementioned disadvantage of the prior-art semiconductor memory, and provides a semiconductor memory which can increase the capacitor capacitance $C_S$ without enlarging the plane area of a memory cell.

Figure 6:
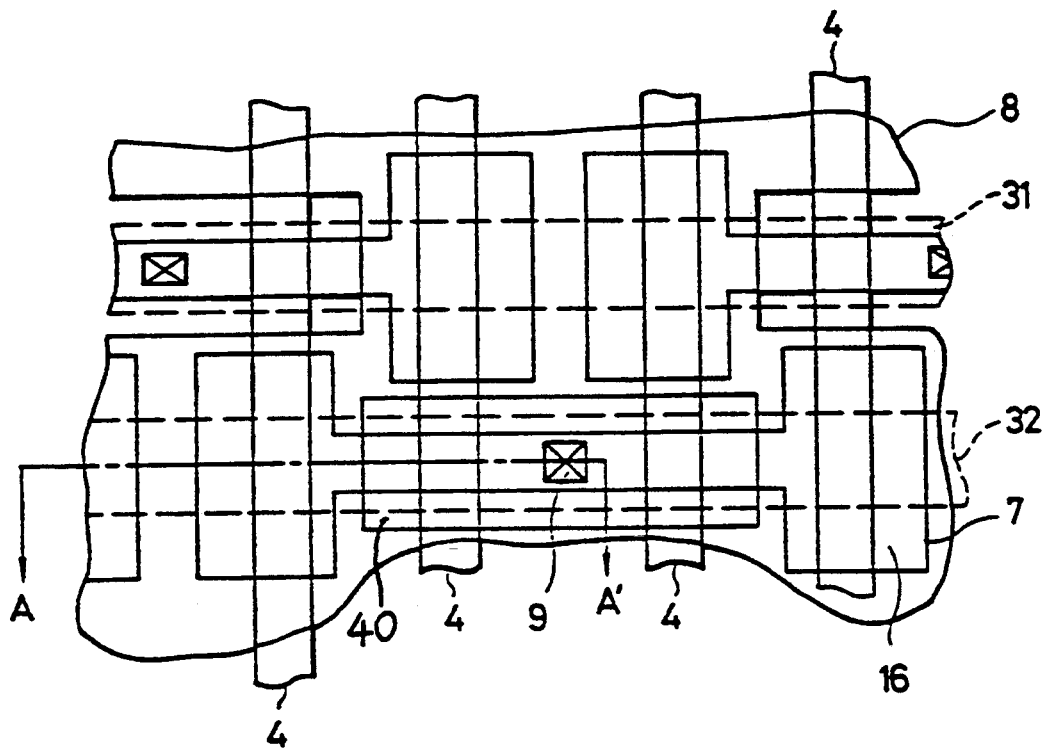
FIGS. 6 and 7 are views showing the plan and sectional structures of the essential portions of an embodiment of the present invention, respectively.
Figure 7:
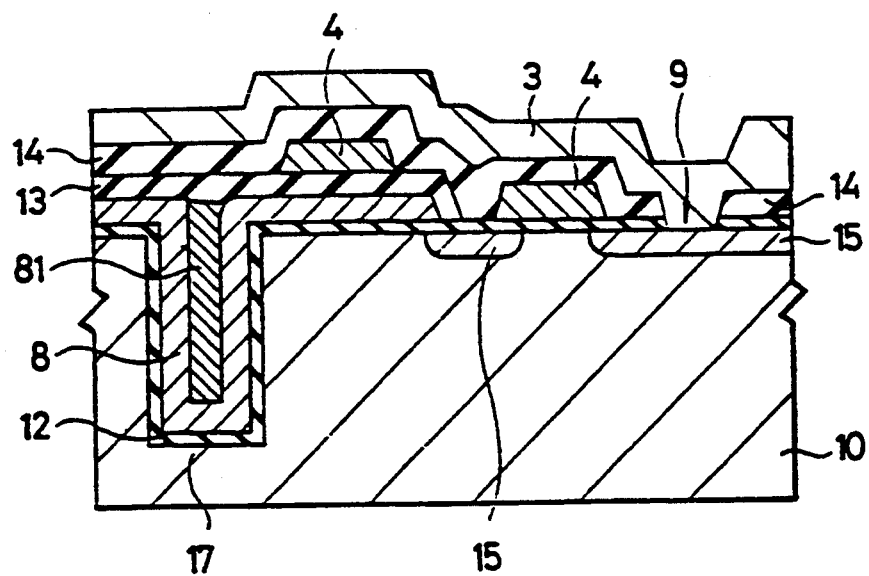

Now, the present invention will be described in detail in conjunction with embodiments. FIG. 6 shows the essential portions of the plan structure of one embodiment of the present invention. As compared with the prior-art memory cell shown in FIG. 4, the embodiment differs as stated hereunder. The active region 7 is surrounded with a recess 17. More specifically, in the prior-art semiconductor memory, the isolation of the active regions 7 among the memory cells is effected by the field oxide film 11 as shown in FIG. 5, whereas in the present invention, it is effected by the recess 17 formed in the semiconductor substrate, as shown in FIG. 7 (FIG. 7 is a sectional view taken along A—A′ in FIG. 6). That is, in the present invention, each active region 7 is entirely enclosed with the recess 17, the plate 8 buried in the recess 17, and the insulating film 12, whereby the respective active regions are isolated from one another.

Therefore, the field oxide film having hitherto been used for the isolation among the respective active regions is not required for this purpose, and the required area for the memory can be remarkably reduced.

Moreover, as seen from FIG. 7, the capacitor is formed in such a manner that the insulating film 12 and the plate 8 are stacked and deposited on the side surface of the recess 17, so a capacitance of sufficient magnitude can be attained in the areas 16 without increasing the required area.

In the next place, the manufacturing process of the semiconductor memory incorporating the basic structure shown in FIG. 7 will be described.

Figure 8:
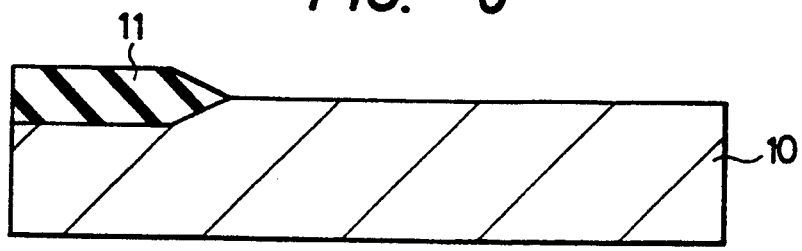
FIGS. 8 to 15 are flow diagrams showing the manufacturing method of an embodiment of the present invention.
Figure 9:
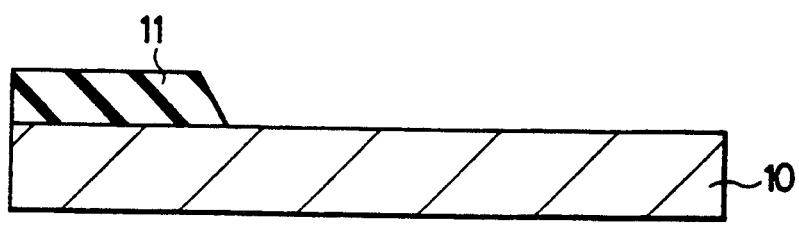

First, as shown in FIG. 8, the field SiO$_2$ film 11 having a thickness of 500–1000 nm is formed on the surface of the p-type semiconductor substrate 10 by the use of the well-known LOCOS process. The field SiO$_2$ film 11 may well be formed as shown in FIG. 9 by covering the whole surface of the substrate with an SiO$_2$ film and then removing an unnecessary part, without resorting to the LOCOS process. In an example of the present embodiment, the LOCOS process was used. The field SiO$_2$ film 11 formed by the LOCOS process is not used for the isolation among the memory cells, but it is used as desired, for a direct peripheral circuit such as sense amplifier which is connected to the memory cell or for an indirect peripheral circuit which generates a group of timing pulses for governing various memory operations. Since the recess 17 is covered with the plate 8 through the very thin gate oxide film or capacitor insulating film, this portion exhibits a large parasitic capacitance and is unsuited to the fast operation of the circuitry. In the aforementioned part, especially the indirect peripheral circuit, the use of the field insulating film 11 in the prior art formed by the LOCOS process is more advantageous than the use of the recess.

Figure 10:
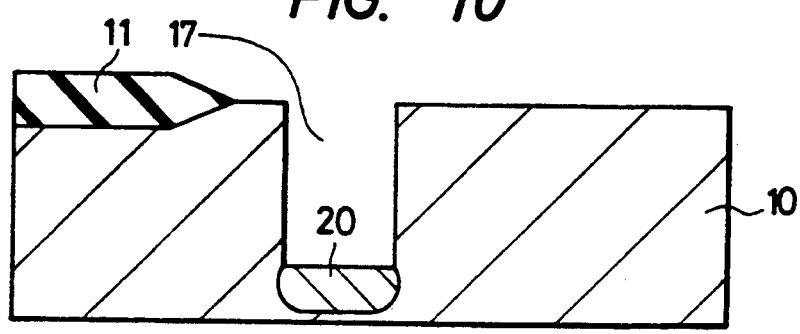
Figure 11:
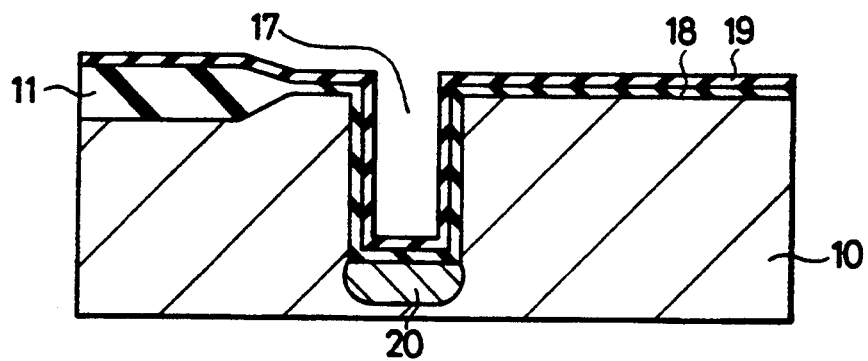

As shown in FIG. 10, the etched recess 17 is formed in each predetermined part of the Si substrate 10 by a parallel-plate type plasma etching equipment by the use of a gas of F or Cl, for example, a gas whose principal ingredient is CF$_4$, SF$_6$, CCl$_4$ or the like or contains H in addition to it. Regarding a mask to be used for the plasma etching, when an ordinary mask made of a photoresist film is used, it is feared that the mask itself will also be etched to disappear. Therefore, a mask made of a film consisting of the three layers of SiO$_2$, Si$_3$N$_4$ and CVD·SiO$_2$ may be formed on the Si substrate 10 after the formation of the field oxide film and may be used for etching the Si substrate 10. Needless to say, any mask other than the three-layered film may be used as the mask in this case.

The depth of the etching recess is hardly limited. However, when the depth $D_M$ is set at about 0.5 $W_M$–5 $W_M$ where $W_M$ denotes the width of the groove, very favorable results are obtained in practical use. In addition, when the angle of the upper end part of the recess is sharp, the dielectric breakdown voltage is sometimes lowered by the electric field crowding. It is therefore recommended to round the corner of the upper end part by such isotropic etching as wet etching before the recess is formed deep. The recess 17 serves for both the capacitor and the isolation. Accordingly, in the case of using the Si substrate 10 of 10 Ω·cm by way of example, boron was ion-implanted into the bottom of the recess 17 in a range of $1 \times 10^{11} - 1 \times 10^{13}$ cm$^{-2}$, and annealing at 900°–1000° C. was thereafter conducted, whereby a heavily-doped isolation layer 20 was formed as shown in FIG. 10.

Subsequently, an SiO$_2$ film 18 and an Si$_3$N$_4$ film 19 were stacked and formed as the insulating film of the capacitor. The insulating film of the capacitor may be high in the breakdown voltage and stable electrically. The materials of the insulating film having heretofore been used are thermal oxidation SiO$_2$; thermal nitrification Si$_3$N$_4$; CVD Si$_3$N$_4$; Ta$_2$O$_5$, Nb$_2$O$_5$, GrO$_2$ or TiO$_2$ produced by the CVD or the reactive sputtering; etc. The single or multiple layer of the film or films of such material or materials can be used as the capacitor insulating film. In the present example, the stacked films of SiO$_2$ and Si$_3$N$_4$ were used.

When the recess 17 is formed in the Si substrate 10 by the dry etching (such as plasma etching and sputter etching), electrical and crystallographic damages and contaminations develop in the Si substrate 10 more or less unlike the case of applying the wet etching. After the dry etching, accordingly, the Si substrate 10 may be wet-etched by about 10–500 nm to the extent that the damages and contaminations pose, in effect, no problem. When the aqueous solution of an $NH_4OH+H_2O_2$ system or an $HF+HNO_3$ system is used as an etchant, a favorable result can be obtained.

After the damages and contaminations of the Si substrate 10 and the surface of the recess 17 have been removed by the wet etching, the $SiO_2$ film 18 having a thickness of 5–20 nm is formed by the well-known thermal oxidation in an oxidizing atmosphere at a temperature of 900°–1200° C. Next, the $Si_3N_4$ film 19 having a thickness of 5–20 nm is stacked and deposited by the CVD process at 650°–850° C. Thus, the insulating film of the capacitor is finished. Needless to say, since the thicknesses of the films are set in consideration of the desired capacitance and breakdown voltage per unit area, values outside the aforementioned range thereof are sometimes used. The internal stress of the CVD $Si_3N_4$ film 19 mounts up to about $1\times10^{10}$ dyn/cm$^2$, so that when the $Si_3N_4$ film 19 is deposited directly on the Si substrate 10, defects arise in the Si substrate 10 to degrade the characteristics of the memory. Accordingly, the $Si_3N_4$ film 19 is underlaid with the $SiO_2$ film 18 so as to prevent the occurrence of the defects. When the Si substrate 10 is directly nitrified to form an $Si_3N_4$ film, a dense film having a high breakdown voltage can be obtained. However, a reaction time in excess of 1 hour is required for obtaining a film thicker than 10 nm. Moreover, when the film thickness exceeds 10 nm, the increasing rate thereof lowers abruptly. This method is therefore unsuitable for producing a thick film. When the $Si_3N_4$ film 19 has its surface thermally oxidized by 2–5 nm, its pinhole parts are oxidized to be thick. This favorably results in that the dielectric breakdown voltage can be enhanced, and that the thickened parts serve as stoppers against overetching in the case of dry-etching polycrystalline Si to be formed on the film 19.

Figure 12:
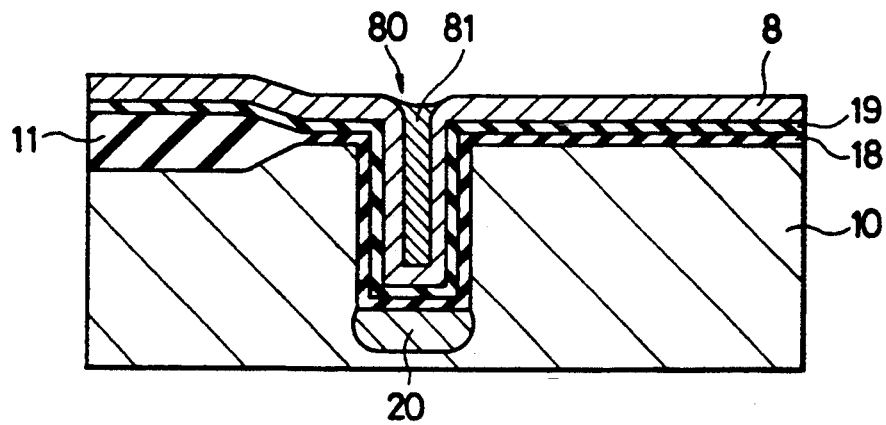

Next, the plate 8 made of, e.g., polycrystalline Si is deposited on the whole surface as shown in FIG. 12.

When the CVD process is used in this case, the polycrystalline Si readily deforms to conform to the recess 17, in the manner shown in FIG. 12 so that the polycrystalline Si deposited on the side wall part of the recess 17 becomes approximately equal in thickness to that deposited on the upper surface of the Si substrate. Phosphorus is thermally diffused into the polycrystalline Si film 8 by the use of $POCl_3$ gas or the like.

The width of the etched recess 17 is $W_M$. Therefore, when $W_M > 2 T_{Si}$ holds where $T_{Si}$ denotes the thickness of the polycrystalline Si film 8, a recess 80 as shown in FIG. 12 is left unfilled, so that the top surface of the device does not become flat. Since the recess 80 adversely affects the processing and the deposited states of the insulating film and the word line 4 to be deposited thereon, it should better be filled to flatten the surface. In the present embodiment, polycrystalline Si is deposited on the whole surface to a thickness $T_{S2}$, whereupon the whole area of the deposited polycrystalline Si is removed by the thickness $T_{S2}$ from above by the well-known plasma etching which employs $CF_4$ or $SF_6$ gas. Then, as shown in FIG. 12, the polycrystalline Si 81 remains in the form in which it is just buried in the recess 80, and the upper surface becomes flat. In a case where the polycrystalline Si film 8 is thickened thereby to fill up the recess, the second deposition of the polycrystalline Si is not necessary. Since, however, the plate 8 is also used as an interconnection part, a suitable thickness is 100–500 nm or so. When the recess is not filled up with the plate of such thickness, the polycrystalline Si 81 is deposited as described above, to entirely fill the recess and to flatten surface.

When the polycrystalline Si film 8 left intact is overlaid with the second polycrystalline Si 81 which is thereafter etched over the entire area, the end point of the etching becomes indefinite because both fuse into one at their boundary. Therefore, the surface of the first layer of polycrystalline Si 8 is thermally oxidized by 5–30 nm so as to interpose an $SiO_2$ layer between both the layers. Thus, the $SiO_2$ film on the first layer of polycrystalline Si 8 is exposed in the state in which the second layer of polycrystalline Si has been etched over the entire area. Herein, the plasma etching rate of polycrystalline Si is 10 or more times as high as that of $SiO_2$. Therefore, even when overetching is somewhat performed, the first layer of polycrystalline Si 8 is protected by the $SiO_2$ and is not etched.

Figure 13:
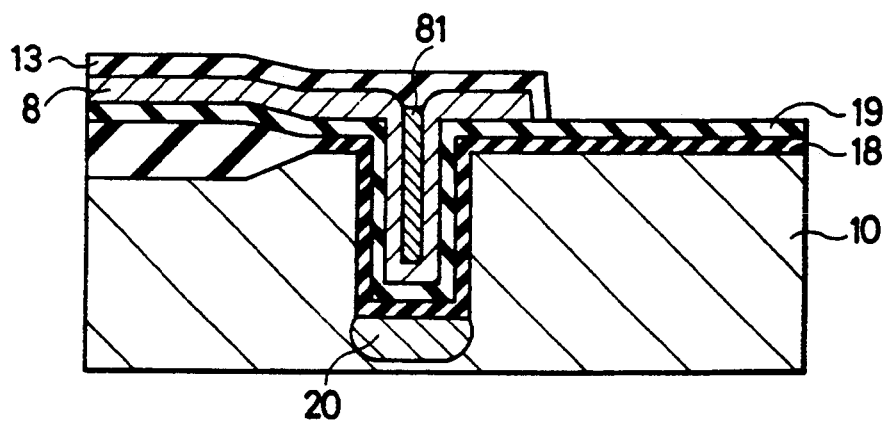
Figure 14:
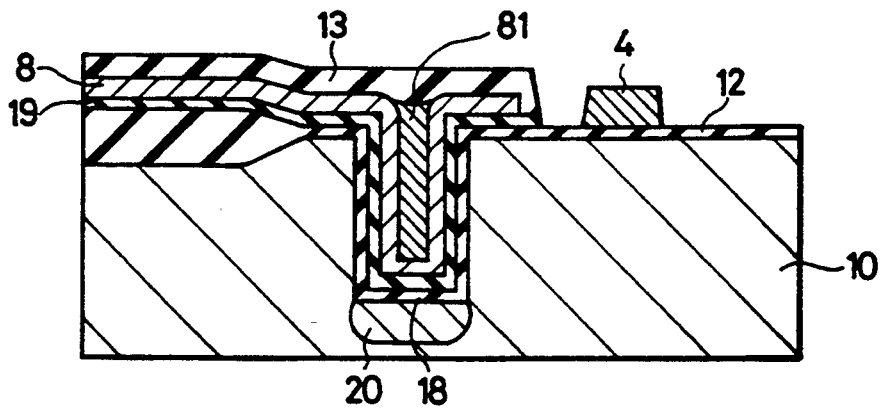

Next, the unnecessary part of the polycrystalline silicon film 8 is removed by the photoetching process so as to finish up the plate 8. Thereafter, as shown in FIG. 13, the surface of the plate 8 is oxidized to form the first inter-layer oxide film 13 which is 100–400 nm thick. At this time, the $Si_3N_4$ film 19 is scarcely oxidized. Thereafter, using the first inter-layer oxide film 13 as a mask, the exposed part of the $Si_3N_4$ film 19 and the underlying $SiO_2$ film 18 are removed by etching. The exposed surface of the resultant Si substrate 10 is oxidized in an oxidizing atmosphere of dry oxygen at 800°–1150° C. containing 1–5% of HCl, whereby the gate oxide film 12 being 10–50 nm thick is formed. Thereafter, a predetermined dose of boron is ion-implanted in order to attain a desired threshold voltage $V_{TH}$. Subsequently, as shown in FIG. 14, the gates (word lines) 4 each of which is made of a single layer of polycrystalline Si, silicide (e.g., $Mo_2Si$) or the like or stacked films thereof; a refractory metal such as W and Mo; or the like are selectively deposited on predetermined parts.

Figure 15:
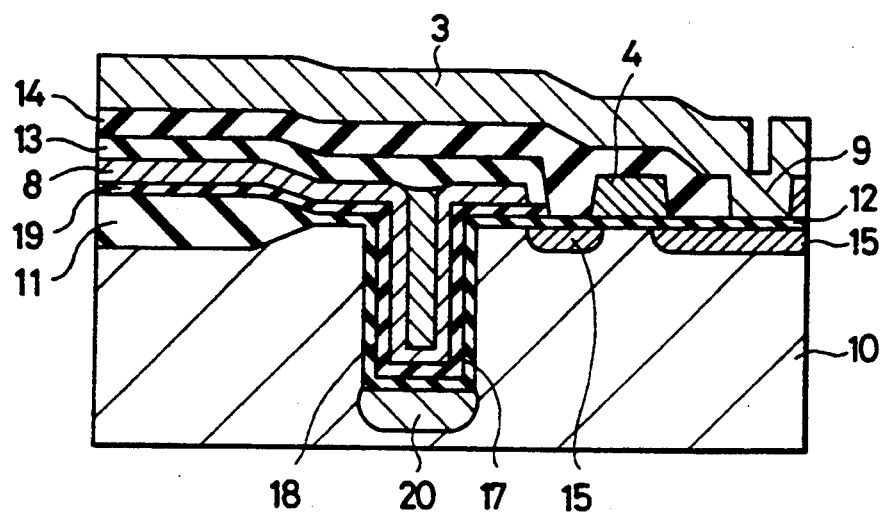

Thereafter, when As or phosphorus is ion-implanted by approximately $5\times10^{15}-2\times10^{16}$/cm$^2$ at an acceleration voltage of 60–120 keV, the n$^+$-type source and drain layers 15 are formed in the parts on which neither the plate 8 nor the gate 4 is deposited, as shown in FIG. 15. Further, the second inter-layer insulating film 14 which is represented by a CVD $SiO_2$ film containing 4–10 mol-% of phosphorus (abbreviated to CVD·PSG) is deposited to a thickness of 300–1000 nm, and it is heat-treated at 900°–1000° C. so as to be densified. Thereafter, the electrode connection holes 9 which reach the n$^+$ layers 15, gates 4 and plates 8 of the substrate are formed, and the electrodes 3 which are made of a material represented by Al or an Al alloy are selectively deposited. Thus, the 1-transistor type dynamic memory cell is constructed which uses the side wall of the etched recess 17 as a part of the capacitor.

Figure 16:
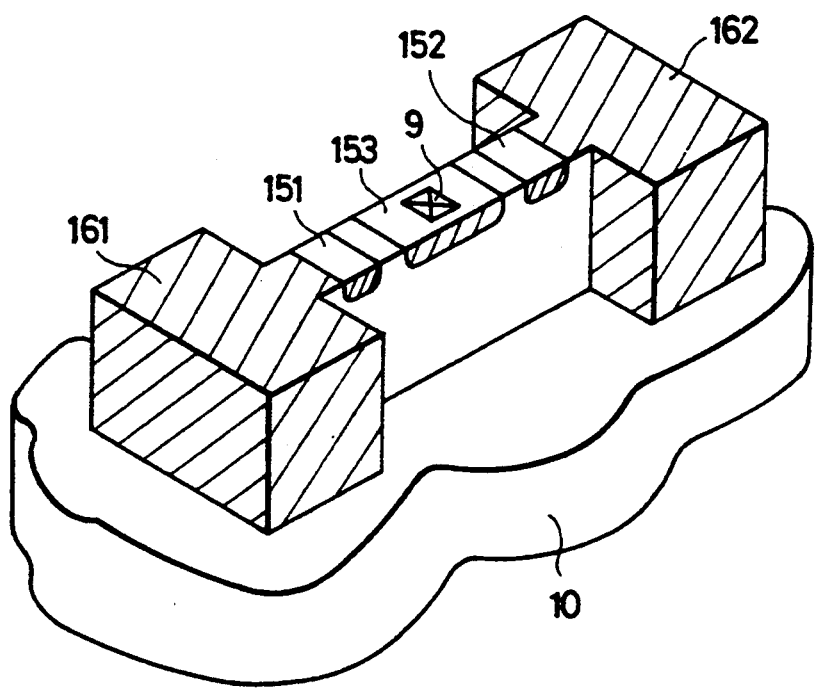
FIG. 16 is a bird's-eye view for explaining the construction of the present invention.
Figure 17:
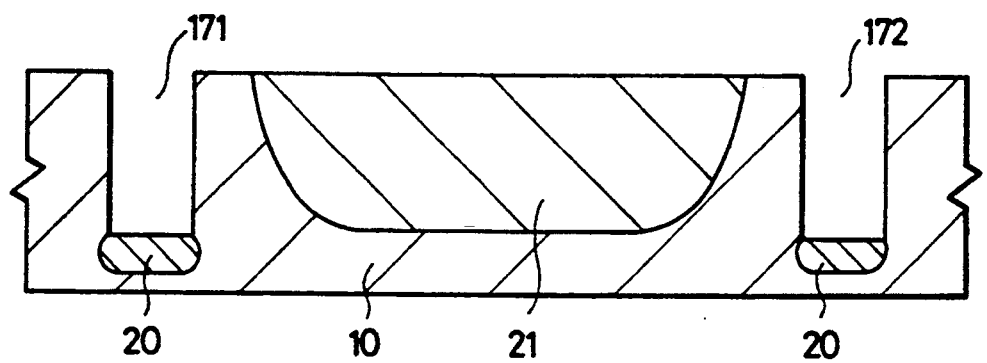
FIGS. 17 and 18 are sectional views showing another embodiment of the present invention.
Figure 18:
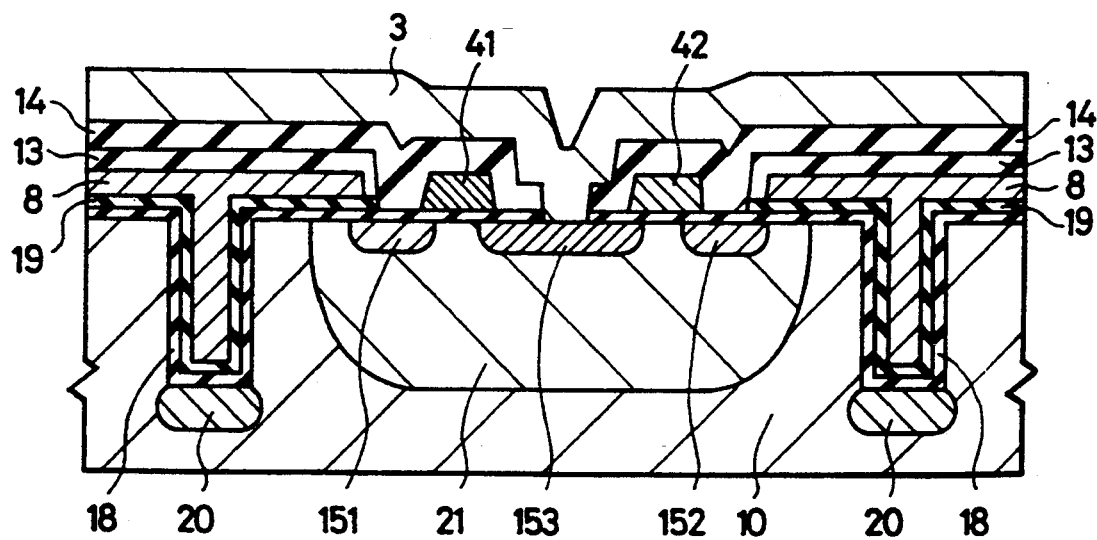

FIG. 16 shows a bird's-eye view of a pair of memory cells formed by this embodiment. While the plan view thereof has been shown in FIG. 6, the word lines, bit lines, plates etc. are omitted from the illustration of FIG. 16 in order to avoid complicacy and to facilitate understanding. The plate 8 is entirely deposited on a pair of capacitor portions 161 and 162. In addition, the plate 8 surrounds the side surfaces of n$^+$ layers 151 and 152 connected to the capacitors 1 among the n$^+$ layers of a pair of switching transistors (e.g., see FIG. 18). Therefore, the capacitor portions 161, 162 and the n$^+$ layers 151, 152, and further the n+ layer 153 connected to the bit line need to be electrically isolated. Since a supply voltage $V_{DD}$ is usually applied to the plate 8, the active region other than the capacitors may be doped with an impurity at a density high enough to prevent the side surfaces of layers 151, 152 and 153 from being inverted even at the voltage $V_{DD}$. The inversion voltage $V_{INV}$ differs depending upon the flat band voltage $V_{FB}$, thickness and dielectric constant of the insulating film located between the plate and the substrate, the impurity density of the substrate, etc. By way of example, the voltage $V_{INV}$ becomes about 6 V when the insulating film is an $SiO_2$ film being 300Å thick and the impurity density of the substrate is $1 \times 10^{18}$ cm$^{-3}$. In consideration of the voltage $V_{INV}$, any leakage current may be prevented from arising among the n+ layers 151, 153, 152 and the capacitor portions 161, 162. FIG. 17 shows one embodiment of the present invention in which the heavily-doped isolation layer 20 is provided for this purpose. After recesses 171 and 172 (which are united with each other around the active region 7 as shown in FIG. 6, and which surround the pair of memory cells as shown in FIG. 16) have been formed, each isolation well 21 which is a heavily-doped region having the same conductivity type as that of the substrate 10 is formed by the conventional ion implantation followed by annealing at a high temperature (1000°–1250° C.). The impurity density of the isolation well 21 is higher in the surface of the Si substrate, and lower in the bottom part thereof. It may therefore have a value to render the aforementioned voltage $V_{INV}$ sufficiently great, in the bottom part of the lower density. Before or after this step, the bottom parts of the recesses 171 and 172 are also provided with the heavily-doped isolation layer 20 described with reference to FIG. 10. Subsequently, the steps described with reference to FIGS. 11 to 15 are carried out, thereby to obtain the pair of memory cells in which the transistors are formed within the isolation well 21 as shown in FIG. 18. All the n+ layers 151, 152 and 153 are formed within the isolation well 21. Therefore, even when all the side surfaces of the n+ layers 151, 152 and 153 shown in FIG. 18 are surrounded with the plates having the voltage $V_{DD}$ applied thereto, the memory cells can be isolated from each other without any leakage current flowing therebetween.

Figure 19:
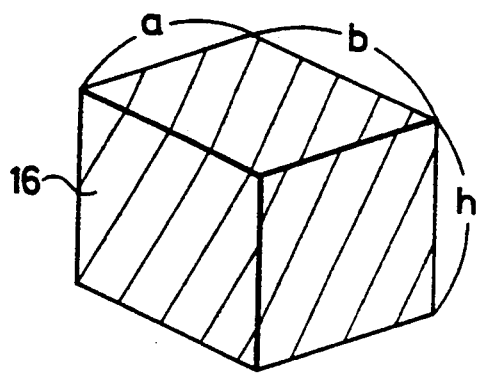
FIGS. 19 to 24 are model views for explaining the shapes of capacitor regions which can be used in the present invention.

The capacitor of the memory cell mentioned in the present embodiment is extracted and is shown in FIG. 19. In order to simplify the explanation, the capacitor is supposed a rectangular parallelepiped, which has an upper surface of a×b and a depth of h. The capacitor area 16 of the flat memory cell in the prior art shown in FIG. 4 is a×b, whereas in the embodiment of the present invention, the capacitor area totals a·b+2 h (a+b) because the side surfaces can be utilized besides the top surface. Assuming that a=b=5 μm and h=2 μm, the capacitor area of the conventional memory cell is $A_{CONV}=25$ μm². In contrast, the capacitor area of the memory cell of the present invention becomes A=65 μm² (=5×5+2×2 (5+5)), and the capacitor area which is several times larger can be readily attained without enlarging the plane area. This also signifies that the present invention can reduce the plane area in case of an equal capacitor area, which can be said very advantageous for enlarging the scale of a memory.

Figure 20:
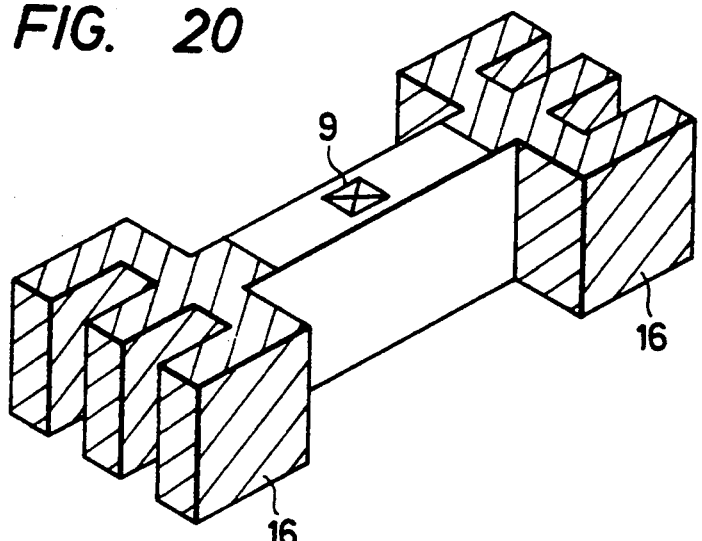
Figure 21:
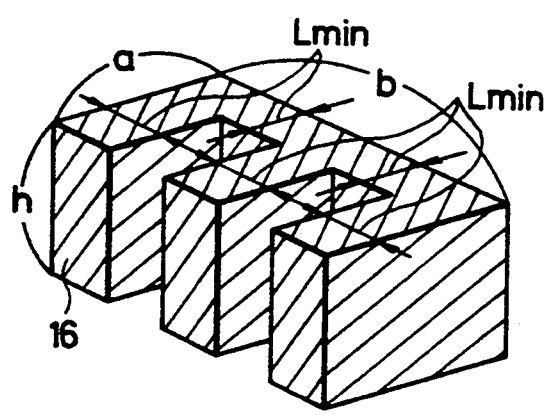

In the embodiments of the present invention thus far described, the capacitor of the memory cell has been basically the rectangular parallelepiped shown in FIG. 19. In the present invention, the side walls of the recess 17 dug in the Si substrate are utilized for the capacitor. Therefore, when the rectangular parallelepiped is formed with interdigitated parts as shown in FIG. 20, the capacitor area A can be more increased. FIG. 21 illustrates an example of calculation of this embodiment. $L_{min}$ is let denote the minimum size of working, and is assumed to be 1 μm. Then, when the values a, b and h are as exemplified in FIG. 19, the upper surface has an area of 17 μm², and the side surfaces have an area of 72 μm², so that the whole capacitor area A becomes A=89 μm². As compared with the embodiment shown in FIG. 19, this embodiment has realized the still larger capacitor area.

Figure 22:
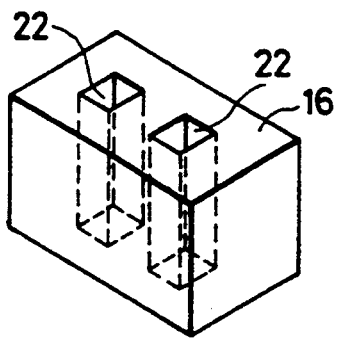
Figure 23:
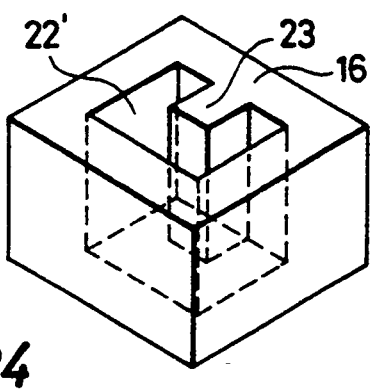
Figure 24:
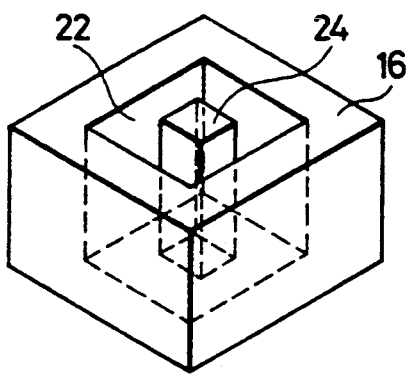

In the present invention, accordingly, the formation of such interdigitated parts or crooks is very effective for further increasing the area of the capacitor. In addition, recesses in various shapes can be used for the capacitor besides the interdigitated parts shown in FIGS. 20 and 21. For example, one or more new recesses may be provided in the rectangular parallelepiped shown in FIG. 19. Such shapes of the capacitor are exemplified in FIGS. 22 to 24. FIG. 22 corresponds to a case where one or more apertures are formed within the capacitor region 16, FIG. 23 a case where an aperture 22 within the capacitor region 16 has an inward protrusion 23, and FIG. 24 a case where an island-like column 24 exists in an aperture 22. In any case, the dimensions of various parts may be set at the workable minimum value, and the area of the capacitor increases remarkably.

Figure 25:
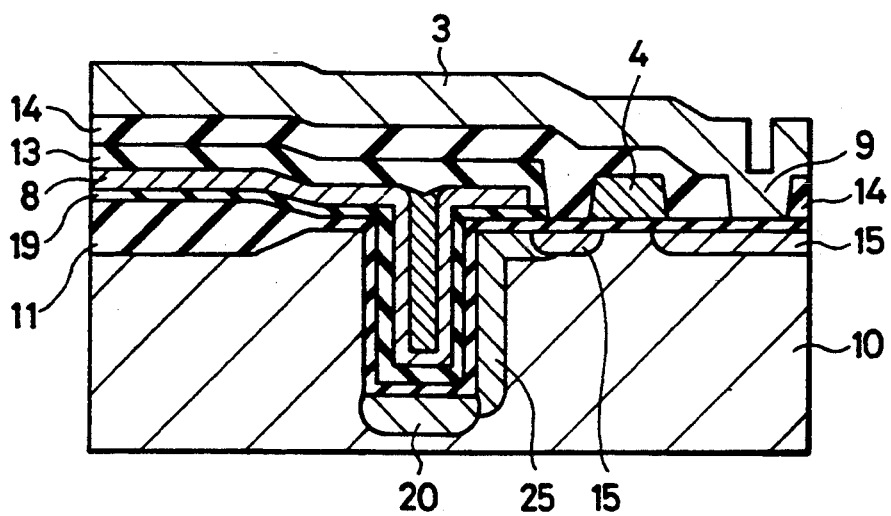
FIGS. 25 and 26 are views showing the sectional structures of the essential portions of another embodiment of the present invention.

All the foregoing embodiments use the inversion layer of the MOS capacitance as the capacitor 1 of the memory cell. Further, another embodiment of the present invention using the capacitor between an n+ layer and the plate 8 is shown in FIG. 25. In this embodiment, after the recesses 17 have been formed by the method illustrated in FIGS. 8 to 10, regions having the same n+ conductivity type as that of the diffused layers 15, namely, capacitor electrodes 25 are formed in selected parts in which the capacitor regions are to be formed, by a well-known expedient such as selective diffusion. In doping the side wall parts of the recess with an impurity, As or P may be implanted obliquely, or the ion sputtering may be utilized deliberately by lowering the acceleration energy to or below 10 keV. It is alternatively allowed to employ the conventional thermal diffusion using POCl₃, or to selectively deposit CVD glass containing As or P, from which As or P can be diffused.

The advantage of the present embodiment is that, since the MOS inversion layer is not used, the potential of the plate 8 can be set at any value. By way of example, when this potential is set at the ground potential $V_{SS}$ (=0 V), the inversion voltage $V_{INV}$ can be set at approximately 1 V or less in order to electrically isolate the n+ layers 151, 152 and 153 or the capacitor portions 161 and 162 from one another. In the case of the foregoing voltage $V_{DD}$, the impurity density has been set at $1 \times 10^{18}$ cm$^{-3}$ or above, whereas in the case of this voltage $V_{SS}$, the impurity density may be set at $6 \times 10^{15}$ cm$^{-3}$ or above with the insulating film 300Å thick. Accordingly, even when the isolation well 21 used in the case of the voltage $V_{DD}$ is not especially formed, the purpose can be achieved by employing a substrate 10 of high impurity density. The system described above shall be called the "$V_{SS}$ plate system" for the sake of convenience.

Figure 26:
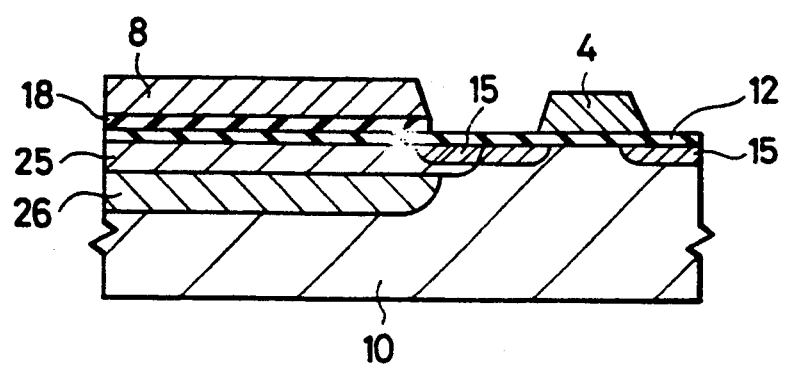

In the $V_{SS}$ plate system, the depletion layer capacitance between the capacitor electrode 25 and the Si substrate 10 is added to the electrostatic capacitance between the capacitor electrode 25 and the plate 8. Thus, a memory as illustrated in FIG. 26 is formed. When the capacitor of the memory is formed in the recess portion in accordance with the present invention, the memory obtained is very excellent. More specifically, a depletion layer under the n+-type capacitor electrode 25 can be made thin in such a way that a heavily-doped capacitor layer 26 having the same p-conductivity type as the substrate is provided under the capacitor electrode 25. The capacitance of the capacitor is inversely proportional to the thickness of the depletion layer, and in turn, the latter is inversely proportional to the square root of the impurity density. Therefore, when the impurity density is made high, the capacitor capacitance increases. The heavily-doped capacitor layers 26 may be formed, immediately before forming the capacitor electrodes 25 by the foregoing method, by similar ion implantation as well as subsequent annealing. When the impurity density is high, breakdown occurs between the capacitor electrode 25 of the n+ layer and the heavily-doped capacitor layer 26. Accordingly, although the maximum density depends upon the potential amplitude of the capacitor electrode 25, it becomes $5 \times 10^{17}$ cm$^{-3}$ when the potential amplitude is supposed 5 V. This applies to the case of a planar junction. When the end part of a junction curves at a small curvature, field crowding takes place at this part, and usually the breakdown voltage lowers. In actuality, therefore, a still lower impurity density is often used.

In the foregoing embodiments, a part of the capacitor 1 and the switching transistor 2 are entirely formed on the surface of the Si substrate. In this case, the capacitor area 16 occupies at most 30–40% of the whole plane area of the memory cell as illustrated in FIG. 6. There will now be described embodiments of the present invention wherein the low occupying percentage of the capacitor area has been changed into approximately 100%. Here, an example utilizing the inversion layer of a MOS capacitor and applying a supply voltage $V_{DD}$ to a plate will be first explained.

Figure 27:
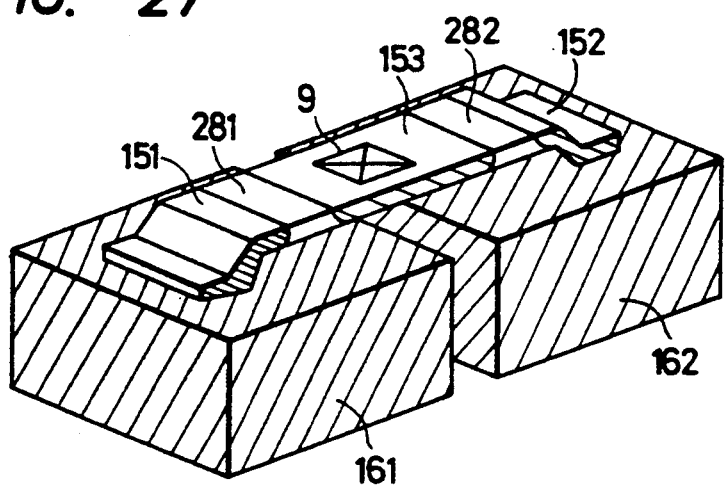
FIG. 27 is a model view for explaining another embodiment of the present invention.

FIG. 27 shows a diagram of the fundamental conceptual structure of the present embodiment. Capacitor regions 161 and 162 are formed within a Si substrate 10. n+ layers 151, 152 and 153 and switching transistor channel portions 281 and 282 are formed in a single-crystal Si film which is deposited and grown on the capacitor regions 161 and 162 through an insulating film (not shown) in a manner to stride over these capacitor regions, that is, in an epitaxial layer which overlies an insulating film (hereinbelow, referred to as "SOI" (Silicon On Insulator)). Thus, the surface part of the Si substrate is fully covered with the capacitor area 16, and the occupying percentage of the capacitor area can be made 100%, which is very advantageous for reducing memory cell area. Hereunder, the present invention will be described with reference to detailed flow diagrams.

Figure 28:
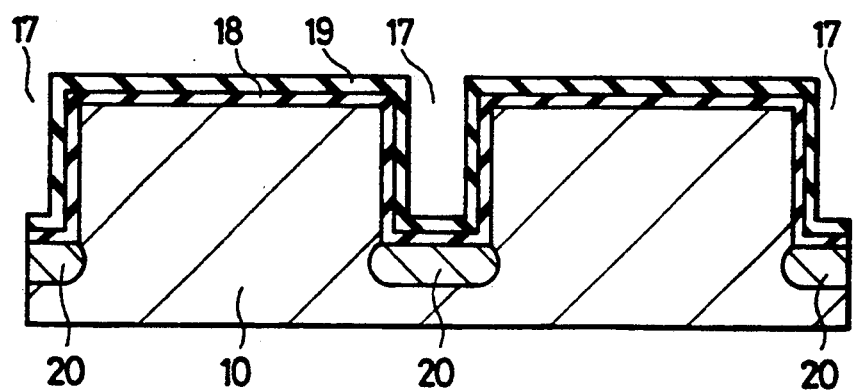
FIGS. 28 to 35 are flow diagrams showing the manufacturing method of another embodiment of the present invention.

First, a thick field oxide film to be used for indirect peripheral parts is formed on the semiconductor substrate by the LOCOS process (in order to avoid complexity, the film shall not be shown in the drawings referred to below), whereupon recesses 17 are formed by the foregoing method. As shown in FIG. 28, a capacitor $SiO_2$ film 18 and a capacitor $Si_3N_4$ film 19 are respectively deposited to thicknesses of 5–50 nm and 5–50 nm. As these films are thinner, the capacitance of the capacitor per unit area becomes larger. These films, however, cause the permanent breakdown when an electric field within them exceeds $1 \times 10^7$ V/cm. In point of the reliability over a long term, therefore, greater thicknesses are more preferable. With thicknesses less than 5 nm, the direct tunnel current gradually becomes predominant. It is therefore difficult to set the thicknesses less than 5 nm. On the other hand, this embodiment utilizes the MOS inversion capacitor. Therefore, it is usually recommended to form heavily-doped isolation layers 20 in the bottoms of the recesses 17 by the ion implantation or the like.

Figure 29:
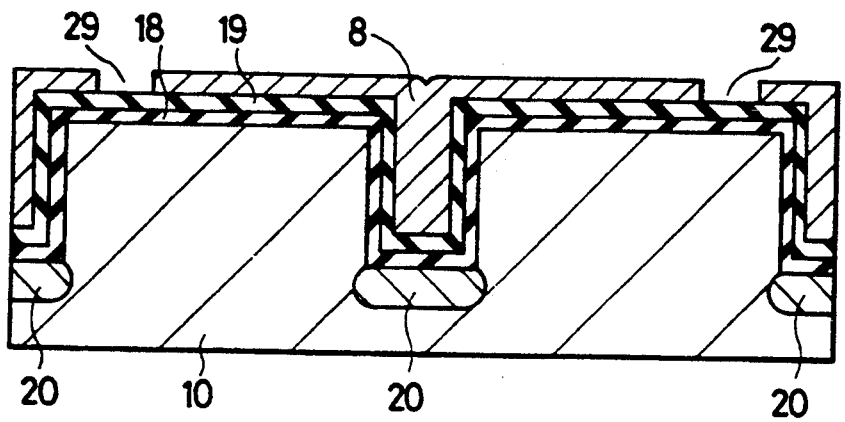

Thereafter, as shown in FIG. 29, a plate 8 made of polycrystalline Si is deposited in a manner to fill up the recesses 17 by the use of the method explained with reference to FIG. 12. Subsequently, using the well-known lithographic process, the plate 8 is formed with substrate connection holes 29 in its parts connecting to the substrate 10.

Figure 30:
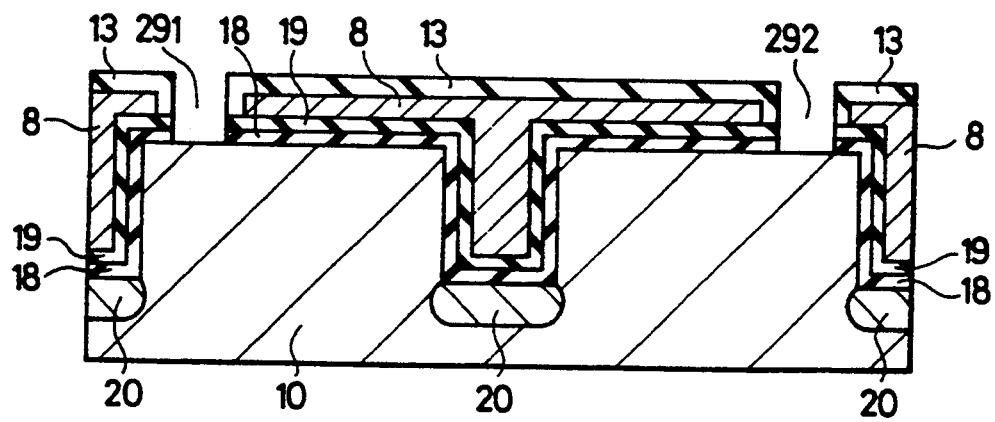

Thereafter, as shown in FIG. 30, the plate 8 is thermally oxidized at 800°–1100° C. for a predetermined period of time so as to form a first inter-layer oxide film 13. At this time, the exposed parts of the $Si_3N_4$ film 19 shown in FIG. 29 are scarcely oxidized. Accordingly, using the first inter-layer oxide film 13 as a mask, the exposed parts of the $Si_3N_4$ film 19 are etched with hot phosphoric acid at 180° C., by the plasma etching employing freon gas, such as $CF_4$, as a principal constituent, or the like. Further, the exposed parts of the capacitor $SiO_2$ film 18 are etched with an HF-system etchant. Thus, holes 291 and 292 are formed. A structure obtained in this way is shown in FIG. 30.

Figure 31:
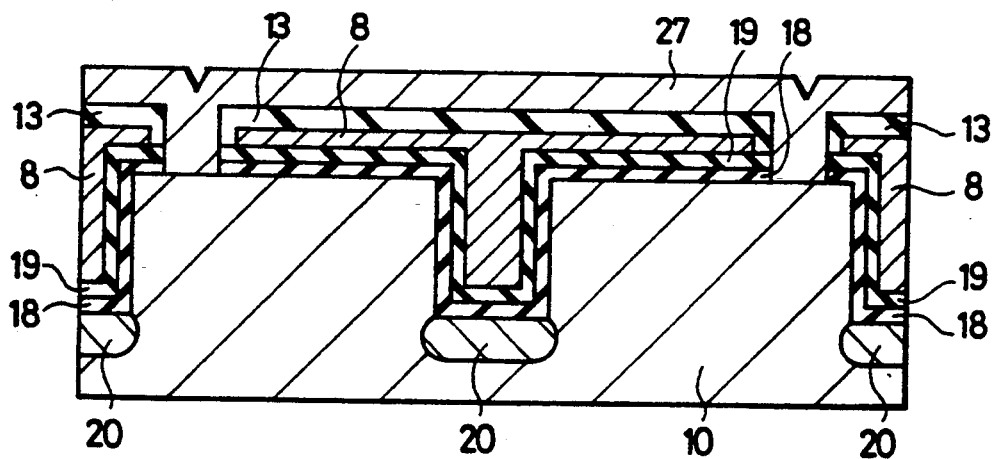

Thereafter, polycrystalline Si is deposited on the whole area by approximately 100–1000 nm by the well-known process employing, e.g., $SiH_4$ or $SiH_2Cl_2$ gas. Subsequently, while the whole Si substrate 10 is held at a predetermined temperature of the room temperature to 1000° C. the entire surface of the polycrystalline Si film is irradiated with the spot of a CW-Ar laser having a diameter of 15–30 μm, under the conditions of an energy level of 5–10 W and a scanning rate of 10–50 cm/sec. Thus, as shown in FIG. 31, the polycrystalline Si film begins to turn into the single crystal from its parts contacting with the Si substrate 10, and the single-crystal Si extending in a range of a radius of 20–50 μm is first formed, so that an epitaxial layer (silicon-on-insulator layer, hereinafter abbreviated as SOI layer) 27 is eventually formed on the insulating film 13.

Here, the example which employs the laser annealing resorting to the so-called CW laser has been mentioned. Since, however, the channel portions 28 of the switching transistors 2 may merely be finally turned into the single crystal, various methods such as annealing resorting to a carbon heater and annealing resorting to an electron beam can be employed besides the laser annealing method.

Moreover, the Si film to be single-crystallized by the laser annealing or the like is not restricted to the polycrystalline Si film, but it may well be a film produced by the conventional epitaxial growth at 800°–1200° C. In this case, only the parts of the film in and around the connection holes 29, each part having a diameter of 2–3 μm, become the single crystal, and the surrounding area becomes polycrystalline. Therefore, the whole film or at least the transistor channel parts 28 of the film may be subsequently single-crystallized by the aforementioned annealing.

A large number of processes for growing polycrystalline Si on an insulating film have been proposed, and they can be properly selected and employed in the present invention.

The SOI crystal is more liable to defects than the single crystal, in its interface with the underlying insulating film, and this part sometimes incurs the leakage currents of the transistors which are formed later. It is therefore favorable to dope the vicinity of the surface of the first inter-layer oxide film 13 with boron in advance by the ion implantation or the diffusion of BN, so that the lower surface of the SOI layer 27 may be doped with the boron.

Figure 32:
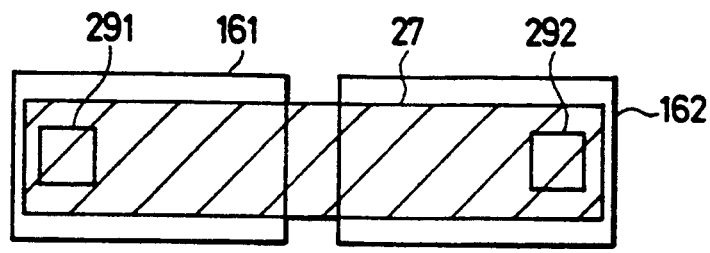

Thereafter, the unnecessary parts of the SOI layer 27 are etched and removed by the well-known photolithographic process so that at least the parts of the layer to form the switching transistors therein may be left behind. A plan view of the resultant structure is shown in FIG. 32.

The etching in this case can employ any of many well-known methods of etching Si. For example, it is possible to perform the wet etching which employs an $HF+HNO_3$ system solution, the plasma etching which employs $CF_4$ or $SF_6$ gas or the like as a principal constituent, or the anisotropic etching which employs KOH, hydrazine or the like exhibiting a low etching rate especially for the (111) plane. Particularly the anisotropic etching has the following advantage. When the SOI layer 27 has the (100) plane as its upper surface, it is formed into the vertical sectional shape of a trapezoid having a wide lower end at about 55 degrees (the angle defined between the (100) plane and the (111) plane). Therefore, the SOI layer comes to have gentle end parts, and the formation of various films to be deposited thereon is facilitated.

Figure 33:
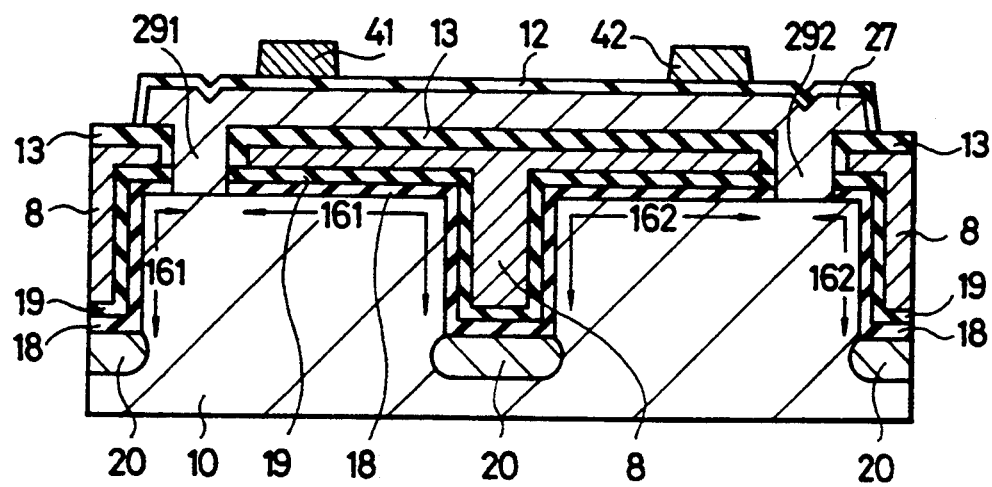
Figure 34:
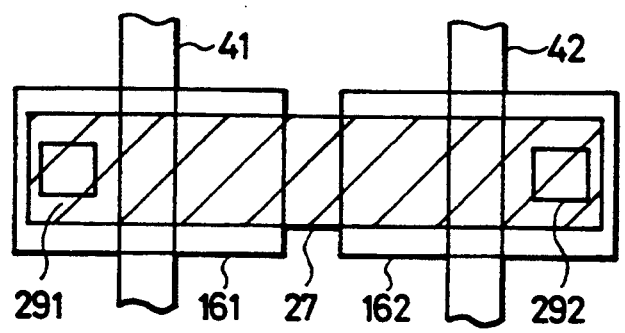

Thereafter, as shown in FIG. 33, a gate oxide film 12 is formed by the well-known thermal oxidation process or the like, and a required amount of boron is ion-implanted thereinto in order to attain a desired threshold voltage $V_{TH}$. Further, word lines 4 (41, 42) are deposited on selected areas. A plan view of the resultant structure is shown in FIG. 34.

Figure 35:
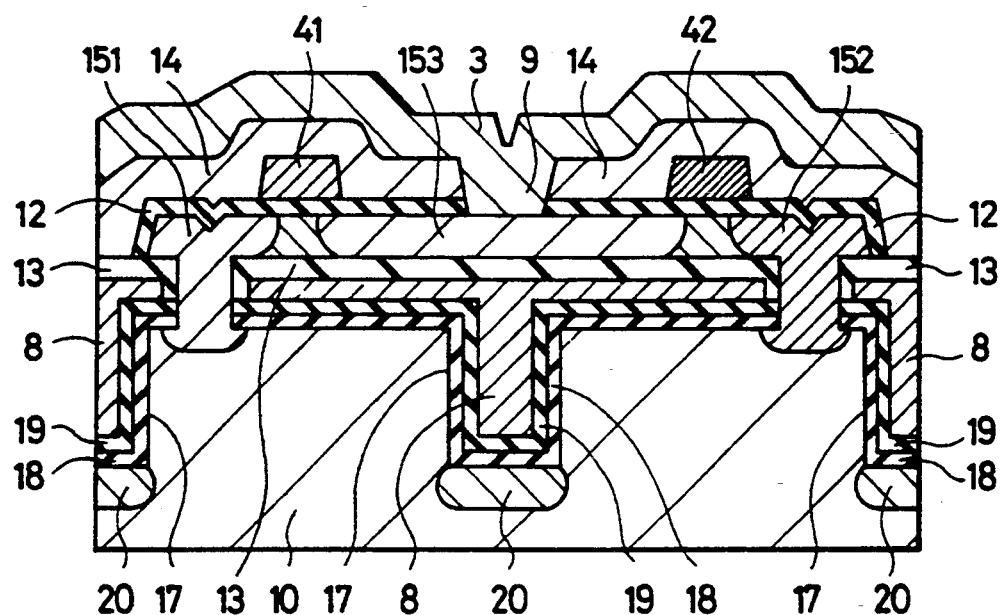

Next, when As or P is ion-implanted at an acceleration voltage of 60-120 keV in a dose of approximately $5 \times 10^{15} - 2 \times 10^{16} /cm^2$ by using the gates (word lines) 41 and 42 of the switching transistors as a mask, n+ source and drain junction layers 151 152 and 153 are formed as shown in FIG. 35. Further, a second inter-layer insulating film 14 which is typified by a CVD $SiO_2$ film containing 4-10 mol-% of phosphorus (abbreviated to "CVD PSG") is deposited to a thickness of 300-1000 nm, and it is heat-treated at 900°-1000° C. so as to be densified. Thereafter, electrode connection holes 9 which extend down to the n+ layers 151, 152 and 153, gates 41 and 42 and plates 8 are formed, and electrodes 3 which are typified by Al electrodes are deposited on selected areas. Thus, the 1-transistor type dynamic memory cells in which the side walls of the etched recesses 17 are principally utilized for the capacitors can be constructed.

Figure 36:
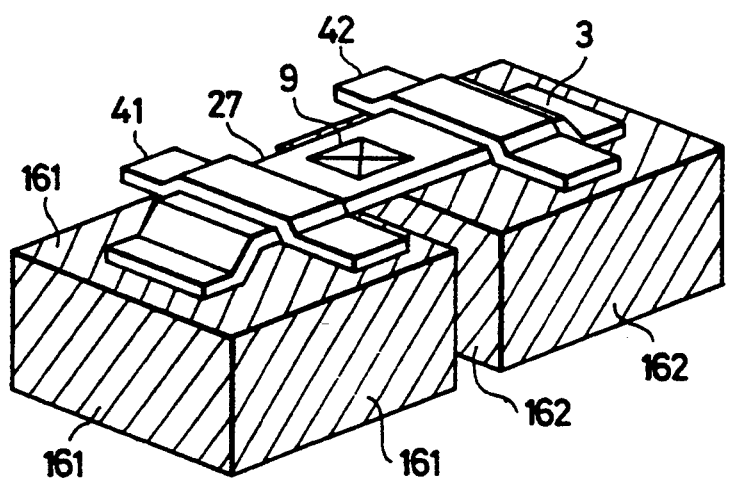
FIG. 36 is a model view showing the structure of a semiconductor memory produced by the manufacturing method of FIGS. 28 to 35.

FIG. 36 shows a bird's-eye view of the memory cells of this embodiment. Only the capacitor portions 161, 182, the SOI film 27, the connection hole 9, the word lines 41, 42 and the bit line 3 are extracted and illustrated in order to avoid complicacy.

Figure 37:
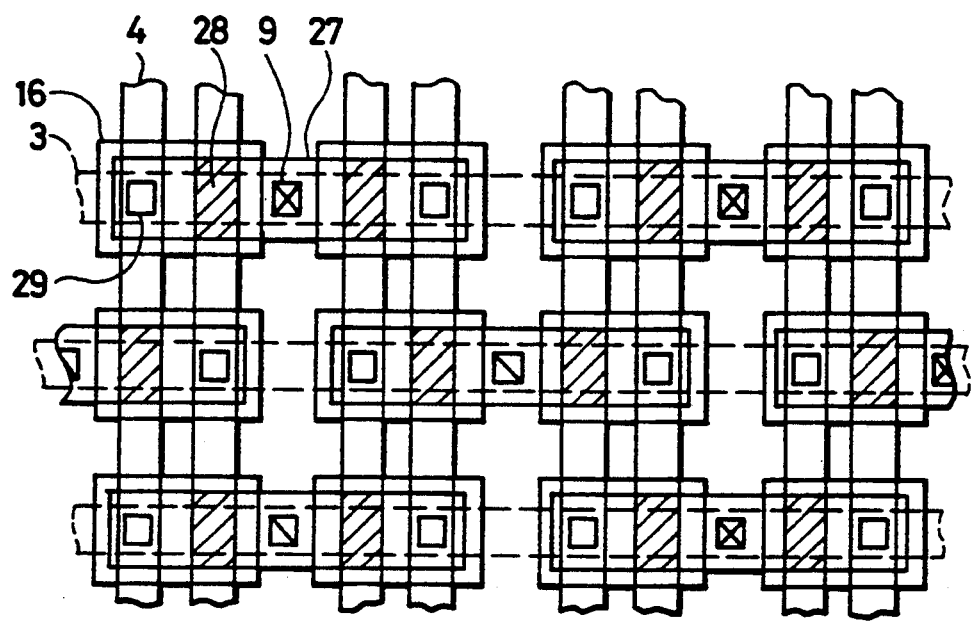
FIGS. 37 and 38 are views for explaining the arrayals of memory cells.

In putting such pairs of memory cells into a plurality of arrays, they may be arranged as shown in FIG. 37 by way of example. In order to avoid complicacy, the figure shows only the SOI portions 27, word lines 4, bit lines 3, capacitor regions 16, substrate connection holes 29, contact holes 9, and the transistor channel portions 28 which are hatched.

Figure 38:
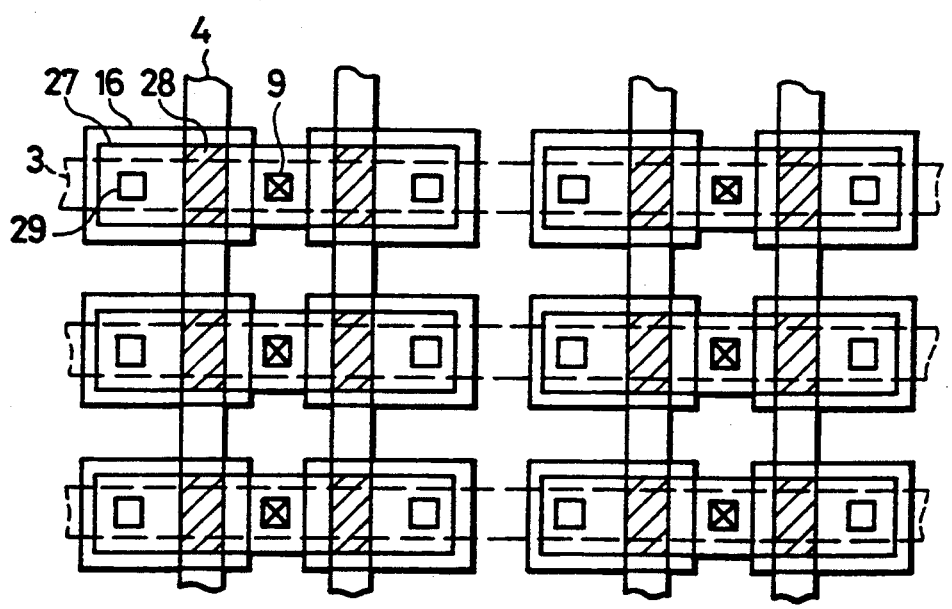

While this embodiment is of the folded bit line arrangement, an embodiment of the present invention for the open bit line arrangement is shown in FIG. 38. The open bit line arrangement may be a half in the number of arrayal of the word lines 4 as compared with the folded bit line arrangement. Therefore, when only this point is noted, the former is advantageous, but it has the disadvantage that noise to hamper the normal operation of the circuitry is relatively great.

In the present embodiment, after the desired parts of the Si film formed on the insulating film have been single-crystallized, the unnecessary parts are removed. However, it can be similarly performed that after the polycrystalline Si has been deposited on the whole area, the unnecessary parts are first removed, whereupon the desired parts are single-crystallized by the foregoing laser annealing or the like.

Figure 39:
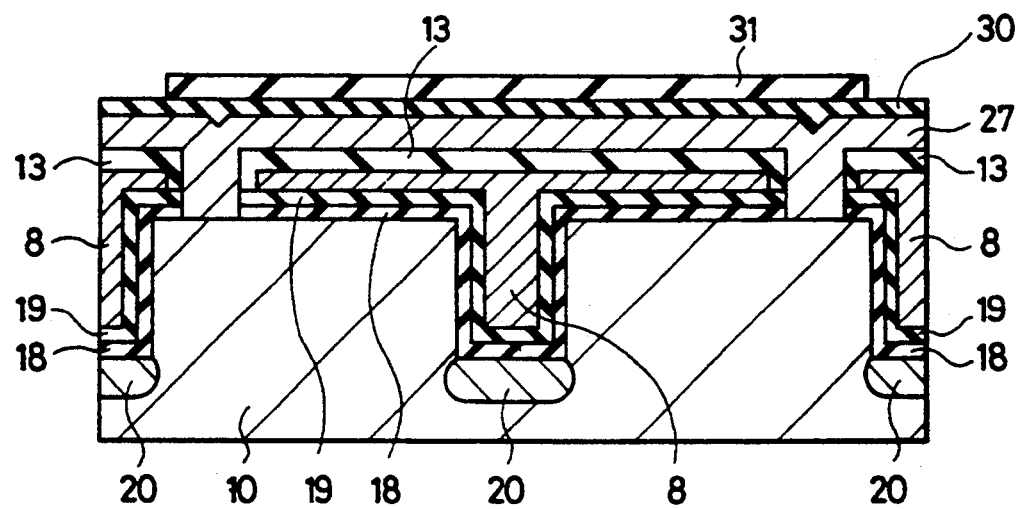
FIGS. 39 to 41 and FIGS. 42 to 44 are flow diagrams showing different manufacturing methods of semiconductor memories according to the present invention, respectively.

While, in the present embodiment, the unnecessary SOI parts have been removed, such unnecessary parts may be partially turned into an oxide film as in another embodiment of the present invention to be stated next. After the structure shown in FIG. 31 has been formed, an underlying $SiO_2$ film 30 being 1-50 nm thick is formed in a required area, and an $Si_3N_4$ film 31 as a LOCOS mask being 50-200 nm thick is deposited on selected parts thereof, as illustrated in FIG. 39.

Figure 40:
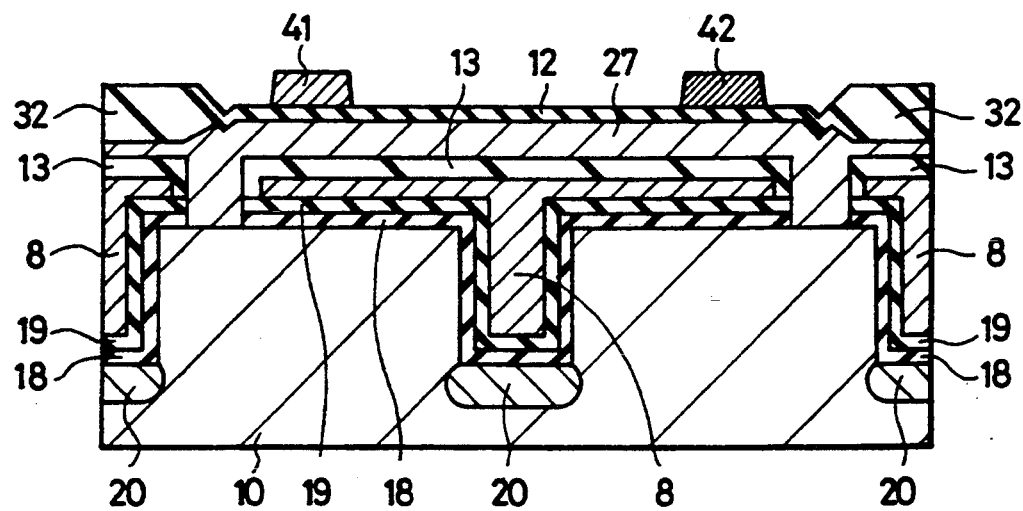

Thereafter, as shown in FIG. 40, a desired SOI field oxide film 32 is formed by the wet oxidation at a temperature of 800°-1100° C. When, herein, the SOI layer 27 is to be somewhat left under the SOI field oxide film 32, the field oxide film 32 may be formed after channel stoppers have been formed by ion-implanting boron into the exposed parts of the SOI film 27 by usually employing the $Si_3N_4$ film 31 as a mask as in the well-known LOCOS process. Thereafter, the $Si_3N_4$ film 31 and the $SiO_2$ film 30 are removed, whereupon as shown in FIG. 40, the gate oxide film 12 is formed and the word lines (the gates of the switching transistors) 41 and 42 are selectively deposited.

Figure 41:
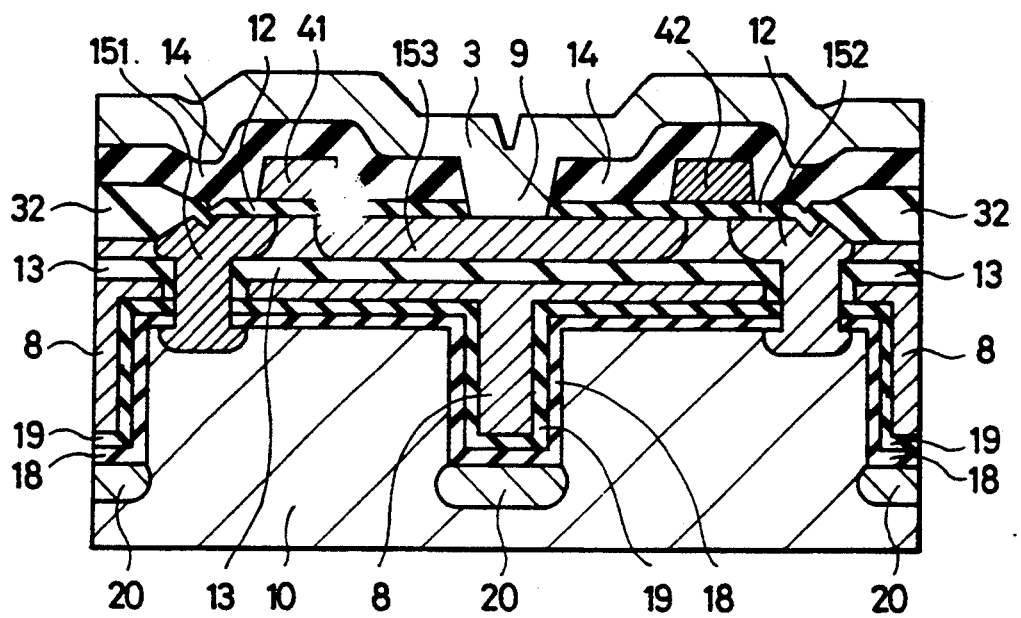

Subsequently, via the formation of the sources and drains as shown in FIG. 35, the second inter-layer insulating film 14, contact holes 9 and bit lines 3 of Al are formed or selectively deposited as shown in FIG. 41. Then, the memory cells are formed.

Since, in the present embodiment, the unnecessary parts of the SOI layer are changed into the oxide film, the steps of the substrate surface are smaller than in the case of removing the unnecessary SOI layer. This is advantageous for the formation of various films to be deposited on the steps. Another advantage is that, since the field $SiO_2$ film 32 exists, the parasitic capacitance between the SOI layer and the underlying plate 8 or Si substrate 10 becomes small.

In the embodiments of the present invention thus far described, the bit line 3 is electrically connected to one pair of memory cells through the single contact hole 9 as shown in FIG. 37. In this case, the contact hole 9 must be formed between one pair of confronting word lines. This necessitates to form the contact holes between the confronting word lines with pattern alignment margins. When the memory cells are fined, the alignment margins become unnegligible, and besides, they form a serious hindrance.

Figure 42:
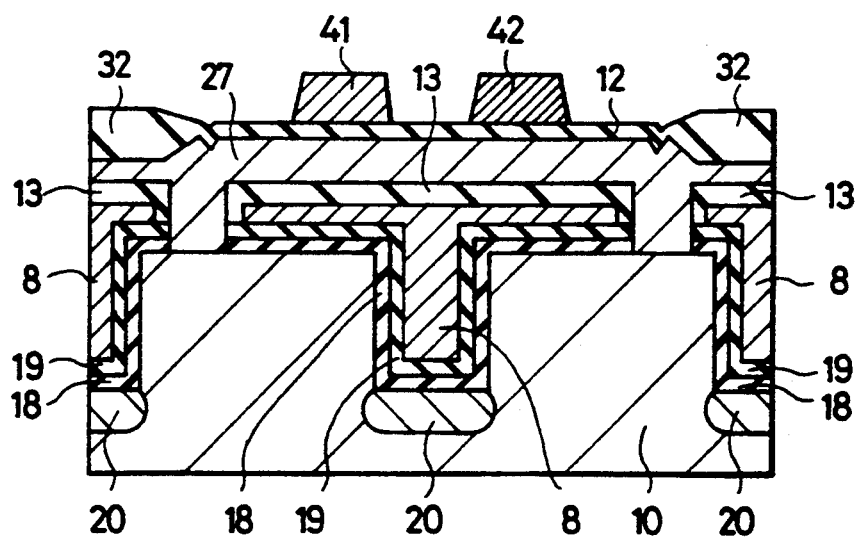
Figure 43:
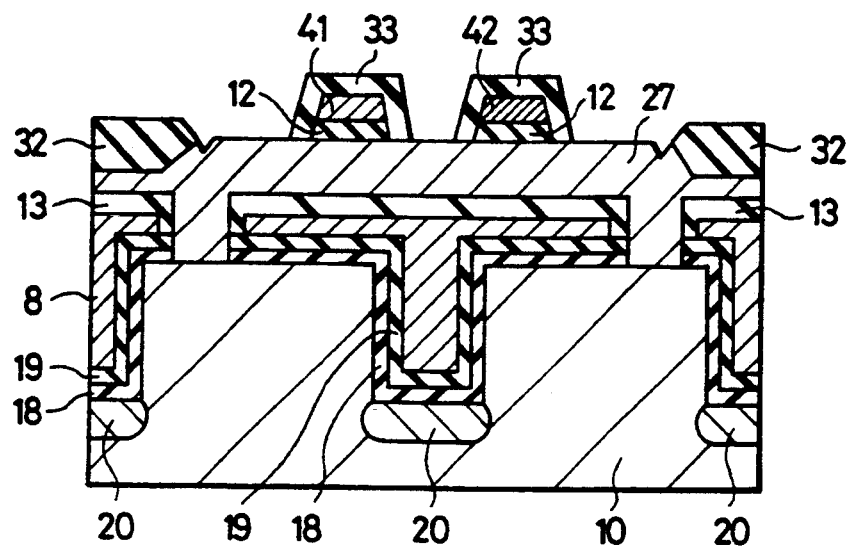

An embodiment to be described below renders the mask alignment margin zero in principle. As shown in FIG. 42, word lines 41 and 42 made of polycrystalline Si are formed at the interval of the minimum working dimension attainable by the lithographic technique. At this time, the polycrystalline Si is doped with phosphorus or/and As at a density of $5 \times 10^{20}$–$2 \times 10^{21}$ cm$^{-3}$ in advance. Thereafter, the wet oxidation is performed in an atmosphere containing steam at 700°–950° C. Then, since the oxidation rate is higher at a higher impurity density, a thick oxide film is formed on the word lines 41 and 42 made of the polycrystalline Si, and a relatively thin oxide film is formed on an SOI film 27. Subsequently, the oxide films are etched uniformly over the entire area until the oxide film on the SOI film 27 is removed. Then, as shown in FIG. 43, the oxide film 33 still remains on the word lines 41 and 42 made of polycrystalline Si though it has been thinned by the etching, in a manner to cover only the word lines 41 and 42 made of polycrystalline Si whereas the surface of the SOI film 27 is exposed.

Figure 44:
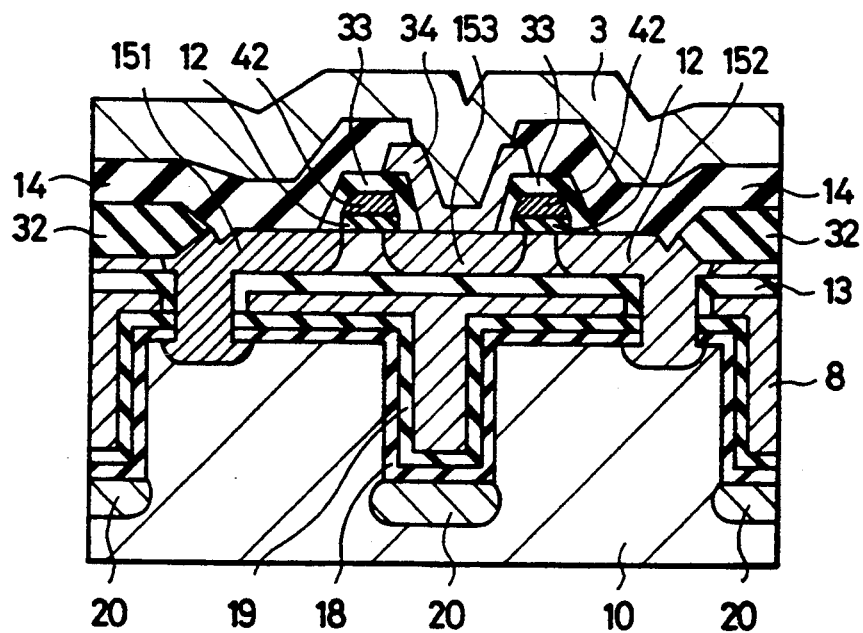

Next, as shown in FIG. 44, n+ layers 151, 152 and 153 are formed by the ion implantation of P or As in order to form sources and drains, and an underlying polycrystalline Si film 34 is deposited selectively on only the n+ layers 153, whereupon a second inter-layer insulating film 14 is deposited. Further, contact holes extending down to the underlying polycrystalline Si film 34 are formed, and bit lines 3 are deposited on selected parts. Then, memory cells are formed.

As understood by comparing the distance between the word lines 41 and 42 in FIG. 41 and the distance between the word lines 41 and 42 in FIG. 44, the distance between the word lines can be made very small in accordance with the present embodiment.

In the present embodiment, the polycrystalline Si has been covered with the oxide film of its own in self-alignment fashion by utilizing the difference between the impurity densities of the polycrystalline Si and the SOI layer. However, when an Si$_3$N$_4$ film is deposited beforehand on a gate oxide film 12 shown in FIG. 42, the same structure can be realized without utilizing the difference of the impurity densities. This is the same method as that illustrated in FIG. 13. Even when the polycrystalline Si 41, 42 is oxidized, the SOI layer 27 is not oxidized because of the Si$_3$N$_4$ film deposited thereon, so that only the polycrystalline Si is formed with the covering oxide film 33. The subsequent steps are the same as in the foregoing embodiment. The final structure obtained differs from the structure shown in FIG. 44, only in that the portion of the gate oxide film 12 consists of the two layers of the gate oxide film 12 and the Si$_3$N$_4$ film deposited thereon. The other portions are the same.

Any of the foregoing embodiments has the n+ layer 153 common to one pair of memory cells, and the bit line 3 of Al is connected thereto through the contact hole 9. As another embodiment of the present invention, there will be mentioned a case where a single bit line 3 is connected to at least two pairs of memory cells through one contact hole 9.

Figure 45:
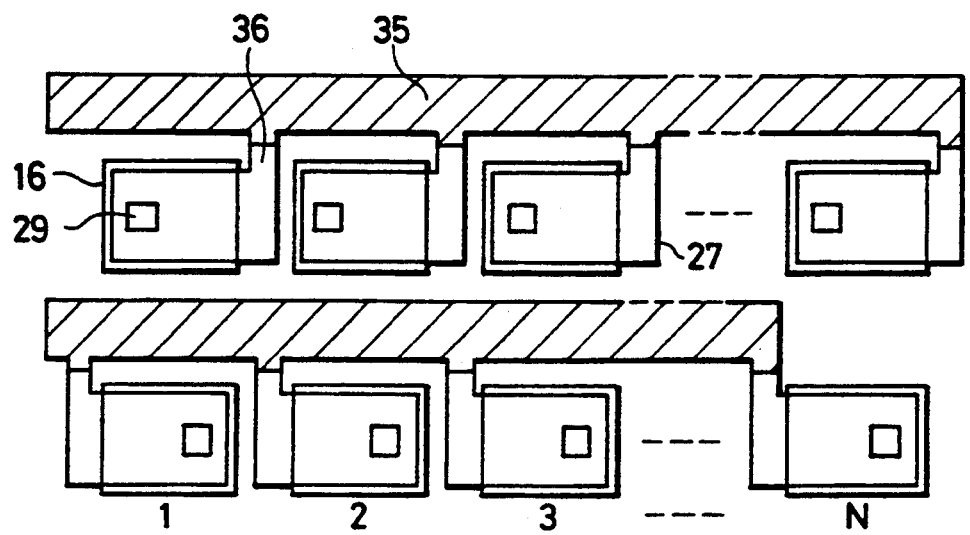
FIGS. 45 to 47 are diagrams for explaining connections in the present invention.
Figure 46:
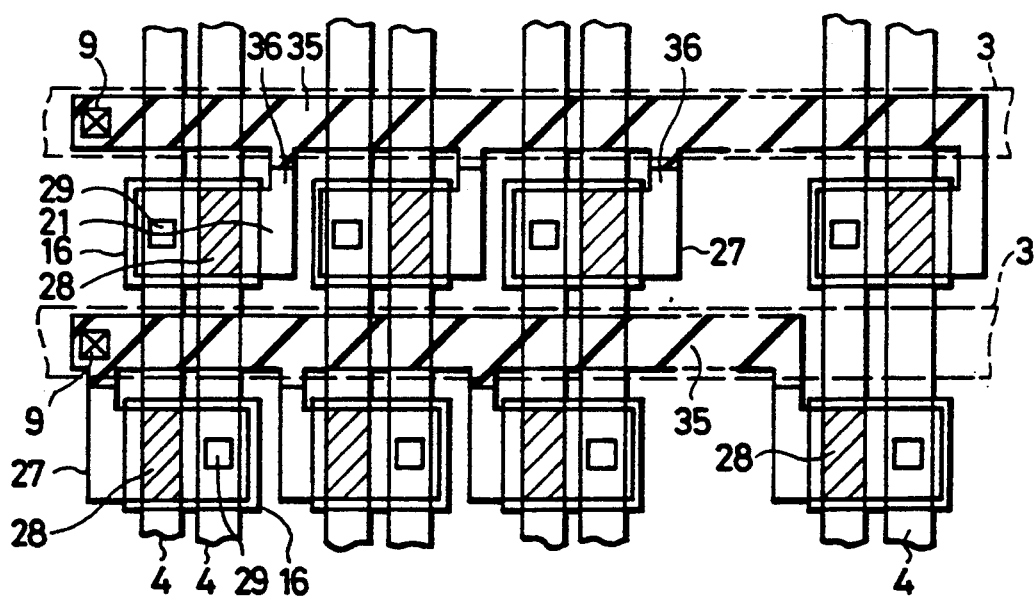

As shown in plan in FIG. 45, an SOI layers 27 is selectively formed on capacitor regions 16 through substrate connection holes 29. (Alternatively, an SOI layer may be deposited on the whole area and then have its unnecessary parts turned into a field oxide film by the LOCOS process, as described before.) At this time, the capacitor portions 16 at 1, 2, ... and N are connected by the lead-out portions 36 of the SOI layer 27. Thereafter, the connection portion of the SOI layer is doped with the ions of P, As or the like by the well-known ion implantation or diffusion process so as to form an n+ layer, which is used as a bit line 35 shown in FIG. 45. The reason why the connection portion of the SOI layer is turned into the n+ layer in advance, is that the portion is not doped with P or As even at the step of forming sources and drains because word lines to stride over the portion act as a mask. Thereafter, the word lines 4 and bit lines 3 may be formed as shown in FIG. 46 by, e.g., the method illustrated in FIGS. 31–35. Since only one contact hole 9 suffices for N memory cells, the embodiment makes it unnecessary to set the alignment margins for the individual memory cells in order to form the contact holes 9 and is suited to an enhanced density of integration.

Figure 47:
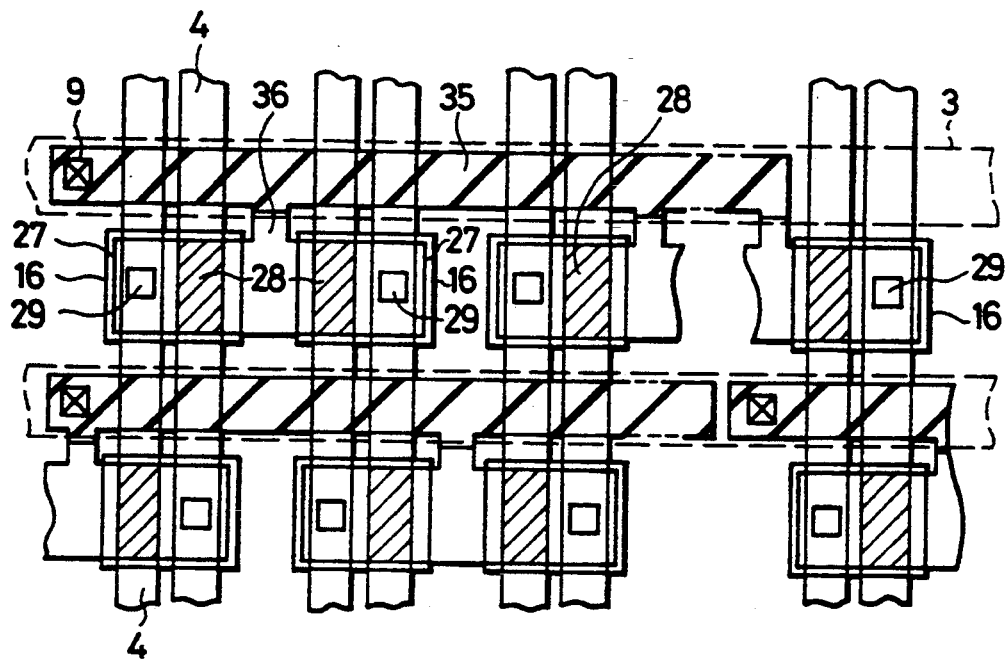

In the present embodiment, the lead-out portions 36 of the SOI layer are provided for the respective memory cells. However, when one lead-out portion 36 is provided for a pair of memory cells as in another embodiment shown in FIG. 47, an area used for the lead-out portions decreases to that extent, which is suited to an enhanced density of integration.

Here, the N memory cells are connected with the bit line 3 by the single contact hole 9. However, when the number of all memory cells to be connected with one bit line is N, the other bit lines made of Al are dispensed with. Accordingly, it becomes unnecessary to perform the Al wiring on the memory cells, so that the formation of a memory LSI is facilitated. Since Al is deposited in a place close to the uppermost layer of the memory LSI, the working precision of the Al is lowered by the unevenness of an underlying layer, and moreover, the disconnection of the Al arises at an abrupt step. In the working of the LSI, therefore, the Al is a material which is the most difficult of patterning. Accordingly, dispensing with the Al wiring on the memory cells is very effective for enhancing the reliability of the semiconductor device.

The memory cells employing the foregoing SOI layer has advantages to be stated below. Since the switching transistor portions and the bit line exist in the thin SOI layer, the rate of creating electron-hole pairs within the SOI layer is low in spite of the entrance of α-particles, which is advantageous in point of α-particle immunity. In addition, since the drain portion 153 of the switching transistor is deposited on the thick oxide film 13, the parasitic capacitance $C_D$ of the bit line is small. The signal-to-noise ratio (S/N ratio) of a memory is substantially proportional to the ratio $C_S/C_D$ between the capacitor value $C_S$ and the aforementioned $C_D$. In this regard, according to the present invention, $C_S$ can be made large and $C_D$ small, so that the $C_S/C_D$ ratio becomes very great, and the operating margin of the memory is remarkably improved.

Figure 48:
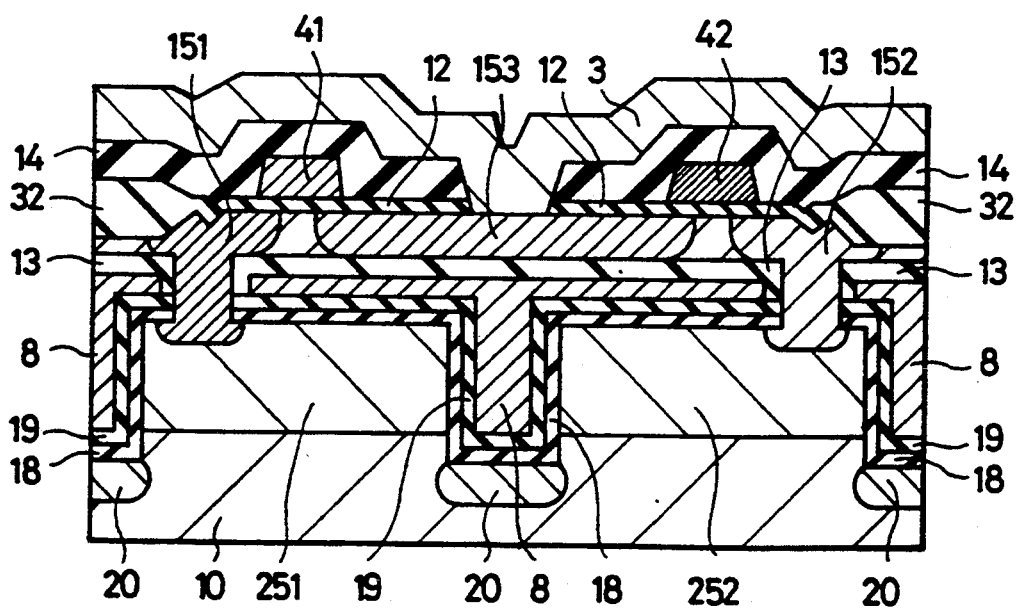
FIGS. 48 and 49 are views each showing the sectional structure of the essential portions of an embodiment of the present invention.

While, in the above, the embodiments of the memory cells employing the SOI layer have been referred to, they all utilize the MOS inversion layer. However, as already illustrated in FIGS. 25 and 26, the n+ layer can be used instead of the MOS inversion layer. An embodiment wherein capacitors formed by the use of n+ layers are applied to memory cells of the structure shown in FIG. 41, is illustrated in FIG. 48. Capacitor electrodes 251 and 252 made of the n+ layers can be formed in advance by performing the conventional ion implantation or diffusion to a desired thickness over the entire area of a Si substrate 10 in which the memory capacitors are to be formed, before recesses 17 are formed. Alternatively, after an Si₃N₄ film 19 which is the insulating film of the capacitors has been formed, the n+ layers 251 and 252 can be formed in predetermined parts by the ion implantation. In the course, the capacitor electrodes 25 can be formed before or after any step.

With the capacitor electrodes 251 and 252, $V_{SS}$ (earth potential) can also be applied to the plates 8 as has already been described in the example of FIG. 25. In this case, the heavily-doped isolation layer 20 is unnecessary when the selected impurity density of the substrate is sufficiently high.

The highest level of energy of α-particles emitted from a package or the like is about 4 MeV due to U or Th. When they enter vertically, electron-hole pairs to appear within the Si substrate are created most at a depth of about 20 μm from the uppermost surface. This is not always true because the α-particles enter obliquely actually. Anyway, however, the performance of α-particle immunity is enhanced by removing electrons which appear in a region below a thickness of several μm.

Figure 49:
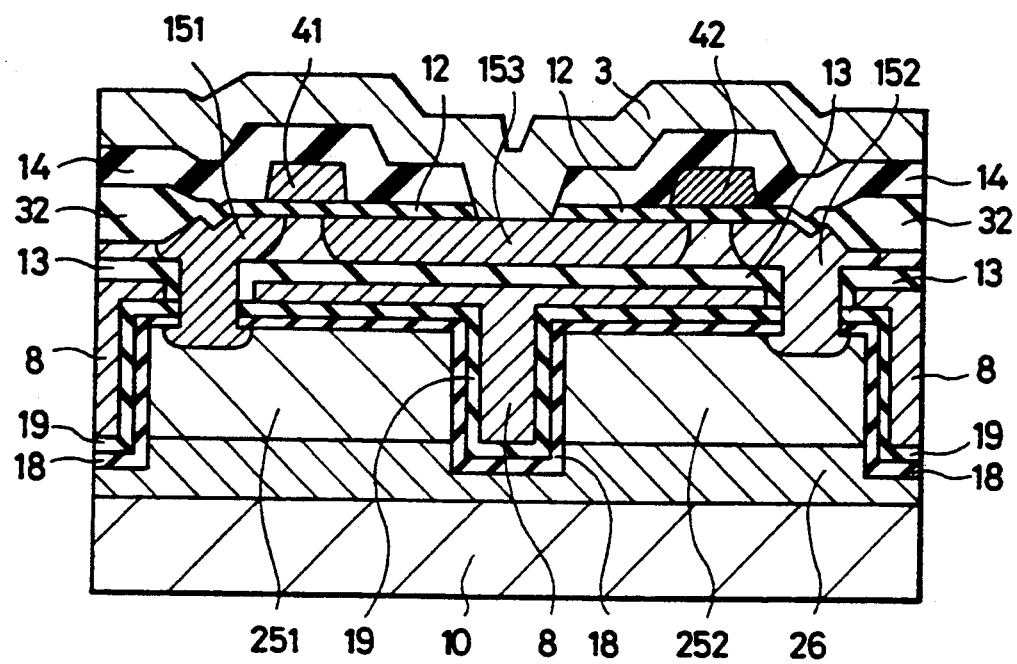

Accordingly, when a heavily-doped capacitor layer 26 of the p-conductivity type is disposed under the n+-type capacitor electrodes 251 and 252 as shown in FIG. 49, it serves as a barrier against the electrons generated by the α-particles, and besides, the increase of a depletion layer capacitance owing to the contraction of a depletion layer is attained as in the embodiment shown in FIG. 26, so that $C_S$ is further increased.

When, to the end of relieving the influences of the electrons and holes attributed to the α-particles, that junction shown in FIG. 49 which is defined by the n-type substrate 10 and the heavily-doped layer 26 is reverse-biased (with the n-type region held at a plus potential, and the p-type region at a minus potential) and the electrons and holes created within the depletion layer of the junction are allowed to run into this junction as a current, the performance of α-particle immunity is more enhanced.

When the Si substrate 10 is made still higher in the impurity density than the heavily-doped layer 26, the probability at which the electron-hole pairs created within the substrate are recombined by themselves to disappear rises, so that the performance of α-particle immunity is enhanced. In this case, a p-type layer may be grown on a p+-type Si substrate by the epitaxial growth process and used as the substrate of the memory cells.

Figure 50:
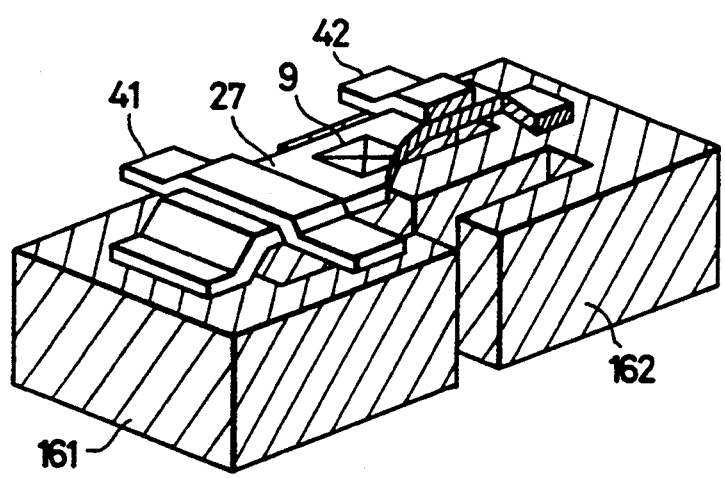
FIG. 50 is a model view for explaining the structure of an embodiment of the present invention.
Figure 51:
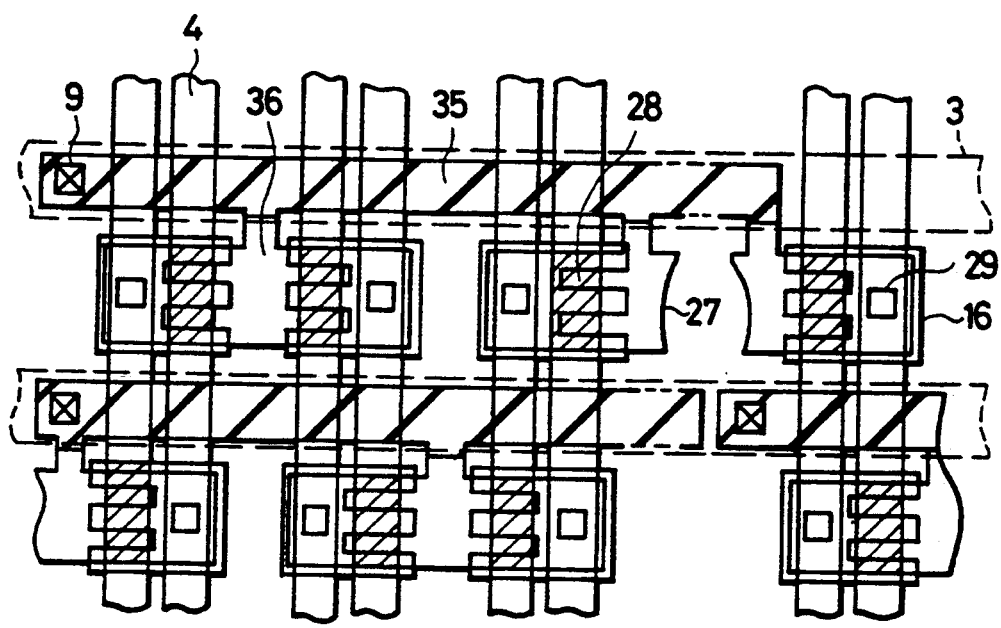
FIG. 51 is a diagram for explaining an example of the plane configuration of the present invention.

In the above description of the embodiments employing the SCI, the capacitor has been shaped into the rectangular parallelepiped as shown in FIG. 27. When it is formed with the interdigitated parts at the minimum workable dimension $L_{min}$ as shown in FIGS. 20-24, the capacitor area, in turn, the capacitance $C_S$ can be sharply improved similarly. FIG. 50 shows a bird's-eye view of such situation, while FIG. 51 shows a plan view thereof. When one side of the capacitor region 16 is 2-3 or more times greater than $L_{min}$ yet, the interdigitated parts can be always formed.

Figure 52:
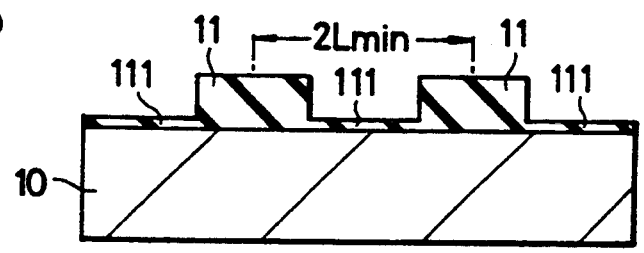
FIGS. 52 to 59 are flow diagrams for explaining a method of forming narrow recesses.

In an embodiment to be described below, recesses for capacitors can be formed at a pitch which is equal to double the minimum workable pitch. As shown in FIG. 52, field SiO₂ films 11 being 100-1000 nm thick are formed at a working pitch of 2 $L_{min}$. To this end, it may be carried out to form a thick SiO₂ film over the whole area, to remove the unnecessary parts thereof by the dry etching, and to thereafter form a thin SiO₂ film 111 over the entire area.

Figure 53:
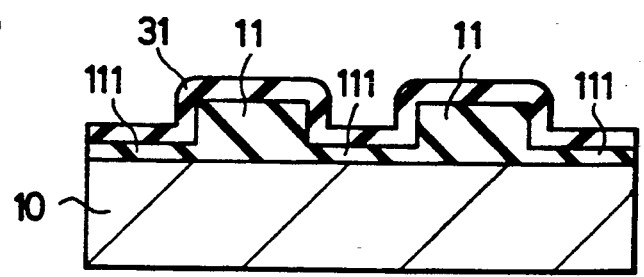
Figure 54:
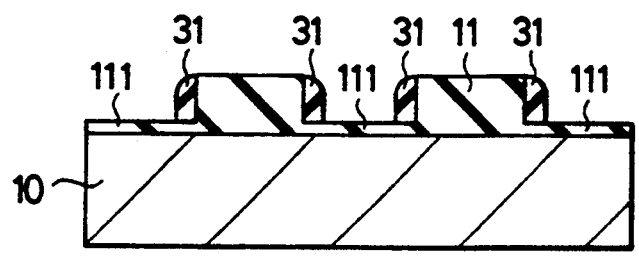
Figure 55:
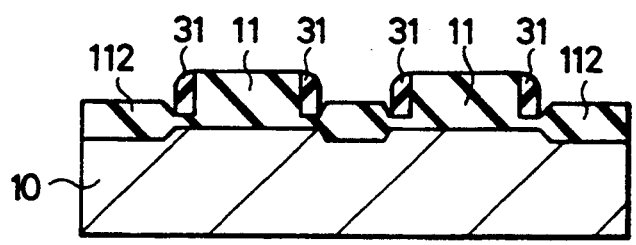

Next, as shown in FIG. 53, a LOCOS Si₃N₄ film 31 being 50-1000 nm thick is deposited. Thereafter, when the Si₃N₄ film 31 is entirely dry-etched, it is left at the end parts of the field oxide films 11 as shown in FIG. 54 because the etching is directional.

Figure 56:
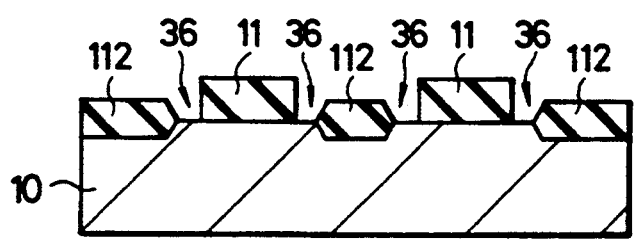
Figure 57:
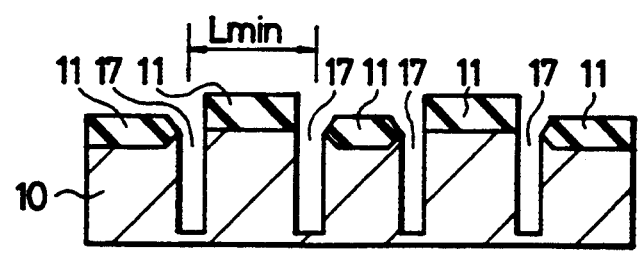

Thereafter, an SiO₂ film being 100-1000 nm thick is formed by the thermal oxidation processing, to form a thick field oxide film 112 in the parts of those thin oxide film 111 on the Si substrate 10 on which the Si₃N₄ film 31 is not deposited. Next, as shown in FIG. 56, the Si₃N₄ film 31 is removed, whereupon the thin oxide film 111 is removed by etching. Thus, grooves 36 are formed. When the resultant Si substrate 10 is dry-etched by employing the SiO₂ films 11 and 112 as a mask, etched recesses 17 are formed in the Si substrate 10 as shown in FIG. 57. At this time, the pitch of the etched recesses becomes $L_{min}$, which is a half of the pitch 2 $L_{min}$ of the initial field oxide film mask shown in FIG. 52. It is easy to form the etched recess 17 which is about 100 nm wide and about 5 μm deep. In order to expand the width, the thickness of the Si₃N₄ film 31 may be increased. Even in case of a fine recess, the width can be expanded with an HF-HNO₃ system etchant after the dry etching. While the dry-etched Si surface is usually prone to contamination or crystal defects, the wet etching is excellent in that the layer liable to the defects or contamination can be removed.

Figure 58:
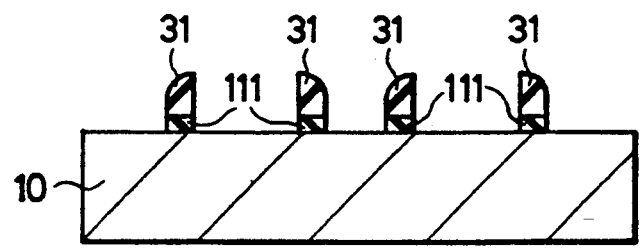
Figure 59:
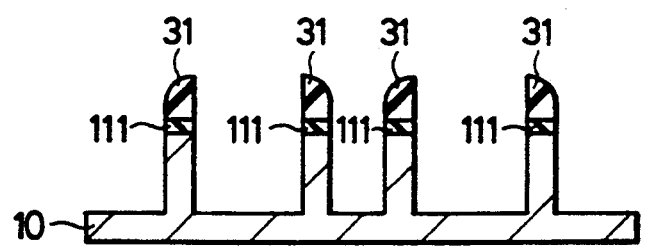

In the present embodiment, there has been mentioned the method which utilizes the thickness of the Si₃N₄ film 31 in order to form the narrow recesses for the capacitors. Basically, however, the mask material of the dry etching may be left on edges worked beforehand. By way of example, after the processing by the steps shown in FIGS. 52-54, the SiO₂ films 11 and 111 are etched and removed. Then, only the Si₃N₄ film 31 and underlying SiO₂ film 111 are left as shown in FIG. 58. Thereafter, the exposed part of the Si substrate 10 is subjected to the dry etching which etches the Si substrate 10 but not the Si₃N₄ film 31. Then, as shown in FIG. 59, a pattern inverse to the pattern of FIG. 57 is obtained, and substrate parts underlying the Si₃N₄ film 31 are left unetched. Accordingly, mask materials which include the aforementioned Si₃N₄ can be properly selected and used in consideration of the etching rates of various films in dry etching operations.

The foregoing embodiments have been selected from among a large number of choices or processes. The respective steps can accordingly be variously modified, but all are common in the point that the side walls of the recess formed in the substrate are utilized as a part of the capacitor. For example, with the method of forming the substrate connection hole illustrated in FIGS. 29-30, the upper layer of the capacitor insulating film is formed of the Si₃N₄ film 19, which is not oxidized in case of oxidizing the plates 8 of polycrystalline Si. It is therefore utilizable in the present invention.

Figure 60:
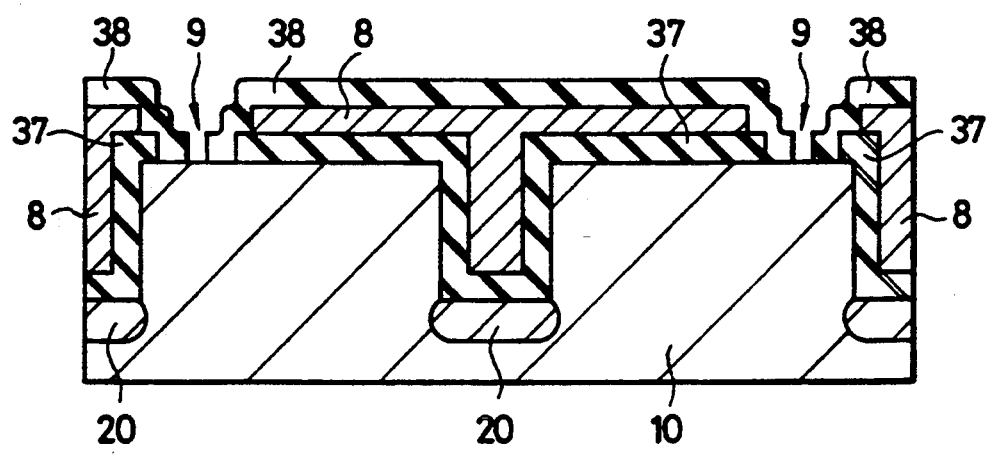
FIG. 60 is a sectional view of an embodiment.

By way of example, when as shown in FIG. 60, a capacitor insulating film 37 is formed of a non-oxidation-resisting film such as of Ta₂O₅ and NbO which cannot endure processing performed in an oxygen atmosphere at a temperature of 800°-1000° C. the first inter-layer insulating film cannot be formed by oxidizing the polycrystalline Si plates 8. Therefore, an oxidation-proof first inter-layer insulating film 38 which is typified by an Si₃N₄ film is deposited in a manner to cover the end parts of the non-oxidation-proof capacitor insulating film 37 as illustrated in FIG. 60. At this time, the substrate connection holes 9 require pattern alignment separately from the holes of the plates 8 and the non-oxidation-proof insulating film 37, and alignment margins are required among these holes. The same method can also be adopted in the case of the oxidation-proof capacitor insulating film.

Figure 61:
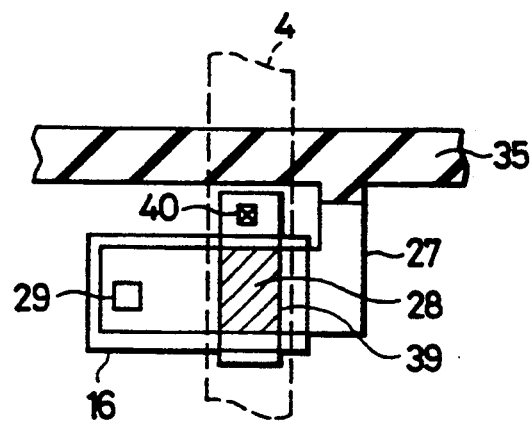
FIG. 61 is a view for explaining an example of connection in the present invention.

In addition, the present invention has been described as to the case where the word line 4 is the gate continuous within the memory cell array. As shown in FIG. 61, however, one or more transfer gates 39 of polycrystalline Si within memory cells may well be connected by the word line 4 of Al through contact holes 40. Thus, a memory can be obtained which has both a high reliability possessed by a polycrystalline Si gate having hitherto been often used and a fast switching operation based on the low resistance of Al. FIG. 61 illustrates the case of the embodiment shown in FIG. 46, but this measure is also applicable to cases other than the embodiment.

In the present invention, the side walls of the recess dug in the substrate are utilized as a part of the capacitor. Therefore, the capacitance $C_S$ may be further increased in such a way that any portion other than the recess of the substrate, for example, a substrate surface portion or a hitherto-known laminated capacitor constructed of polycrystalline Si—Si$_3$N$_4$ film—polycrystalline Si is formed on the substrate surface and is connected in parallel with the capacitor formed at the side wall portion of the recess.

Figure 62:
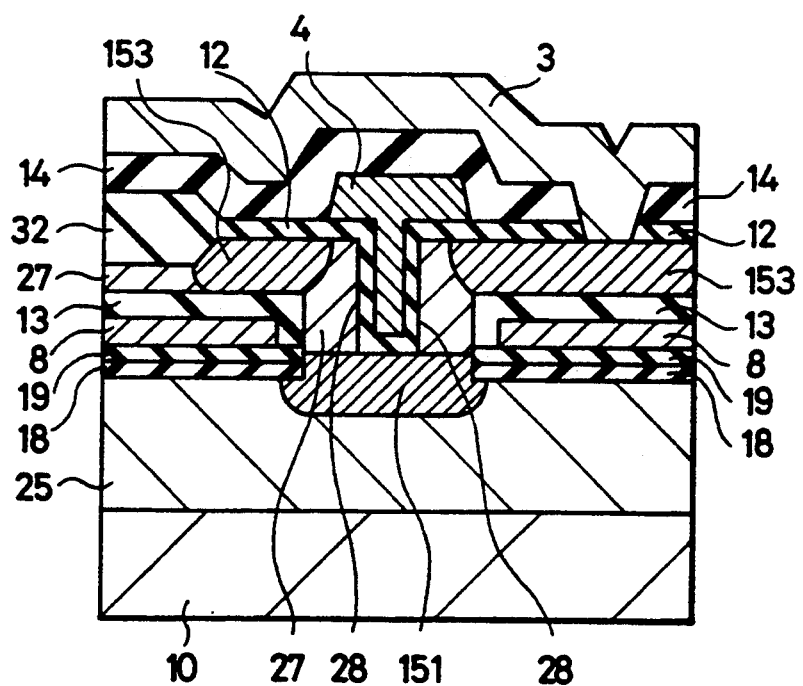
FIG. 62 is a view showing the essential portions of the sectional structure of another embodiment.

While the switching transistor has been formed within the SOI layer in parallel with the Si substrate, the transistor channel portion 28 can also be formed in the vertical direction of the SOI layer 27 as shown in FIG. 62. This vertical channel transistor is applicable to all the memory cells employing the SOI layer as described above.

While the present invention has been described in connection with the n-channel type MOS transistors, the p-channel type can be realized by employing impurities which reverse the conductivity types of all the impurities, as described before. Phosphorus or As may be replaced with B or Al, and B with phosphorus, As, Sb or the like.

The present invention has thus far been described in detail in conjunction with the embodiments. In the present invention, when the switching transistors are formed on the substrate surface, the capacitor capacitance $C_S$ can be increased 2 to 3 times greater than that of the prior-art memory cell, subject to equal plane areas, and when they are formed in the SOI layer, it can be increased several times. In actuality, the recesses are not shaped into perfectly straight planes but are somewhat rounded, and the resolution of the lithography degrades in fine parts. For this reason, even when the designed shape is a regular square, the recess sometimes becomes a shape close to a circle. Even in this case, however, the decrease of $C_S$ is at most 10–20%, and a far greater value of $C_S$ than in the prior art is attained.

The malfunction of a dynamic memory attributed to α-particles is often improved by one order or more when $C_S$ increases by only 10%. Therefore, the double or more increase of $C_S$ raises the reliability of the memory of the particular scale and also makes it possible to realize the memory of a larger scale.

Figure 63:
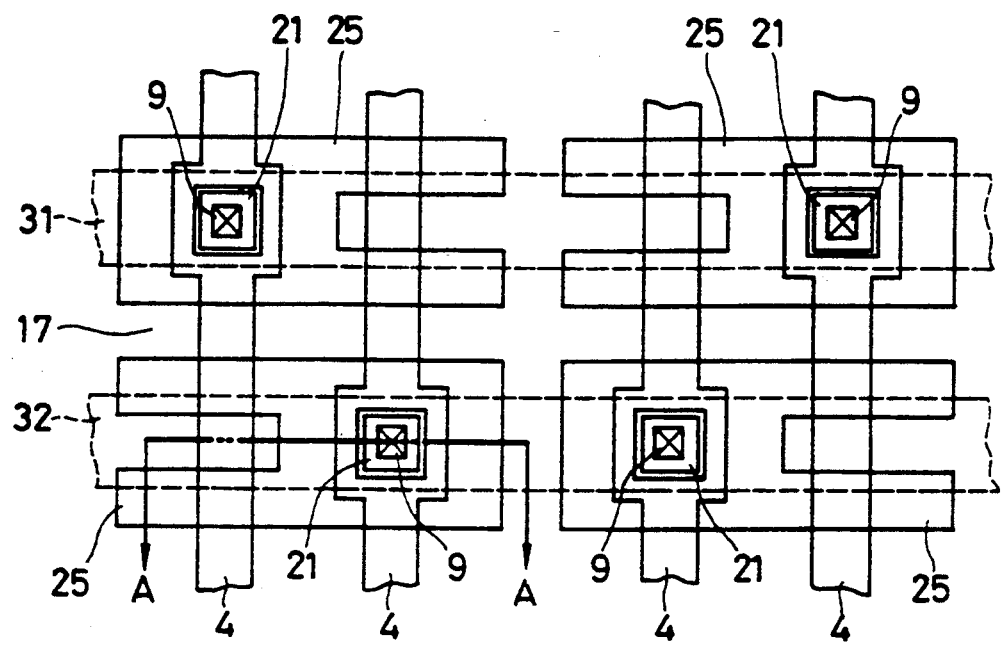

Now, the invention will be described in detail in conjunction with further embodiments. First, FIG. 63 shows a plan view of one embodiment of the present invention. When compared with the prior-art memory cells shown in FIG. 4, the embodiment differs in that all capacitor electrodes 25 are formed so as to cover the whole front surface of a Si substrate and the vicinity thereof and that the channel portions of switching transistors 2 are formed by the use of the side walls of protrusive Si portions 21 which are stacked on the capacitor electrodes 25. Thus, as compared with the capacitor region 16 of the prior-art memory cell which has hitherto occupied only 30–40% of the whole plane as shown in FIG. 4, that of the embodiment is sharply enhanced and can occupy approximately 80–90% of the whole plane. Since, as described later, the capacitor region 25 utilizes the side wall part of a recess 17 dug in the Si substrate, the area of the capacitor electrode can be expanded independently of the plane area. It is intended to increase the side wall area that the plane shape of the capacitor electrode 25 is rendered concave in FIG. 63.

Figure 64:
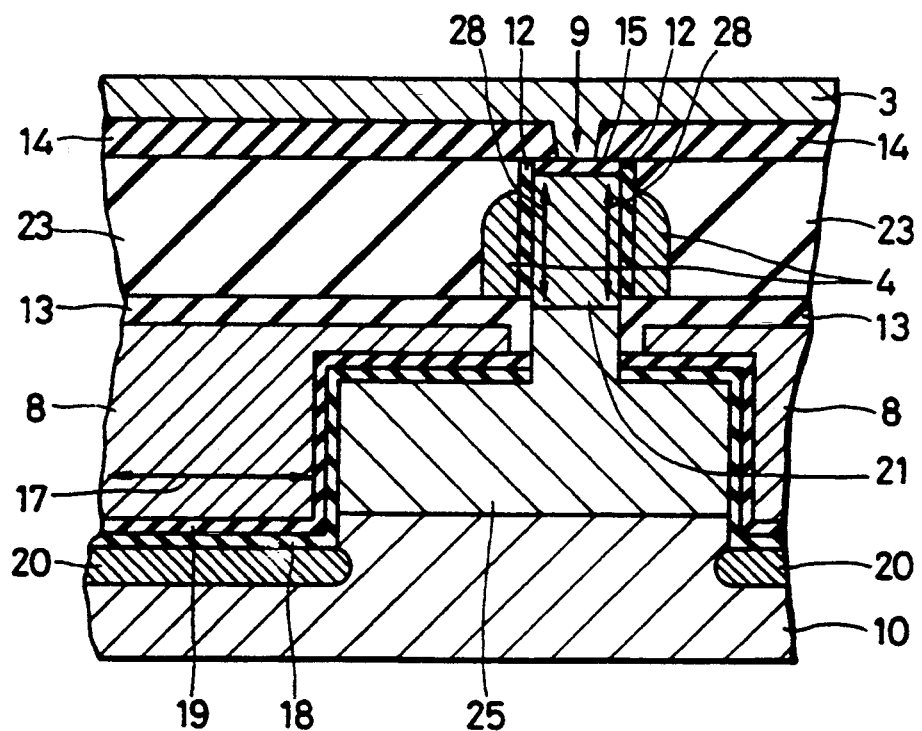

FIG. 64 shows the section AA of the plane pattern depicted in FIG. 63. A plate 8 is buried in the recess 17 dug in the Si substrate 10, through a capacitor SiO$_2$ film 18 as well as a capacitor Si$_3$N$_4$ film 19. A part of the plate is removed, and the Si protrusion 21 is disposed on the capacitor electrode 25 of the n$^+$-type layer through the removed part. A word line 4 serving as a gate is formed along the protrusion 21 through a gate oxide film 12. A bit line 3 is electrically connected to an n$^+$-type diffused layer 15 through a contact hole 9. Thus, the switching transistor 2 can use the side wall of the Si protrusion 21 as the channel portion 28 thereof. According to the present invention, the distance 24 between the capacitor region 16 and the contact hole 9 as already indicated in FIG. 4 becomes unnecessary, which is very advantageous for enhancing the density of memory cells. Particularly the mask registration margins between the contact hole 9 and the word line 4 and between the word line 4 and the capacitor region 16 form serious factors for hampering the enhancement of the density of memory cells, and it is an important feature of the present invention that they are quite unnecessary in plan.

Now, the manufacturing process of the present invention will be described in detail. First, as shown in FIG. 65, an n$^+$-type layer 25 whose impurity concentration is on the order of $10^{17}$–$10^{21}$ atoms/cm$^3$ is formed in the whole surface of a Si substrate 10 and to a depth of 4 μm by the thermal diffusion process of P, As, Sb or the like or the ion implantation process+annealing, which is well known.

Figure 65:
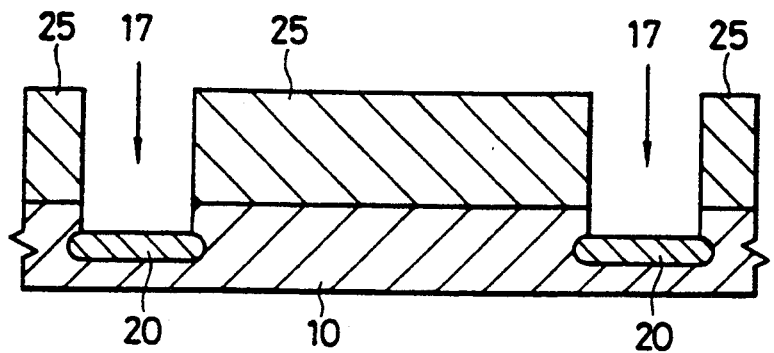

Thereafter, as shown in FIG. 65, etched recesses 17 are formed in predetermined parts of the Si substrate 10 by the parallel-plate type plasma etching in which the gas of F or Cl, for example, CF$_4$, SF$_6$ or CCl$_4$ or a gas further containing H is employed as a principal constituent. As the mask of this plasma etching, the conventional photoresist itself is sometimes etched to disappear. Therefore, films of SiO$_2$, Si$_3$N$_4$ and CVD SiO$_2$ in this order are successively deposited on the Si substrate 10 of the structure shown in FIG. 65 beforehand. After the uppermost layer of CVD SiO$_2$ is etched using a photoresist mask, the underlying layers of Si$_3$N$_4$ and SiO$_2$ are etched. The Si substrate 10 may be etched using the resultant mask. In finally removing the CVD SiO$_2$ for the mask, the Si$_3$N$_4$ film prevents field SiO$_2$ films for the transistors of another circuit, not shown in the figure, from being etched. Accordingly, it may well be replaced with a different film as long as this purpose is met. At least, the three-layer film of CVD SiO$_2$/Si$_3$N$_4$/SiO$_2$ is a mask material, and it is removed in due course and does not remain on the Si substrate. Therefore, insofar as the purpose is met, the mask material is not restricted, Alternatively, when a very fine beam is employed, the desired etched recesses 17 can be formed without any mask material.

In principle, the depth of the etched recess 17 is hardly limited. It is actual, however, that the depth $D_M$ is approximately 1-10 times greater than the width $W_M$ of the recess. In addition, the upper end part of the recess has an acute corner, and the dielectric breakdown voltage lowers due to electric field concentration in some cases. Therefore, the corner may be rounded by isotropic etching such as wet etching before the recess is formed deep. This recess 17 serves also for isolation. Therefore, in case of using the Si substrate 10 which is usually of 10Ω-cm, boron is ion-implanted into the bottom of the recess 17 within a range of $1 \times 10^{11}$-$1 \times 10^{13}$ cm$^{-2}$, followed by annealing at 900°-1000° C., whereby a heavily-doped layer 20 for isolation is formed. In a case where the impurity concentration of the Si substrate 10 is high enough to prevent the leakage current between adjacent capacitor electrodes 25, or in a case where an SOS (Si On Sapphire) substrate, for example, with which the whole n+-type layer 25 to form the capacitor electrodes is formed on an insulator film is employed, the heavily-doped isolation layer 20 need not be formed especially additionally.

Thereafter, the insulator film of capacitors is formed. In principle, the material of this insulator film is not specified as long as it has a high withstand voltage is is electrically stable. Materials heretofore used include thermal oxidation $SiO_2$, thermal nitrification $Si_3N_4$, CVD $Si_3N_4$, and $Ta_2O_5$, $Nb_2O_5$, $TiO_2$ and $GrO_2$ produced by CVD or reactive sputtering. A single layer or a plurality of layers of such materials can be used as the capacitor insulator film. The present embodiment will refer to a case of employing a stacked film made of $SiO_2$ and $Si_3N_4$.

Unlike the case of wet etching, the recesses formed in the Si substrate 10 by the dry etching (such as plasma etching or sputter etching) give the Si substrate 10 electrical and crystallographic damages and contamination more or less. Accordingly, after the dry etching, wet etching may be performed by approximately 10-500 nm until the damages and contamination become, in effect, no problem. As an etchant, the aqueous solution of an $NH_4OH+H_2O_2$ system or an $HF+HNO_3$ system conforms well to this purpose.

Figure 66:
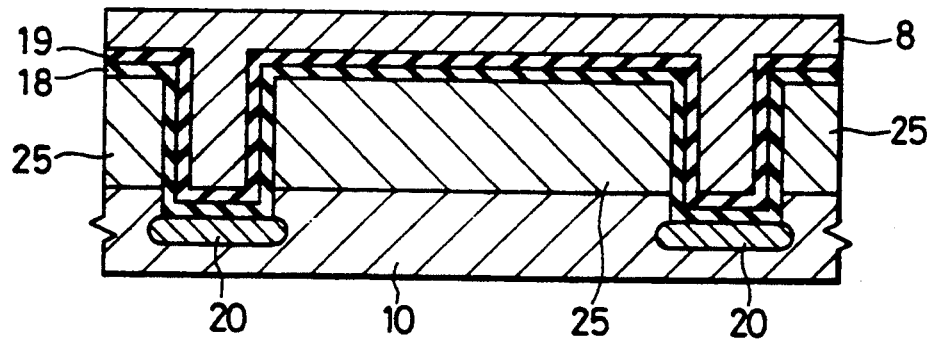

After the surfaces of the Si substrate 10 and the recesses 17 have been removed by this wet etching, the capacitor $SiO_2$ film 18 being 5-20 nm thick is formed by the well-known thermal oxidation at 900°-1200° C. in an oxidizing atmosphere, as illustrated in FIG. 66. Thereafter, the capacitor $Si_3N_4$ film 19 is deposited to a thickness of 5-20 nm by the CVD process at 650°-850° C. Since the thicknesses of these films are set in consideration of a capacitance per unit area and a breakdown voltage as desired, they sometimes depart from the thickness range specified above. In general, the CVD $Si_3N_4$ 19 has an internal stress reaching $1 \times 10^{10}$ dyn/cm$^2$ and is stout. Therefore, when it is deposited directly on the Si substrate 10, defects arise to spoil characteristics. Accordingly, it is common practice to lay the $SiO_2$ under the $Si_3N_4$. This does not apply to a case where the $Si_3N_4$ film is formed by directly nitrifying the Si substrate 10, and a dense film of high breakdown voltage can be obtained in the case. However, a reaction time in excess of 1 hour is required for producing a film thicker than 10 nm. Moreover, the increase rate of the thickness lowers abruptly when the thickness of 10 nm is exceeded. Therefore, the direct nitrification is not proper for producing the thick film. In addition, the $Si_3N_4$ film 19 is favorable in that when the surface thereof is thermally oxidized by 2-5 nm, the pinhole parts thereof are thickly oxidized, so the dielectric breakdown voltage can be enhanced, and besides, in the dry etching of polycrystalline Si to be formed thereon, the oxide layer serves as a stopper against overetching. Thereafter, a plate 8 represented by the polycrystalline Si is deposited on the whole surface. Since the polycrystalline Si deposited by the CVD process precipitates turning into the recess 17 well, the film of the polycrystalline Si on the side wall of the recess 17 becomes substantially the same thickness as that of the film of the polycrystalline Si on the upper surface. Thereafter, this polycrystalline Si is thermally diffused with P by the use of $POCl_3$ gas or the like. In a case where the depth of the recess is as great as 5 μm, diffusion at a high temperature for a long time is required for causing the P to reach the bottom of the recess 17. Therefore, the recess 17 may be filled up as illustrated in FIG. 66 in such a way that polycrystalline Si in a first operation is previously deposited to a thickness not filling up the recess, namely, below ½ of the recess width $W_M$, whereupon the thermal diffusion is performed once, and that polycrystalline Si in a second operation is deposited.

Figure 67:
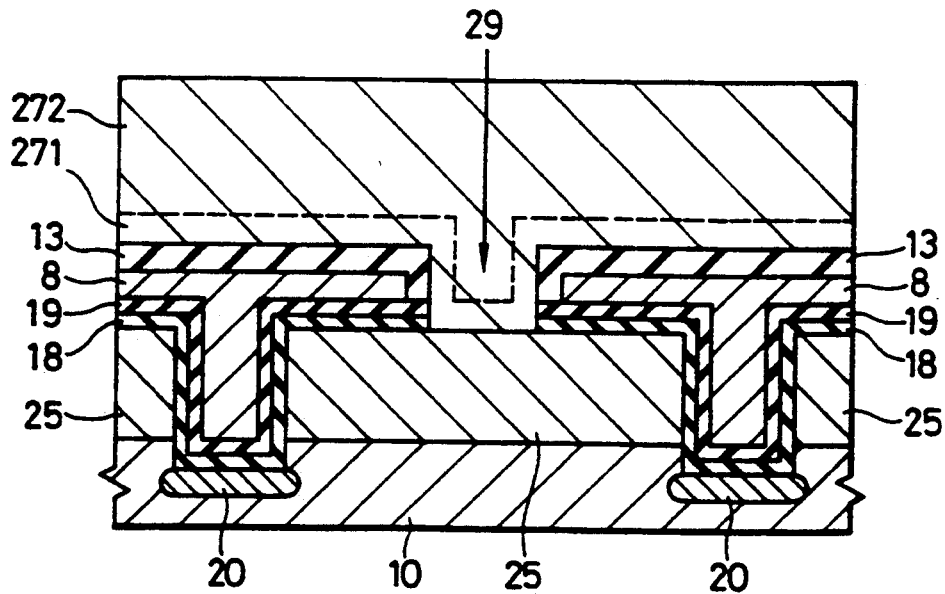

Thereafter, as shown in FIG. 67, a substrate contact hole 29 and the plate 8 are formed by the photoetching process, and the latter is oxidized to obtain a first inter-layer oxide film 13 which is 100-400 nm thick. On this occasion, the $Si_3N_4$ film 19 is hardly oxidized. Subsequently, using the thick first inter-layer oxide film 13 as a mask, the $Si_3N_4$ film 19 and the thin $SiO_2$ film 18 are removed by etching, and an SOI (Si-On-Insulator) layer 27 (271, 272) is formed on the resultant substrate. In the etching operation, the $Si_3N_4$ film 19 is etched using the first inter-layer oxide film 13 as the mask and by, e.g., the plasma etching in which hot phosphoric acid at 180° C. or a Freon gas such as $CF_4$ is employed as a principal constituent, and further, the capacitor $SiO_2$ film 18 is etched with an HF-based etchant. In addition, the SOI layers 271 and 272 are formed as stated below. Polycrystalline Si is deposited on the whole structure to a thickness of approximately 100-1000 nm by employing $SiH_4$ or $SiH_2Cl_2$ gas or the like as is well known. Thereafter, while the whole Si substrate 10 is held at a predetermined temperature from the room temperature to 1000° C., a light beam in the shape of a spot 10-100 μm in diameter or in the shape of a rectangle is projected on the whole surface of the polycrystalline Si film at an energy level of 5-20 W and at a scanning rate of 10-100 cm/sec by the use of a CW-Ar laser. Then, the polycrystalline Si produces single-crystal Si having radii of 20-50 μm or more from its part contacting the Si substrate 10, that is, the epitaxial layer (SOI layer) 271 on the insulator film.

Although the use of the so-called laser epitaxy (single-crystallization by laser annealing) employing the CW laser has been exemplified here, only the channel portion 28 of a switching transistor 2 may finally become a single crystal, and any method of annealing with a carbon heater, annealing with an electron beam, the MBE (Molecular Beam Epitaxy) process, etc. can be used otherwise than the laser epitaxy.

The Si film which is previously deposited before the laser annealing is not restricted to the polycrystalline Si, but the conventional epitaxial growth at 800°–1200° C. can also be employed. In this case, only the vicinity of the contact hole 29 having a diameter of 2–3 μm becomes a single crystal, and the surrounding part becomes polycrystalline. Therefore, the entire polycrystalline layer or at least a part corresponding to the transistor channel portion 28 may be subsequently single-crystallized by the aforementioned annealing.

In the present invention, the method for growing the single-crystal Si on the insulator film is not especially restricted. However, the laser epitaxy and the molecular beam epitaxy suited for producing the SOI layer 27 of good quality are, in general, unsuited for producing the thick SOI layer 27. For this reason, the first SOI layer 271 is previously formed to a thickness of 100–500 nm by either of these methods. The second SOI layer 272 which is thick is formed on this SOI layer 271 by the conventional thermodecomposition of $SiH_4$ or vapor reaction process of $SiCl_4$ or $SiH_2Cl_2$. As a result, the thick SOI layer 27 having a thickness of 1–5 μm can be obtained.

Figure 68:
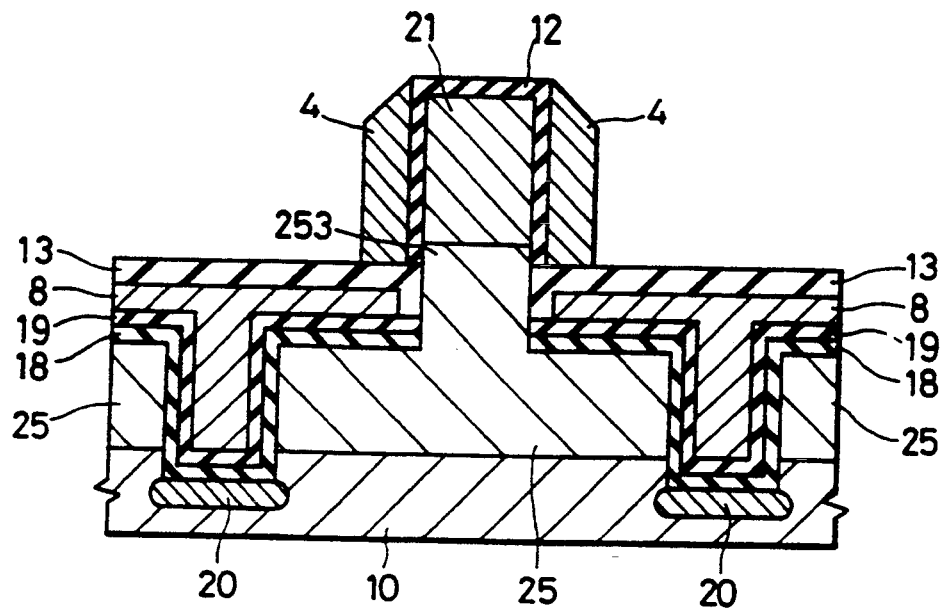

Thereafter, as illustrated in FIG. 68 the SOI layer is etched by the well-known photolithography or the like and has its unnecessary part removed so as to leave at least a pillar-shaped Si protrusion 21 which forms the switching transistor.

Any process for etching Si can be employed for this etching. It is possible to perform the wet etching with an $HF-HNO_3$ system, the plasma etching employing $CF_4$ or $SF_6$ gas or the like as a principal constituent, or anisotropic etching employing KOH, hydrazine or the like with which the etching rate of the (111) plane is especially low. Particularly with the anisotropic etching, when the SOI layer 27 has an upper surface of the (100) plane, it is formed into a trapezoid having a wider lower end at about 55 degrees (the angle defined between the (100) plane and the (111) plane). The gentle end part of the SOI layer has the advantage that various films to be deposited thereon are easy of formation.

The present embodiment has been explained as to the case where the Si protrusion 21 is vertically formed as shown in FIG. 68. Thereafter, a gate oxide film 12 is formed by the well-known thermal oxidation process or the like, boron is ion-implanted to an amount necessary for attaining a desired threshold voltage $V_{TH}$, and a word line 4 is selectively deposited.

In order to deposit on the side surfaces of the Si protrusion 21 the word line 4 which is typically made of polycrystalline Si, or W or Mo, or a silicide such as $WSi_2$, $MoSi_2$ or $TiSi_2$ and which serves as the gate of the switching transistor 2, a film of the aforementioned material is first deposited on the whole surface, and it is etched by directive dry etching. Then, the gate is left on only the side surfaces of the protrusion 21 as illustrated in FIG. 68. In actuality, the memory cells are in the shape of a matrix, and the word lines 4 of the adjacent memory cells need to be connected as shown in FIG. 63, so that a resist needs to be deposited on a part necessary for the connection by photolithography or the like. Besides, the $n^+$-type layer 25 is, in effect, lengthened by the heat treatment and rises as indicated by numeral 253.

Figure 69:
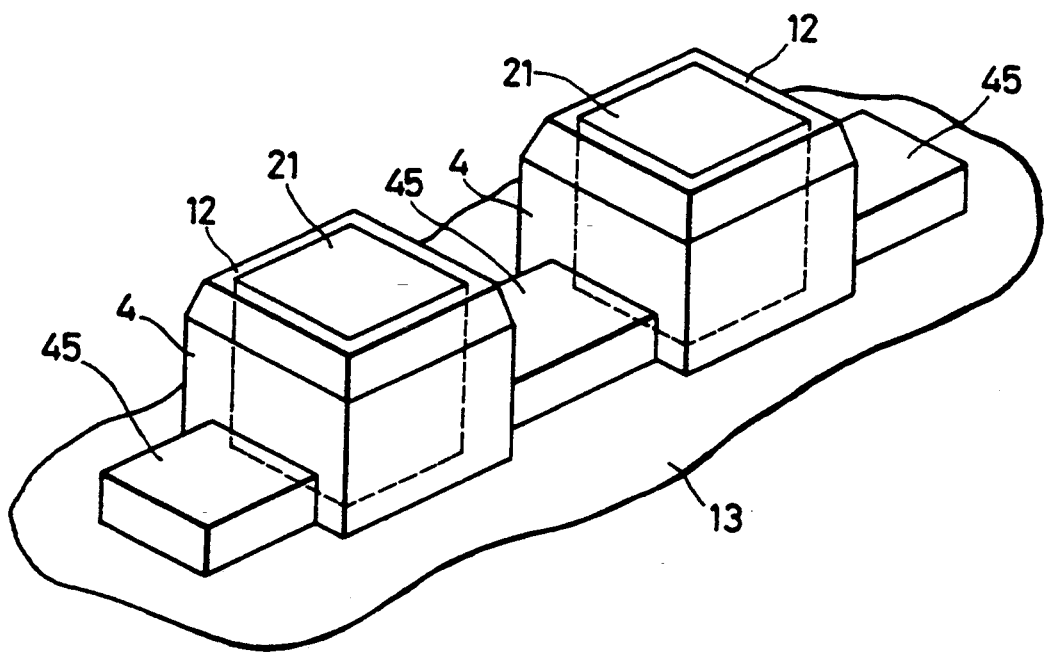

FIG. 69 shows a bird's-eye view of the state in which the word lines 4 of the two memory cells are connected by the connecting part 45.

Figure 70:
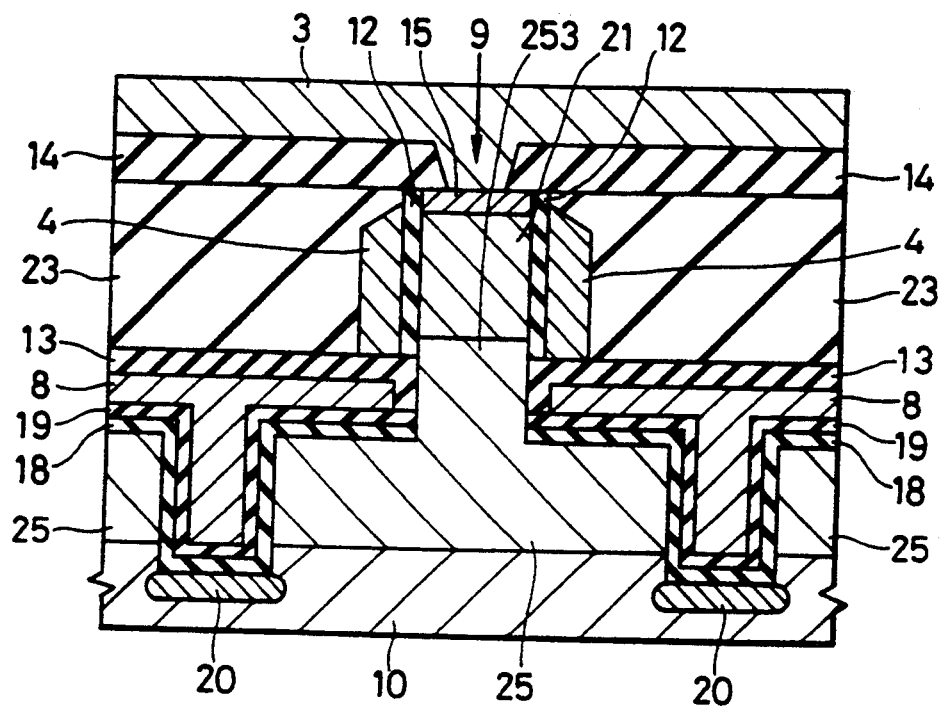

Thereafter, as shown in FIG. 70, a filling insulator film 23 typically made of $SiO_2$ containing or not containing P is deposited by the bias sputtering process, the CVD process or the like so that it may become substantially even with the upper surface of the Si protrusion 21. Although the filling insulator film 23 which is substantially flat is obtained with the bias sputtering process, the $SiO_2$ is thickly deposited also on the Si protrusion 21 by the CVD process. Therefore, after the deposition, the whole surface is coated with an organic resin or the like, the surface of the resin is flattened, and a dry etching process whose etching rates for the resin and the filling insulator film 23 are close is used to etch the whole surface until the surface of the Si protrusion 21 is substantially exposed. Thus, the $SiO_2$ can be buried as the filling insulator film 23 essentially flatly.

Thereafter, As or P is accelerated to 60–120 keV and ion-implanted by approximately $5 \times 10^{15} - 2 \times 10^{16}$ atoms/cm² whereby a source-drain junction layer 15 being an $n^+$-type layer can be formed. Further, a second inter-layer insulator film 14 which is represented by a CVD $SiO_2$ film containing P by 4–10 mol-% (shortly termed "CVD PSG") is deposited to a thickness of 300–1000 nm, and it is annealed at 900°–1000° C. so as to be densified. Subsequently, an electrode contact hole 9 reaching the $n^+$-type layer 15 is formed, and an electrode 3 typically made of Al is selectively deposited. In this way, the one-transistor type dynamic memory cell in which the side wall of the etched recess 17 is principally used for the capacitor can be constructed.

Figure 71:
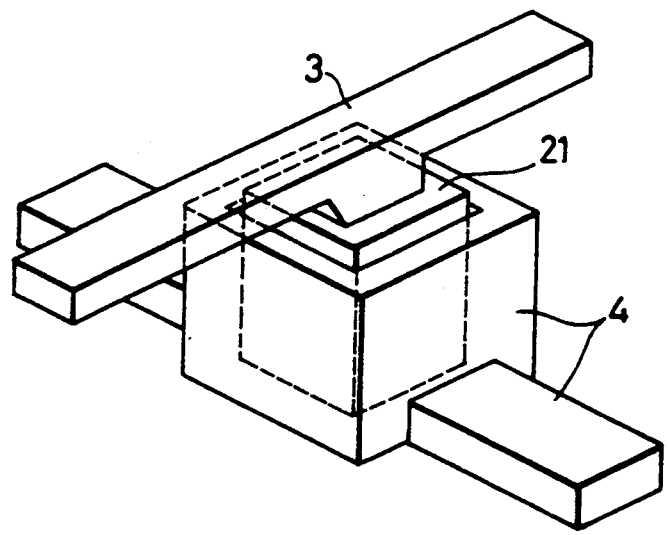

FIG. 71 shows a bird's-eye view of the memory cell of this embodiment. In order to avoid complicacy in the illustration, only the Si protrusion 21, word line 4 and bit line 3 are extracted and depicted.

Figure 72:
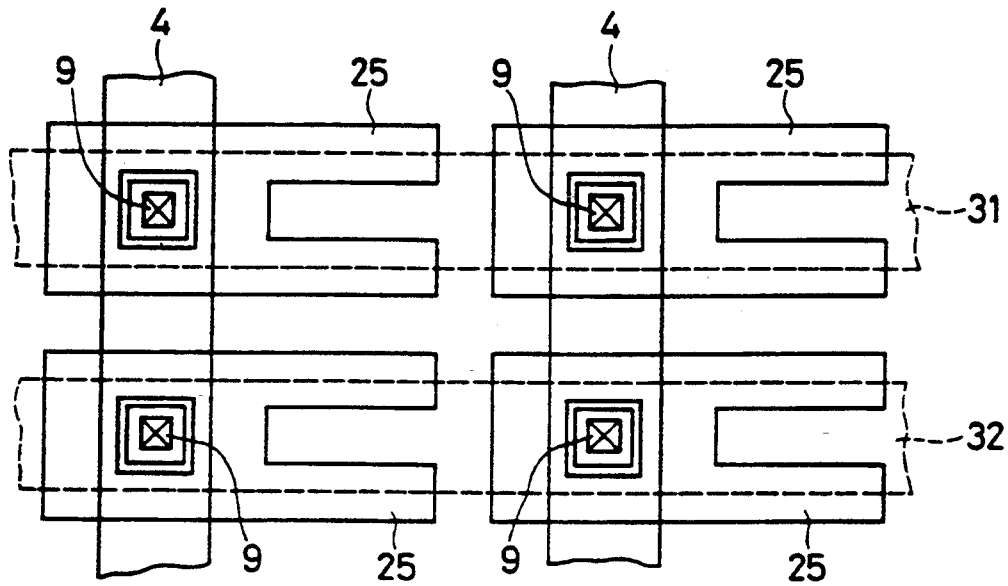

When pairs of such memory cells are to be brought into a plurality of arrays, they may be arranged as shown in FIG. 63. While this embodiment is of the folded bit line arrangement, an embodiment of the present invention having the open bit line arrangement is shown in FIG. 72. Since the open bit line arrangement may be half in the arrayal number of the word lines 4 as compared with the foled bit line arrangement, it is advantageous when only this point is noticed. However, it has the disadvnatage that noise hampering the normal operation of the circuit is relatively great.

In the present embodiment, after the desired part of the SOI portion on the whole surface has been single-crystallized, the unnecessary part has been removed. However, it can be similarly performed that polycrystalline Si is deposited on the whole surface, that the unnecessary part is previously removed, and that the desired part is thereafter single-crystallized by the foregoing laser annealing or the like.

Figure 73:
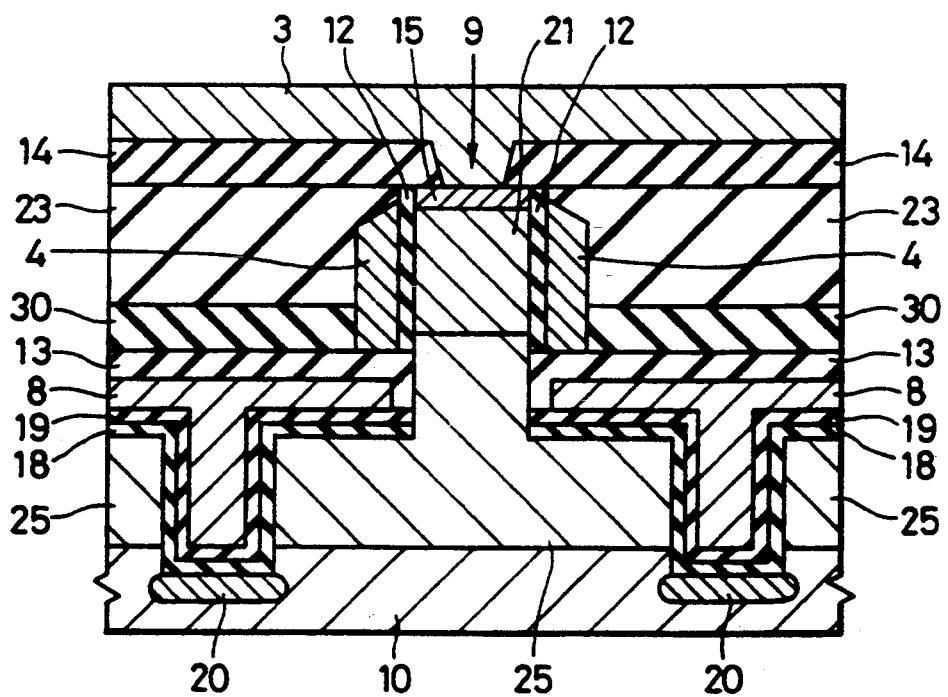

The present embodiment has employed the method in which the unnecessary polycrystalline Si other than the part to become the word line 4 is removed, but there is a method in which the unnecessary portion is partially changed into an oxide film as in another embodiment of the present invention to be described below. The polycrystalline Si of the word line 4 (serving also as the gate of the switching transistor) is deposited on the whole surface, whereupon an $Si_3N_4$ film is selectively deposited on that part of the polycrystalline Si which is to be left. Thereafter, wet oxidization at 800°–1100° C. is performed, and the $Si_3N_4$ film is removed. Then, a polycrystalline Si oxide film 30 is obtained as shown in FIG. 73.

Since the present embodiment changes the unnecessary polycrystalline Si into the oxide film, it involves a smaller step or level difference than in the case of removing the unnecessary polycrystalline Si, and it is advantageous for the formation of various films to be deposited on the polycrystalline Si.

The embodiments of the present invention thus far described have exemplified the use of the Si single-crystal substrate 10 which is usually 300–500 μm thick. However, when an SOS (Si-On-Sapphire or Si-On-Spinel) substrate is employed as in another embodiment shown in FIG. 74, the capacitor electrode of the n+-type layer 25 can be formed on an insulating substrate 31. This is convenient in that, when the bottom of the recess 17 reaches the surface of the insulating substrate 31, the adjacent capacitor electrodes 25 can be electrically isolated automatically. Charges attributed to α-rays inciding in this case are created within the capacitor electrode being the n+-type layer 25. Since, however, they are electron-hole pairs, they are electrically neutral and hardly form noise. Moreover, owing to the n+-type layer, the created electron-hole pairs are extinguished fast.

Any of the embodiments of the present invention described above is the memory cell including the capacitor I which has the capacitor electrode 25 and which is constructed of the (plate 8)—(capacitor $Si_3N_4$ film 19 + capacitor $SiO_2$ film 18) + (capacitor electrode 25). Accordingly, the potential of the plate 8 can fundamentally be determined at will, but the ground potential is convenient in point of noise.

Meanwhile, the capacitor 1 can also be constructed of a MOS (Metal-Oxide-Semiconductor) capacitor which utilizes the so-called inversion layer. That is, the capacitor electrode 25 may be removed from the structure of FIG. 70, FIG. 73 or FIG. 74 and replaced with the p-type Si substrate 10. By way of example, FIG. 75 shows another embodiment of the present invention in which the MOS capacitor is applied to the structure of FIG. 70.

Figure 76:
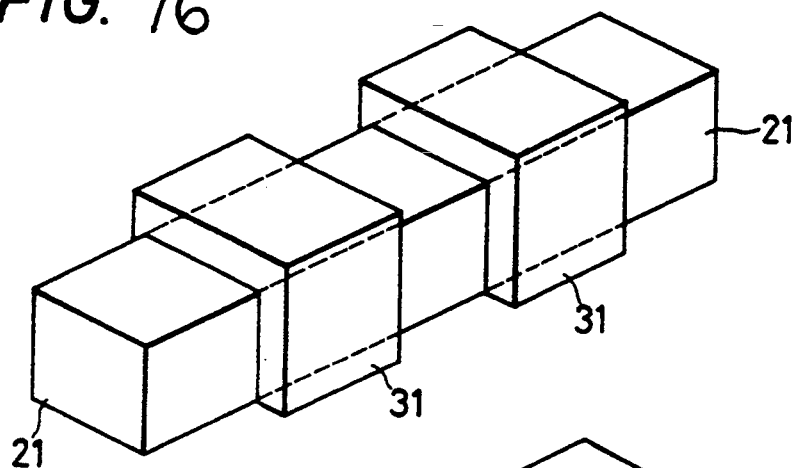
Figure 77:
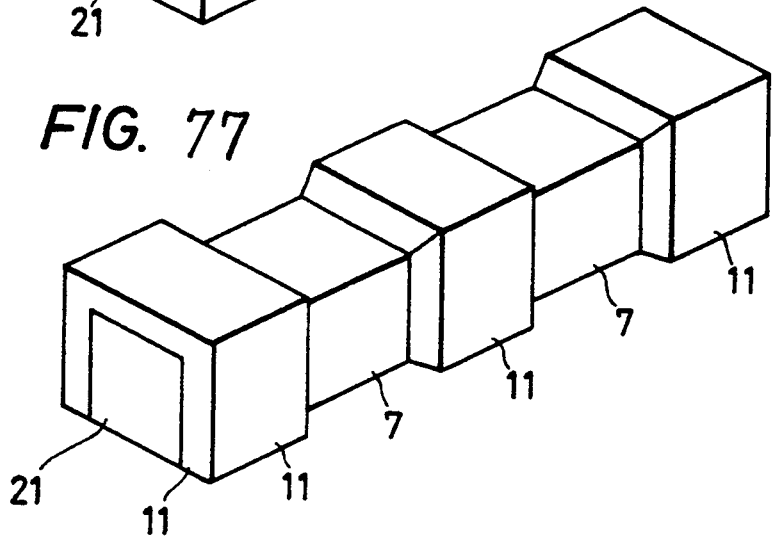
Figure 78:
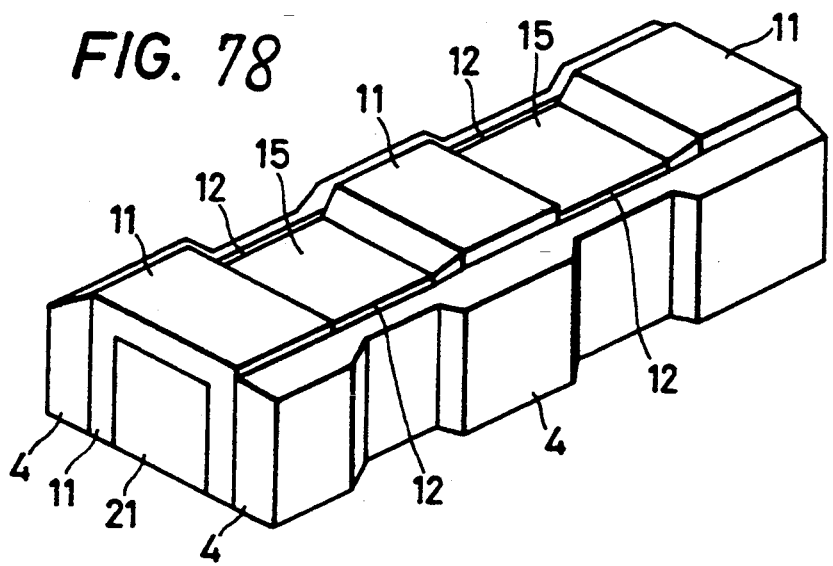

While, in any of the embodiments of the present invention thus far described, the protrusive Si portions 21 have been disposed so as to be spaced for the respective memory cells, they can be united in a number of two or more. As illustrated in FIG. 76, a protrusive Si portion 21 in the shape of a beam is formed, whereupon $Si_3N_4$ films 31 for LOCOS (LOCal Oxidation of Silicon) are selectively deposited so as to stride over the beam. Thereafter, as illustrated in FIG. 77, field oxide films 11 are formed by wet oxidization at 900°–1100° C., and the $Si_3N_4$ films 31 are removed. Then, the protrusive Si portions are spacedly obtained. In the figure, an example in which the three divided Si portions are formed is illustrated. Those parts of the beam on which the $Si_3N_4$ films 31 have been deposited will form transistors later as active regions 7. Ordinarily, with the LOCOS process, the regions on which the $Si_3N_4$ films 31 are not deposited are doped with channel stoppers of boron or the like by the ion implantation, the BN diffusion process or the like.

Thereafter, gate oxide films 12 which are 10–50 nm thick are formed by oxidization which employs dry oxygen at 800°–1150° C. containing 1–5% of HCl. Subsequently, in order to attain a desired threshold voltage $V_{TH}$, boron is ion-implanted in a necessary amount. Subsequently, a single layer of polycrystalline Si, silicide ($Mo_2Si$, $Ta_2O_5$) or the like or a stacked film of such materials, a refractory metal such as W or Mo, or the like is deposited on the whole structure, and the whole surface is etched by directive dry etching. Then, word lines 4 can be deposited along the beam of the protrusive Si portion 21 and on the side surfaces thereof. According to this embodiment of the present invention, the continuous word lines 4 can be formed by the self-alignment process, so that the manufacturing method is simpler than in the case of forming the word line connecting portions 45 by photolithography as illustrated in FIG. 69. By the way, W or the like deposited by the sputtering does not exhibit a good state of deposition on the side surfaces. Therefore, polycrystalline Si is once deposited on the side surfaces, and W is deposited thereon with $WF_6$ and $H_2$ gases by CVD. Then, the W is deposited on only the polycrystalline Si, and word lines 4 of low resistivity and good quality can be formed. Thereafter, when As or P is accelerated to 60–120 keV and is ion-implanted to the extent of $5 \times 10^{15}$–$2 \times 10^{16}/cm^2$, n+-type source-drain junction layers 15 are formed on the parts on which the field oxide films 11 are not deposited. Besides, when the field oxide films 11 formed by the LOCOS process are sufficiently thick the protrusive Si portions 21 can be changed into $SiO_2$ entirely in the widthwise direction, so that switching transistors 2 can be spacedly formed without resorting to etching. According to this measure, the adjacent switching transistors can be isolated by the field oxide film of $SiO_2$, and hence, capacitances parasitic to each other decrease, which is advantageous for a circuit operation.

Figure 79:
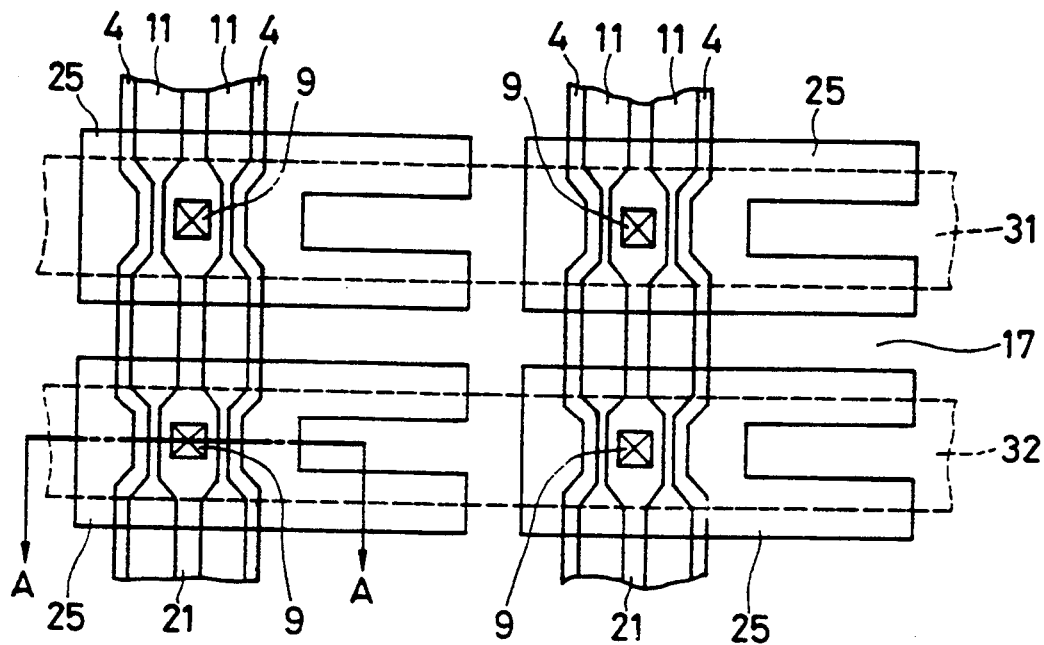

A plan view of a memory cell array employing an embodiment of the present invention is shown in FIG. 79. For the sake of convenience, the open bit line arrangement is used. A section AA is the same as shown in FIG. 64.

Figure 80:
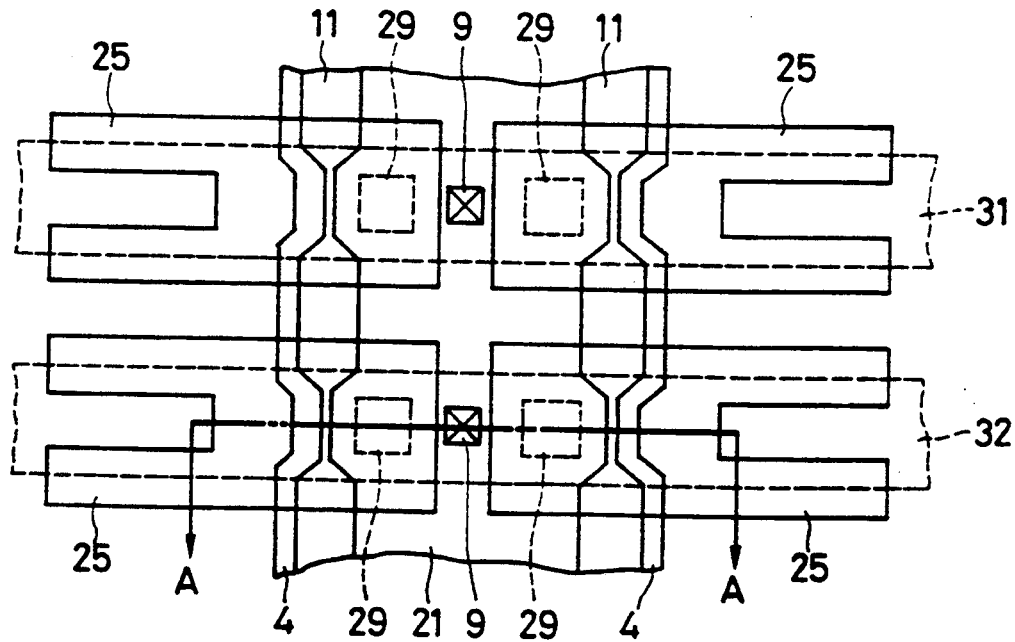
Figure 81:
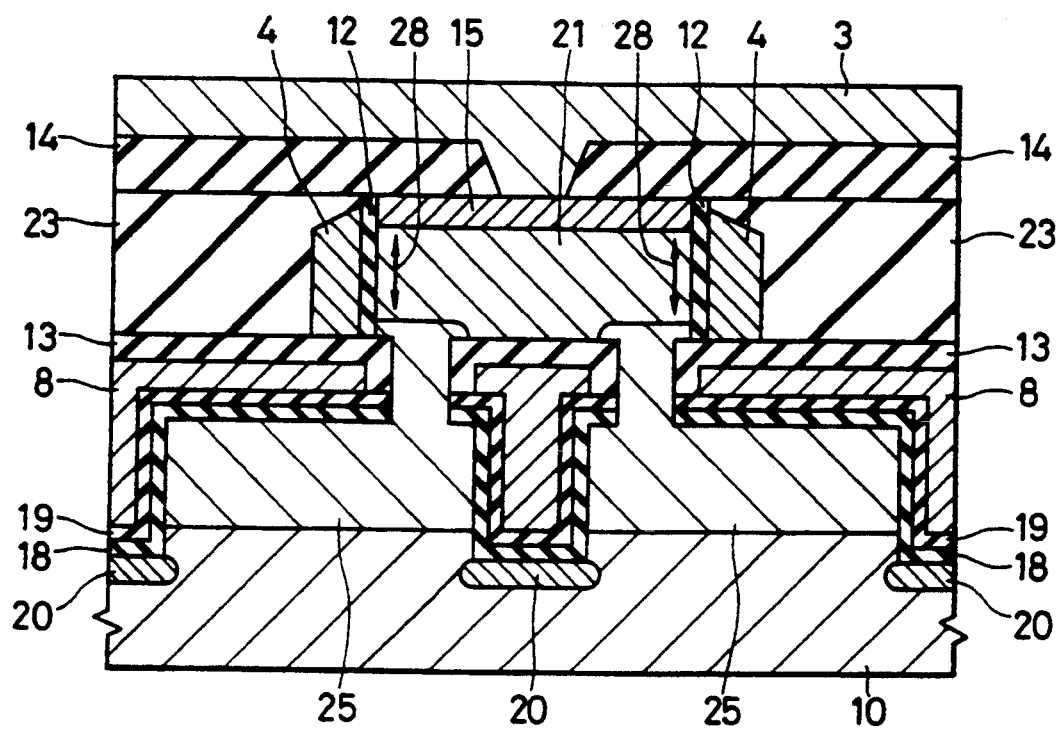

Any embodiment of the present invention described above has one protrusion in one memory cell. Alternatively, it has the protrusive Si portions continuous in the direction of the word line 4 as illustrated in FIG. 79. When the present invention is further expanded, a protrusive Si portion which strides over two cells in the direction of a bit line 3 is employed, whereby a still higher density can be attained. FIG. 80 shows a plan view of such measure. Right and left memory cells are connected by the protrusive Si portion 21 through contact holes 29 to a substrate. In the direction of the word line 4, the protrusive Si portions are continued as in the embodiment shown in FIG. 79. Thus, one contact hole 9 can be shared by the two, right and left memory cells, which is advantageous for attaining a still higher density. A section AA indicated in FIG. 80 is shown in FIG. 81. Switching transistor channel portions 28 are comprised at the right and left of the united protrusive Si portion 21, and a signal is written into or read out from the bit line 3 which is electrically connected to a united diffused layer 15.

Figure 74:
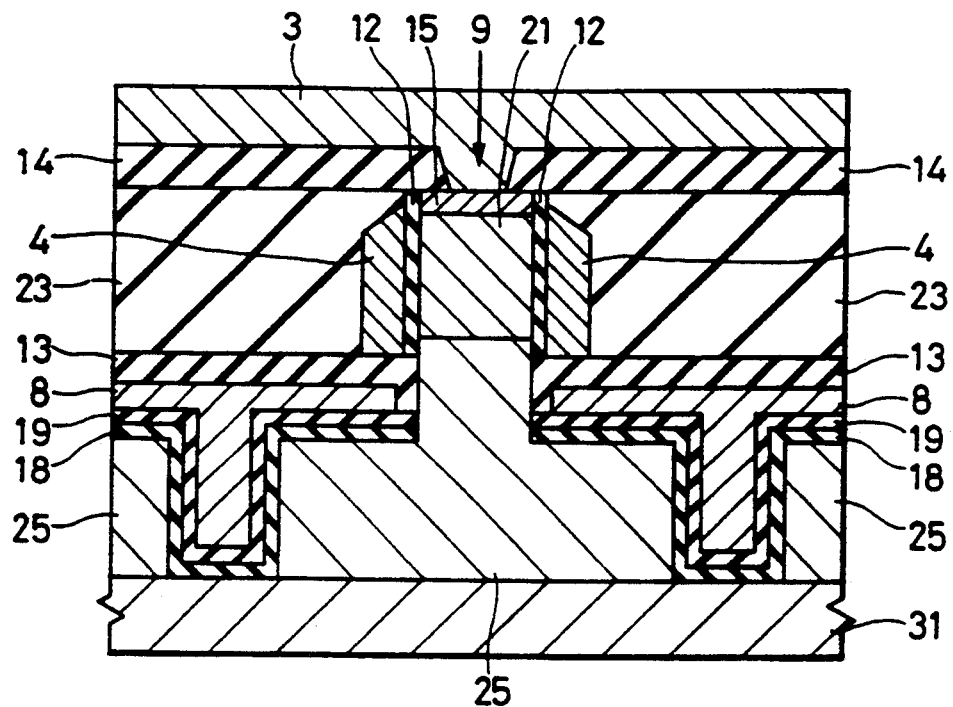
Figure 75:
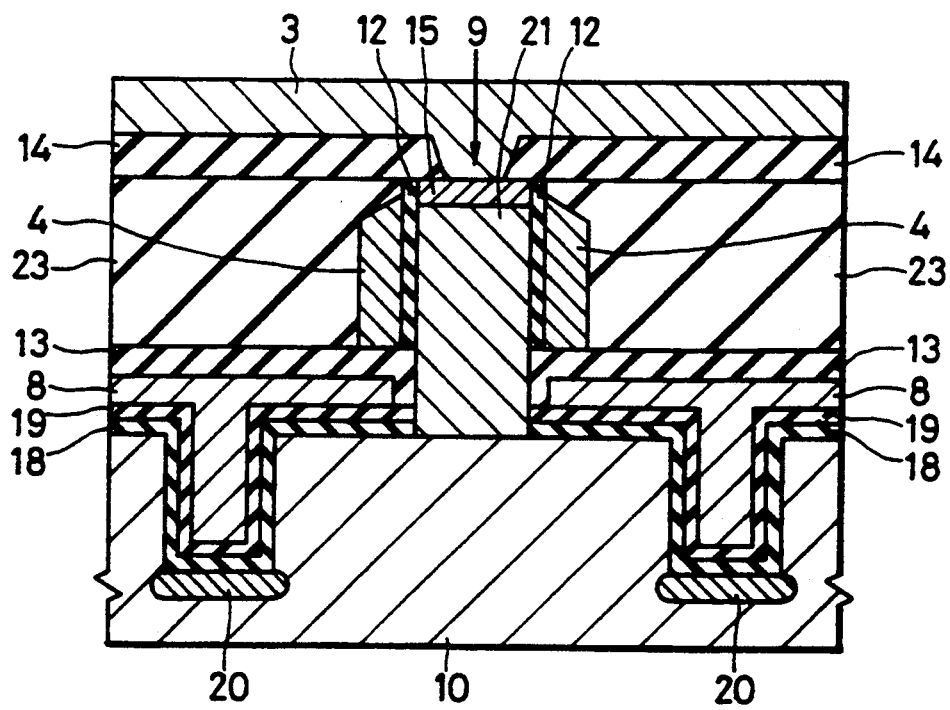

While the present embodiment has employed the structure shown in FIG. 70, it is also possible to apply the structure shown in FIG. 73 in which the polycrystalline Si is oxidized by LOCOS, the structure shown in FIG. 74 in which the insulating substrate 31 is employed, the method illustrated in FIG. 75 in which the MOS inversion layer is utilized for the capacitor, etc.

Figure 82:
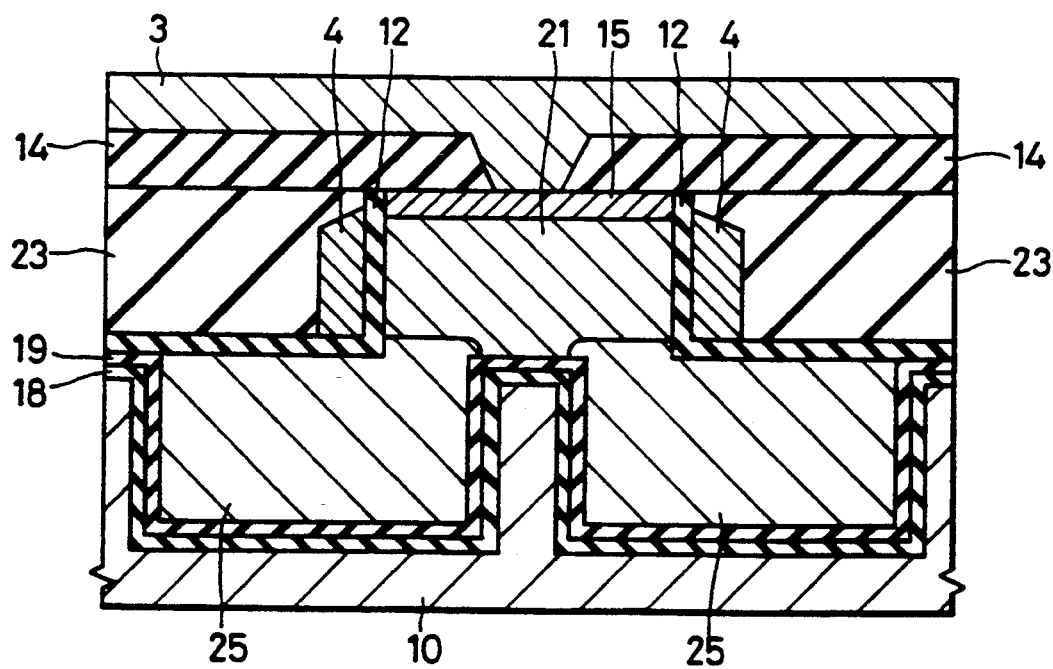

In the embodiments of the present invention thus far described, any capacitor electrode 25 has been exemplified as being a part of the Si substrate. However, there is also a structure wherein, as in another embodiment of the present invention shown in FIG. 82, capacitor electrodes 25 are buried in the recess of an n-type Si substrate 10 through a capacitor $SiO_2$ film 18 as well as a capacitor $Si_3N_4$ film 19. Since the Si substrate 10 constructs a capacitor along with the capacitor electrode 25 being an n+-type layer, it is rendered the n-type so that a depletion layer may not be formed in the surface of the Si substrate 10 opposing to the capacitor electrode 25 even when this capacitor electrode comes to have a positive potential. Accordingly, when the Si substrate 10 is rendered the p-type, the impurity concentration thereof may be made very high so as not to form a depletion layer, or only the Si substrate surface 10 to which the capacitor electrode 25 opposes may be rendered the n-type.

Figure 83:
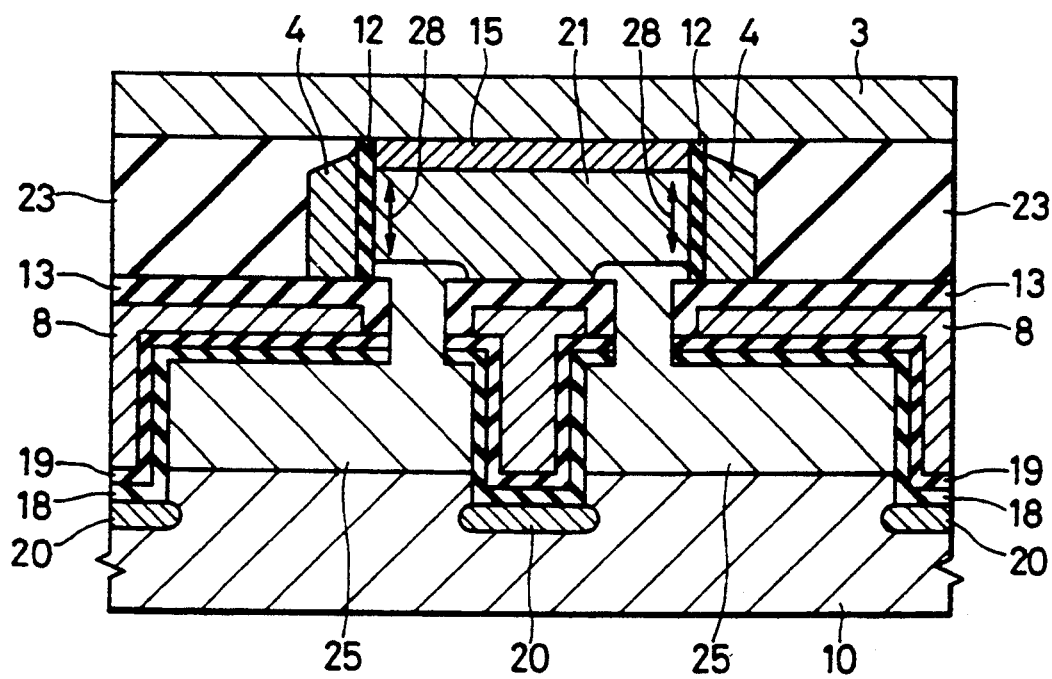

In any of the embodiments of the present invention described above, the contact hole 9 has been formed in the second inter-layer insulator film 14, and the bit line 3 has been formed therethrough. On the other hand, the n+-type diffused layer 15 is entirely surrounded with the filling insulator film 23. As shown in FIG. 83, therefore, when the bit line 3 is selectively formed directly without depositing the second inter-layer insulator film 14, it can be electrically connected to the diffused layer 15 in self-alignment fashion. In addition, when the bit line 3 is made of polycrystalline Si, the diffused layer 15 can be formed by diffusing P or As from above the polycrystalline Si. Since the present embodiment can omit the step of forming the contact holes 9 and the step of forming the second inter-layer insulator film, it is advantageous for simplifying the manufacturing method and enhancing the packaging density The present structure is applicable to all of the various embodiments of the present invention.

Figure 84:
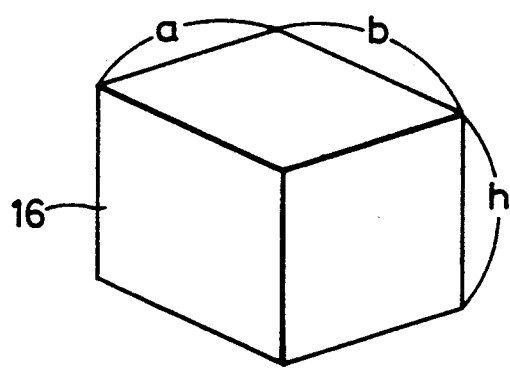

Although the capacitor electrode of the memory cell stated in the present embodiment has been concave, the simplest shape is a rectangular parallelepiped shown in FIG. 84. Let a×b denote the upper surface of this rectangular parallelepiped, and h denote the depth thereof. The area of the capacitor region 16 of the prior-art planar memory cell shown in FIG. 4 is a×b. In contrast, in the embodiment of the present invention, the side surfaces can also be utilized, and hence, the area of the capacitor region totals a b+2 h (a+b) Assuming a=b=5 $\mu$m and h=2 $\mu$m, the capacitor region of the prior-art memory cell is $A_{CONV}$=25 $\mu m^2$, whereas the capacitor region of the memory cell of the present invention becomes A=65 $\mu m^2$ (=5×5+2×2 (5+5)). Thus, the capacitor area which is several times larger can be readily attained without expanding the plane area, This also indicates that, when the capacitor areas are equal, the present invention can reduce the plane area, and the invention can be said very advantageous for enlarging the scale of a memory.

Figure 85:
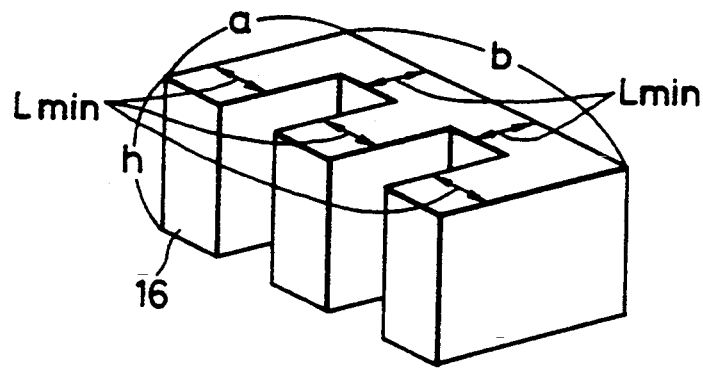

In the embodiments of the present invention described above, the capacitor of the memory cell has fundamentally been the rectangular parallelepiped shown in FIG. 84. The subject matter of the present invention is to utilize the side walls of the recess 17 dug in the Si substrate. Therefore, when the rectangular parallelepiped is formed with indents as shown in FIG. 85, the capacitor area A can be further increased. The minimum dimension of processing is denoted by $L_{min}$, which is assumed 1 $\mu$m. When the values a, b add h are examples indicated in FIG. 85, the upper surface becomes 17 $\mu m^2$, the side surfaces become 72 $\mu m^2$, and the total capacitor area A becomes A=89 $\mu m^2$. This embodiment has attained the still larger capacitor area than in the embodiment shown in FIG. 84.

Figure 86:
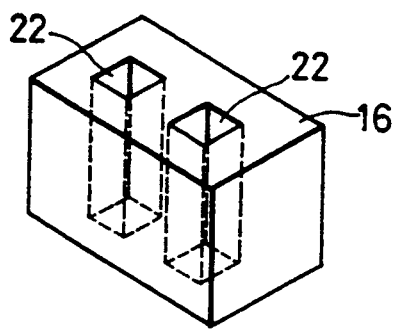
Figure 87:
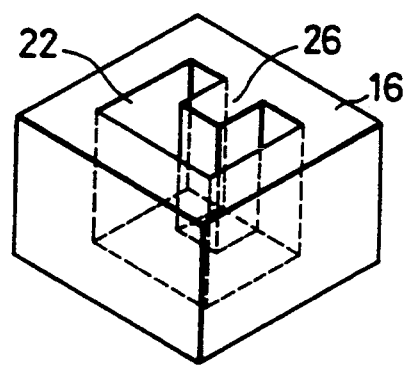
Figure 88:
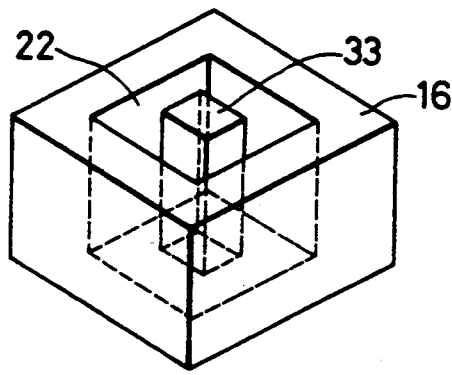

In this manner, when the comb-like indents are employed in order to fully exploit the subject matter of the present invention, the effect is more enhanced. Apart from the comb-like indents, it is also effective to provide a new groove in the rectangular parallelepiped shown in FIG. 84. FIGS. 86-88 show further embodiments of the present invention. FIG. 86 illustrates a case where one or two slots 22 are provided; FIG. 87 a case where one hole is provided in which an inward protrusion 26 is formed; and FIG. 88 a case where an island-like strut 33 is formed in a hole. In any case, the dimensions of various parts may be set at the minimum dimension which can be processed.

The present invention thus far described has the skeleton that the switching transistor 2 is formed perpendicularly to the Si substrate 10. Accordingly, the technology of forming the protrusive portion 21 of single-crystal Si of high quality becomes a key. In particular, the SOI (Silicon On Insulator) technology in which the single-crystal Si is grown on an insulator film typically of $SiO_2$, $Si_3N_4$, $Al_2O_3$, spinel or the like is important. The SOI technology well suited for application to the present invention will now be described.

Figure 89:
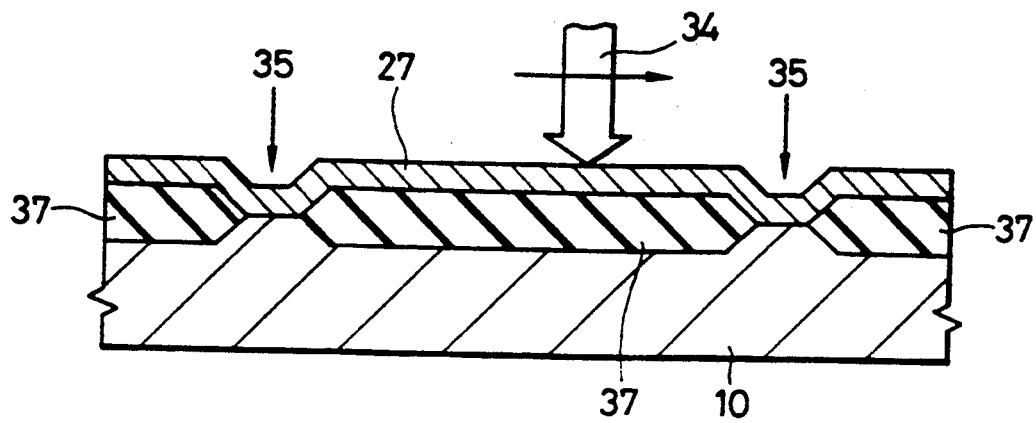

In general, polycrystalline Si or an amorphous Si film is deposited on the aforementioned insulator film, and the Si film is once melted by a laser, an electron beam or heat. As the melted film solidifies, Si is single-crystallized. However, when the underlying insulator film is not a single crystal, the orientations of Si to solidify are difficult of settling in both the vertical direction and the horizontal direction. Meanwhile, as shown in FIG. 89, underlying insulator films 37 typically made of $SiO_2$ are selectively deposited on a Si substrate 10. Parts where the underlying insulator films 37 are not deposited are seed crystal portions 35 where the Si substrate 10 is exposed. An SOI layer 27 which is a single-crystal layer having the same orientation as that of the surface of the Si substrate 10 is grown from the seed crystal portions 35, while following up the scanning of a beam 34. On this occasion, as the scanning position becomes far from the seed crystal portion 35, the single crystal becomes difficult to grow continuously. Accordingly, when an area in which the single crystal grows satisfactorily is exceeded, the seed crystal portion 35 needs to be formed again.

Figure 90:
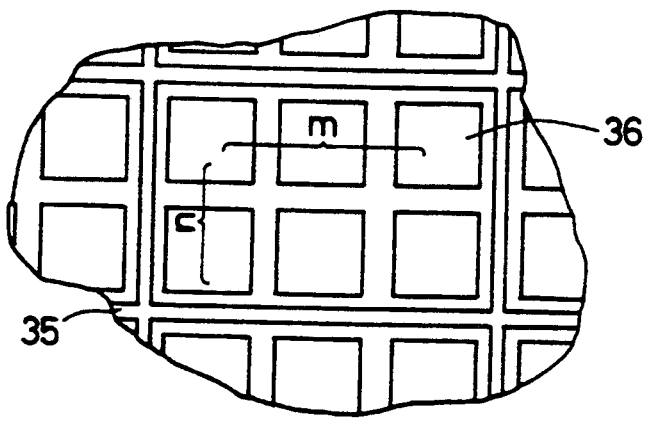
Figure 91:
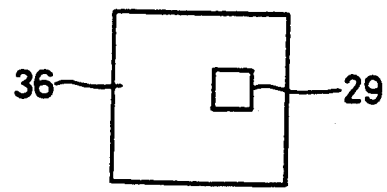

As an embodiment of the present invention is shown in FIG. 90, therefore, the seed crystal portion 35 surrounding the matrix of m×n (in the figure, 3×3) unit memory cells 36 may be formed so as to render the entire internal part the same single crystal as that of the Si substrate 10 from this portion. In this case, a substrate contact hole 29 which is a connection portion with a capacitor electrode 25 may be provided in at least one place within the memory cell 36 as shown in FIG. 91. As the value m×n is greater, the number of the unnecessary parts of the seed crystal portions 35 may be smaller. 1×1 can be set as the smallest value, that is, the seed crystal portion 35 surrounding each memory cell can be provided. This aspect differs depending upon the SOI forming method.

In the embodiments of the present invention thus far described, the two-layer film consisting of the $SiO_2$ film 18 and the $Si_3N_4$ film 19 has been employed as the capacitor insulator film. However, when the upper surface of the $Si_3N_4$ film is partly oxidized to form an $SiO_2$ film, a three-layer film of $SiO_2/Si_3N_4/SiO_2$ can be formed. This film is especially high in the dielectric breakdown voltage and good in quality, and is applicable to all the embodiments of the present invention. Besides, other insulator films, for example, high permittivity films of $Ta_2O_5$ $TiO_2$ and $Al_2O_3$ can increase the capacitance per unit area and are advantageous for the microminiaturization of memory cells.

The foregoing embodiments have been selected from among processes of many choices. Accordingly, each step has various substitute measures. The present invention, however, consistently has the basic concept that the side walls of a recess formed in a substrate are utilized as a part of a capacitor. For example, the foregoing method of forming the substrate cotact hole 29 can be adopted because the upper layer of the capacitor insulator film is formed of the $Si_3N_4$ film 19, which is not oxidized during the oxidization of the place S of polycrystalline Si.

Figure 92:
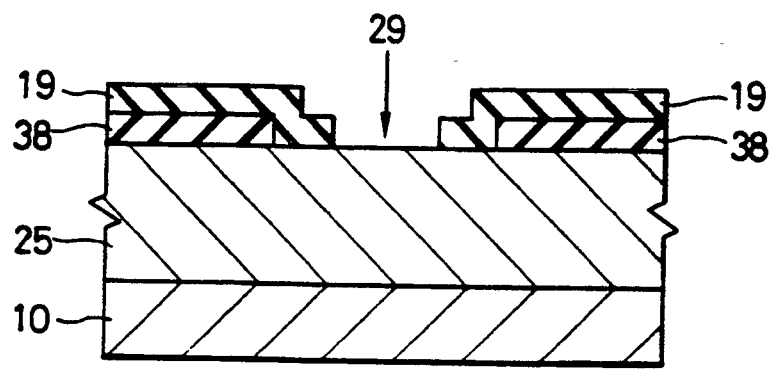

When, as illustrated in FIG. 92 by way of example, the capacitor insulator film is an oxidation non-impermeable film 38 which is made of $Ta_2O_5$ or NbO and which cannot endure a treatment at 800°–1000° C. in an oxygen atmosphere, the first inter-layer insulator film cannot be formed by oxidizing the polycrystalline Si plate 8. Therefore, an oxidation impermeable first inter-layer insulator film 39 which is represented by an $Si_3N_4$ film is deposited so as to cover the end part of the oxidation non-impermeable film 38 as shown in FIG. 92. At this time, the substrate contact hole 29 requires pattern alignment separately from the holes of the plate 8 and the oxidation non-impermeable insulator film, and alignment margins are required between these holes. The same method can be adopted even for the oxidation permeable capacitor insulator film.

The present invention has been so explained that the word line 4 forms the gates continuous within the memory cell array. However, there is also a method in which one or more transfer gates of polycrystalline Si within memory cells are connected by the word line 4 of Al or the like through one or more contact holes. Thus, the switching time of a high-speed memory can be attained owing to the reliability of the polycrystalline Si gates having heretofore produced many actual results and the low resistivity of the Al or the like.

As stated in the introductory part, although the present invention has been explained by the use of the n-channel type MOS transistors, the p-channel type can be achieved by reversing the conductivity types of all the impurities. By way of example, P or As may be replaced with B or Al, and B with P, As or Sb.

In the above, the present invention has been described in conjunction with the detailed embodiments. With the present invention in which the switching transistors are formed perpendicularly to the substrate plane, the increase of the capacitor capacitance $C_S$ which is ten times or more higher than in the prior-art memory cell can be expected in the same plane area. In actuality, the shape of the recess is not composed of perfectly erect planes, but it is somewhat rounded. Moreover, even when the design shape is a regular square, the actual shape sometimes becomes circular on account of the degradation of the resolution of lithography in a very fine part. Even in such cases, decrease in the capacitance $C_S$ amounts to 10–20%.

When the capacitance $C_S$ has increased by 10%, the malfunctions of a dynamic memory ascribable to α-rays are improved one order or more in many cases. Therefore, the increase of the capacitance $C_S$ which is two times or more, not only enhances the reliability of the memory of a specified scale, but also makes it possible to realize a memory of a still larger scale.

While the present invention concerns memory cells, an actual dynamic RAM requires a peripheral circuit besides a memory array in which the memory cells are arranged in the shape of a matrix. The peripheral circuit is constructed of transistors, resistors, capacitors etc. Particularly the transistors of the peripheral circuit may be the vertical transistors of the present invention, or conventional lateral transistors can be formed on the surface of the Si substrate 10 or the SOI layer 21. The part in which the transistor of the peripheral circuit is formed, depends upon the circuit design and cannot be restricted.

Figure 93:
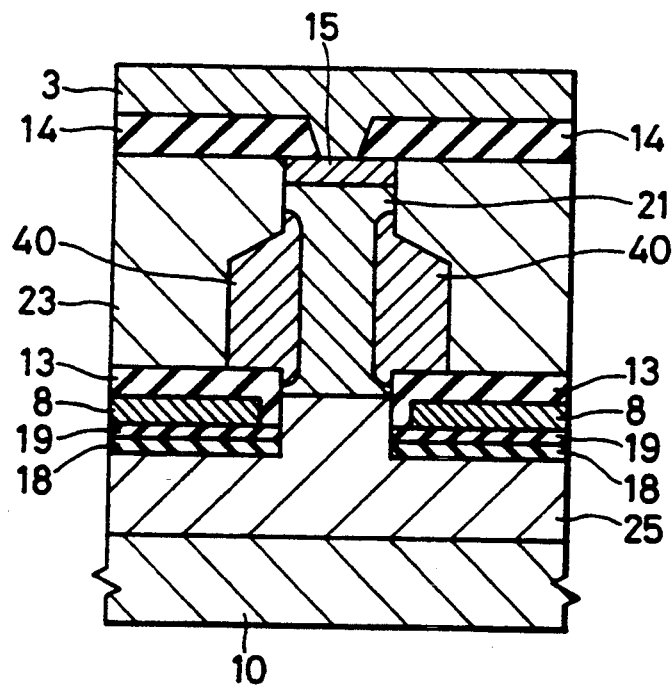

The switching transistor in the present invention has been the MOS type which is one sort of the so-called MIS type. In principle, however, any device having the switching characteristic can be employed. Specifically, another embodiment of the present invention shown in FIG. 93 corresponds to a case of employing a junction type FET (field effect transistor). It includes an $n^+$-type capacitor electrode, a diffused layer 15 as well as an n-type protrusive Si portion 21, and a junction gate 40 which forms a p-n junction between them, and it is applicable to all the embodiments and measures explained in and before. FIG. 92 In the application, the MOS type transistors may be replaced with the junction type transistors. In order to avoid complicacy, FIG. 93 shows the portion of the switching transistor 2 and a part of the capacitor electrode 25. Naturally, since the transistors in FIGS. 1–3 are denoted by the symbols of MIS type transistors, they need to be denoted by the symbols of junction type transistors instead.

Figure 94:
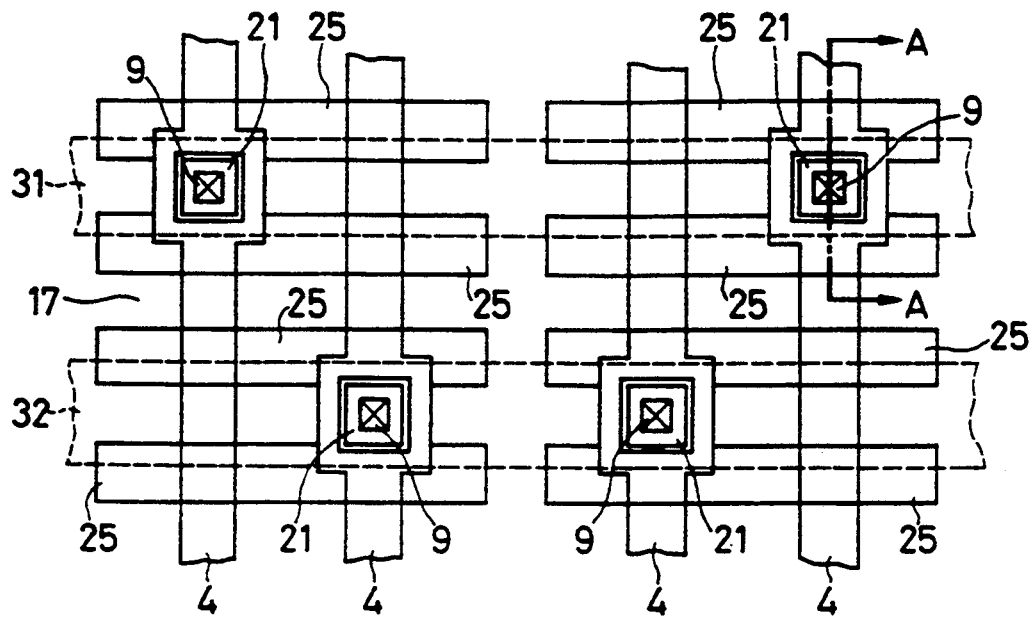

Further, another embodiment of the present invention will be described. FIG. 94 shows a plan view of this embodiment. When compared with the prior-art memory cells shown in FIG. 4, the embodiment differs in that all capacitor electrodes 25 are formed so as to cover the whole front surface of a Si substrate and the vicinity thereof and that the channel portions of switching transistors 2 are formed by the use of the side walls of protrusive Si portions 21 which are stacked on the capacitor electrodes 25. Thus, as compared with the capacitor region 16 of the prior-art memory cell which has hitherto occupied only 30–40% of the whole plane as shown in FIG. 4, that of the embodiment is sharply enhanced and can occupy approximately 80–90% of the whole plane. Since, as described later, the capacitor region 25 utilizes the side wall part of a recess 17 dug in the Si substrate, the area of the capacitor electrode can be expanded independently of the plane area. It is intended to increase the side wall area that the capacitor electrodes 25 numbering two are formed in FIG. 94.

Figure 95:
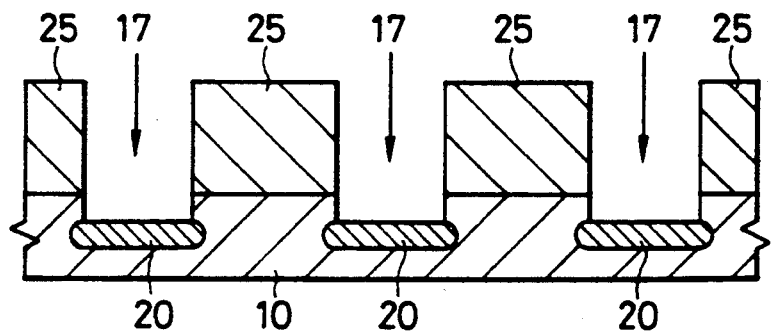

Now, the manufacturing process of the present invention will be described in detail. First, a structure shown in FIG. 95 is produced by steps similar to those in FIG. 65.

Figure 96:
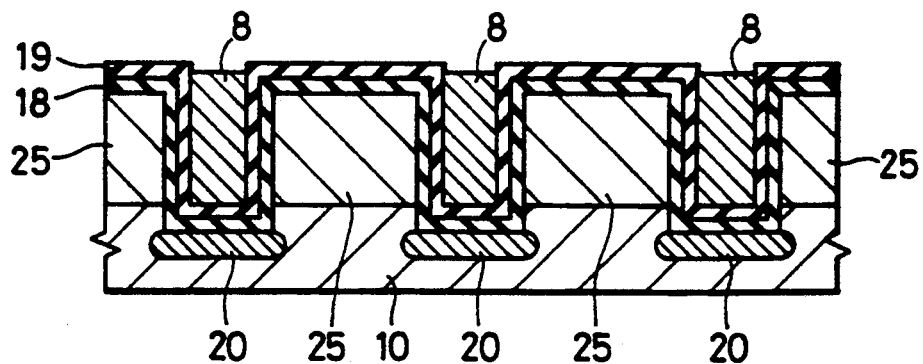

Thereafter, likewise to the steps in FIG. 66, polycrystalline Si is deposited, and the plasma etching of the polycrystalline Si is performed on the whole surface, whereby plates 8 of polycrystalline Si are left in only the parts of the recesses 17 as shown in FIG. 96. In this case, the plate 8 is not deposited on the corner of the upper end part of the recess. Therefore, the drawback is not involved that the dielectric breakdown voltage degrades due to the concentration of electric fields in the part of the acute angle. It is not required, either, to round the corner by employing isotropic etching such as wet etching, before the recess is formed deep.

Figure 97:
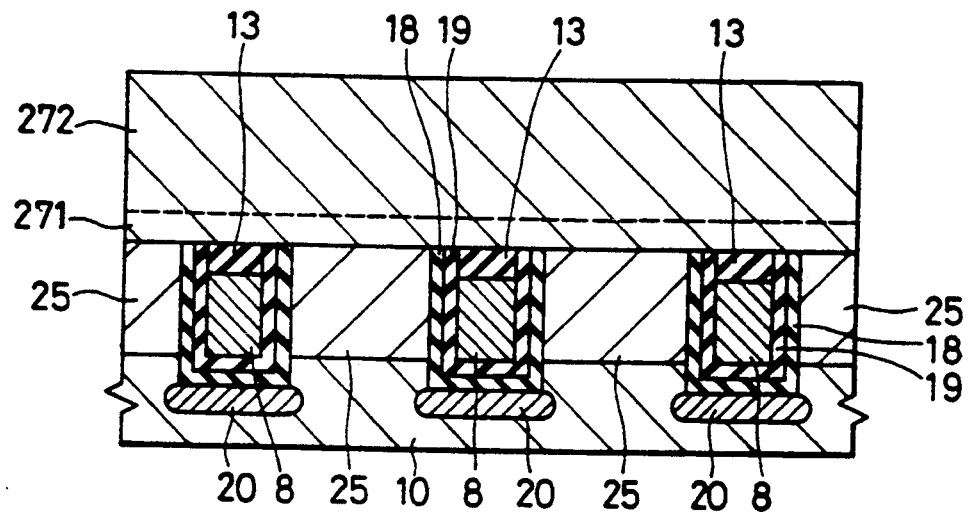

Thereafter, as shown in FIG. 97, the polycrystalline Si is oxidized to form a first inter-layer oxide film 13 which is 100–400 nm thick. On this occasion, the $Si_3N_4$ film 19 is hardly oxidized. Subsequently, using the thick first inter-layer oxide film 13 as a mask, the Si$_3$N$_4$ film 19 and the thin SiO$_2$ film 18 are etched and removed. Likewise to the steps in FIG. 10, an SOI (Si-On-Insulator) layer 27 (271, 272) is formed on the resultant structure.

Figure 98:
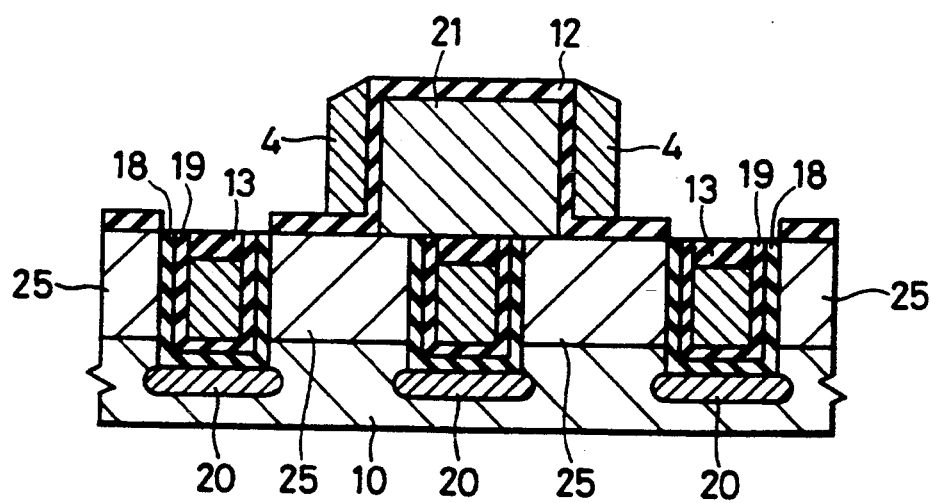

Thereafter, as shown in FIG. 98, the unnecessary SOI layer is removed by etching the structure with the well-known photolithography or the like so as to leave at least the pillar-like Si protrusion 21 which is to form the switching transistor.

The description of the present embodiment has referred to the case where the Si protrusion 21 is vertically formed as shown in FIG. 98. Thereafter, a gate oxide film 12 is formed by the well-known thermal oxidization or the like, boron is ion-implanted in an amount required for attaining a desired threshold voltage V$_{TH}$, and a word line 4 is selectively deposited.

The word line 4 which serves as the gate of the switching transistor 2 and which is typically made of polycrystalline Si, or W or Mo, or such silicide as WSi$_2$, MoSi$_2$ or TiSi$_2$, is deposited on the side surfaces of the Si protrusion 21 by steps similar to those in FIG. 68.

Figure 99:
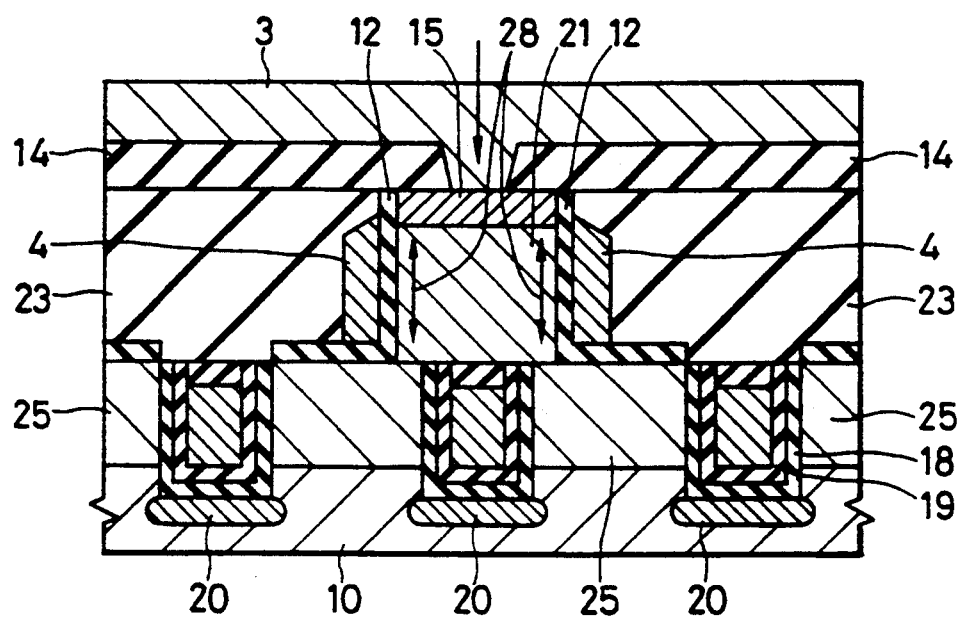

Thereafter, as shown in FIG. 99, likewise to the steps in FIG. 70, a filling insulator film 23 typically made of SiO$_2$ containing or not containing P is deposited by the bias sputtering process, the CVD process or the like so that it may become substantially even with the upper surface of the Si protrusion 21.

Thereafter, As or P is accelerated to 60–120 keV and ion-implanted by approximately $5 \times 10^{15}$–$2 \times 10^{16}$ atoms/cm$^2$, whereby a source-drain junction layer 15 being an n$^+$-type layer can be formed. Further, a second inter-layer insulator film 14 which is represented by a CVD SiO$_2$ film containing P by 4–10 mol-% (shortly termed "CVD PSG") is deposited to a thickness of 300–1000 nm, and it is annealed at 900°–1000° C. so as to be densified. Subsequently, an electrode contact hole 9 reaching the n$^+$-type layer 15 is formed, and an electrode 3 typically made of Al is selectively deposited. In this way, the one-transistor type dynamic memory cell in which the side walls of the etched recess 17 are principally used for the capacitor can be constructed.

When pairs of such memory cells are to be brought into a plurality of arrays, they may be arranged as shown in FIG. 94. This embodiment is of the folded bit line arrangement. Since the open bit line arrangement may be half in the arrayal number of the word lines 4 as compared with the folded bit line arrangement, an embodiment of the present invention having the open bit line arrangement is advantageous when only this point is noticed. However, it has the disadvantage that noise hampering the normal operation of the circuit is relatively great.

FIG. 99 shows the section AA of the plane pattern depicted in FIG. 94. A plate 8 is buried in the recess 17 duo in the Si substrate 10, through a capacitor SiO$_2$ film 18 as well as a capacitor Si$_3$N$_4$ film 19. A part of the plate is removed, and the Si protrusion 21 is disposed on the capacitor electrode 25 of the n$^+$-type layer through the removed part. A word line 4 serving as a gate is formed along the protrusion 21 through a gate oxide film 12. A bit line 3 is electrically connected to an n$^+$-type diffused layer 15 through a contact hole 9. Thus, the switching transistor 2 can use the side walls of the Si protrusion 21 as the channel portion 28 thereof.

Figure 100:
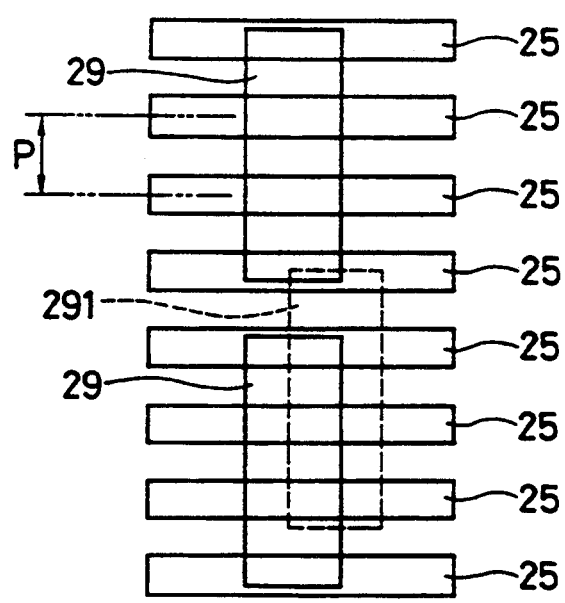

The description of the present invention has referred to the case where, as illustrated in FIGS. 94 and 98, the two capacitor electrodes 25 electrically isolated from each other are coupled by the single switching transistor. However, when the capacitor electrodes 25 are coupled in a number of three or more, the capacitor capacitance per unit plane area can be further increased. As shown by one embodiment of the present invention in FIG. 100, four capacitor electrodes 25 are coupled by a capacitor electrode contact portion 29 which leads to the Si strut 21 constituting the switching transistor 2. This embodiment also has the following subsidiary effect. When the dimensions of the capacitor electrode 25 are as sufficiently small as below several tenths of the dimensions of the electrode contact portion 29 (that is, the pitch P of the capacitor electrodes 25 is sufficiently smaller than that of the contact portions 29), a sufficient mask alignment margin m need not be taken for the capacitor electrodes 25. In other words, in a case where m is greater than P, namely, in a case where the contact portion to be connected to the adjoining capacitor electrode 25 beyond one capacitor electrode 25 is located as a contact portion 291 indicated by a broken line in FIG. 100, four capacitor electrodes 25 are still connected. That is, when the capacitor electrode 25 is made sufficiently smaller than the capacitor electrode contact portion 29, it is almost unnecessary to consider the registration between the capacitor electrodes 25 and the capacitor electrode contact portion 29. This is effective for enhancing the packaging density.

Figure 101:
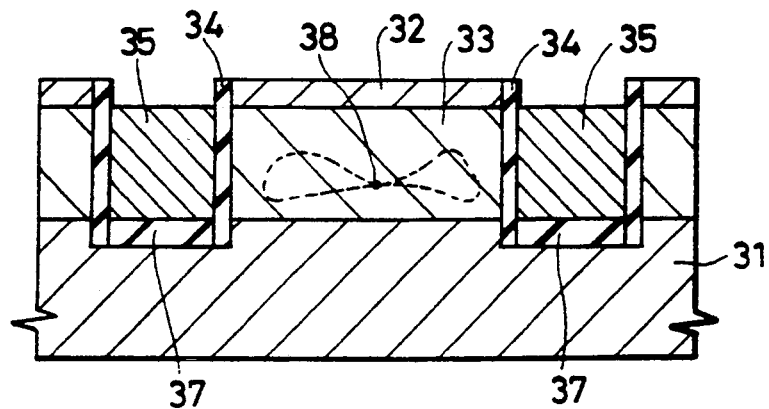

The switching transistor employed in the above device has a problem. It is the size dependency of the drain breakdown voltage. In a case where the height of the side wall is sufficiently greater than the width of the p-type region 23, it may be considered that the conventional planar device (which is fabricated in the plane parallel to the substrate surface) is merely formed vertically. As illustrated in FIG. 101, however, when the ordinary processing is resorted to, the thickness of a depletion layer from the side wall of a p-type region 33 defined by a side wall gate 35 becomes, in general, 1 μm or less, so that a depletion layer extending from an n-type drain 32 touches a depletion layer extending from the side of a source 31 at a nearly central point 38, to cause the situation of punch-through. For this reason, the normal operation of the insulated-gate FET is not effected with such a structure. For achieving the FET operation, it is necessary to precisely form a very fine operating region of at most 1 μm.

However, the transistor of the type which is vertically operated has features attractive in constructing an integrated circuit, such that in spite of minute dimensions, the current capacity (the magnitude of current per unit surface area) can be set larger than in the planar structure, that the mutual conductance is also greater, and that a high speed operation is possible.

The dimensions of elements require flexibility from the viewpoint of circuit design, and it is desired to permit efficient usage wherein an identical device is provided with a plurality of gates which are independently operated to construct, for example, an OR circuit.

When briefly stated, the present invention provides a device preventive of the punch-through in the central part of the device illustrated in FIG. 101, and further provides a measure for controlling structure-sensitive characteristics in the device of the above structure. Concretely, the expedient is attained by controlling a dopant concentration in the active region of a transistor.

Figure 102:
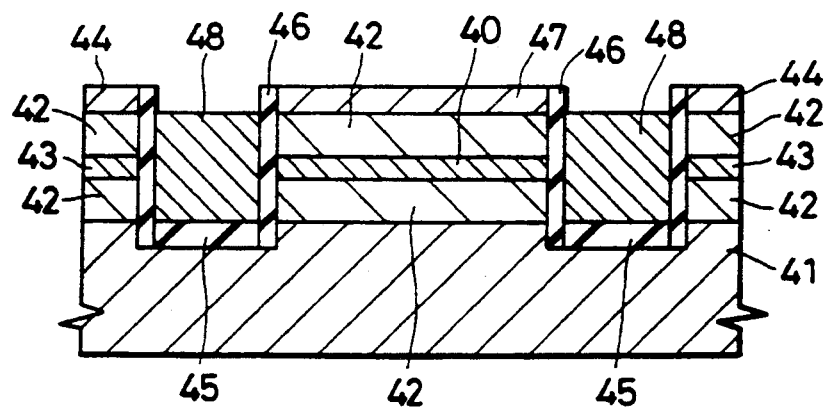

FIG. 102 is a sectional view of an element in the case where the present invention is applied to the structure exemplified in FIG. 101.

Although the element structure of the embodiment is the same as that exemplified in FIG. 101, it differs in that the p-type region is formed therein with a p-type portion 40 of higher concentration. Steps for reaching this structure will be summarized below.

An n+ doped layer 41 was formed in the front surface of a p-type silicon substrate of (100) by selective doping, and a p-type layer 42 having a thickness of 1 μm was formed thereon. Thereafter, B+ ions were implanted at a dose of $1 \times 10^{13}$ cm$^{-2}$ by an implantation voltage of 200 keV, to form a heavily-doped p-type region 43 (40) about the middle of the p-type layer 42, while a heavily-doped n-type layer 44 (47) was provided in the surface of the layer 42 by doping with As. The resulting multi-layered structure was subjected to plasma etching so as to form trenches deep to the extent of reaching the n+ doped layer 41, whereupon SiO$_2$ films were formed at the bottoms and surfaces of the trenches to thicknesses of about 300 nm by unisotropic plasma deposition. At this time, the upper surface of the SiO$_2$ film 45 at the trench bottom was substantially even with that of the n+ doped layer 41. Subsequently, the side walls of the trenches were oxidized to provide gate insulator films 46. After an SiO$_2$ film (not shown) on each heavily-doped n-type region 47 to serve as a drain was formed with a contact hole by lithography, a metal layer was formed by directional evaporation, and gates 48 and drain electrodes (not shown) were formed by utilizing lithography again. A contact to the source region 41 was separately formed though the step was not explained.

The p-type heavily-doped region 40 formed within the p-type region 42 has a peak concentration of about $40 \times 10^{17}$ cm$^{-3}$ and a thickness of about 0.2 μm. Owing to the presence of this barrier layer, a depletion layer which extends from the drain 47 cannot reach the source 41, and a drain breakdown voltage of at least 8 V can be attained without causing punch-through in the ordinary device operating region. The threshold voltage of the FET formed at the side wall portion rises due to the formation of the p-type heavily-doped region 40, but it does not become so high as presumed from the spatial concentration because B (boron) is re-distributed in the side wall portion by the gate oxidation and the effective channel length becomes substantially close to the thickness of the barrier layer.

With the element structure of FIG. 102 to which the present invention is applied, the effective channel length is short, and the channel width is the whole perimeter of the p-type region 40. Therefore, the element can attain a very great transconductance when compared with a planar element which is fabricated with the same area.

While the present embodiment has referred to the n-channel MOSFET, the invention can be also applied to a p-channel MOSFET as it is by inverting the polarities of the conductivity types. Besides, in the present embodiment, the p-type heavily-doped region has been formed at the position of approximately half of the height of the p-type region 42 by the process of ion implantation of high energy, and this takes into consideration the positional matching thereof with the gate electrode. However, the formation of the heavily-doped p-type region 40 is not restricted to the high energy ion implantation. By way of example, this region 40 can also be formed in the vicinity of the surface of the element by diffusion following ion implantation at low energy. Alternatively, it may well be formed merely by diffusion, or it can also be formed by fabricating it in the p-type layer 42 at the same time as the formation thereof. Since, however, element characteristics are structure-sensitive, the dopant concentration and distribution need to be strictly reproduced.

An embodiment in the case of forming the p-type heavily-doped layer by another method will be described below.

Figure 103:
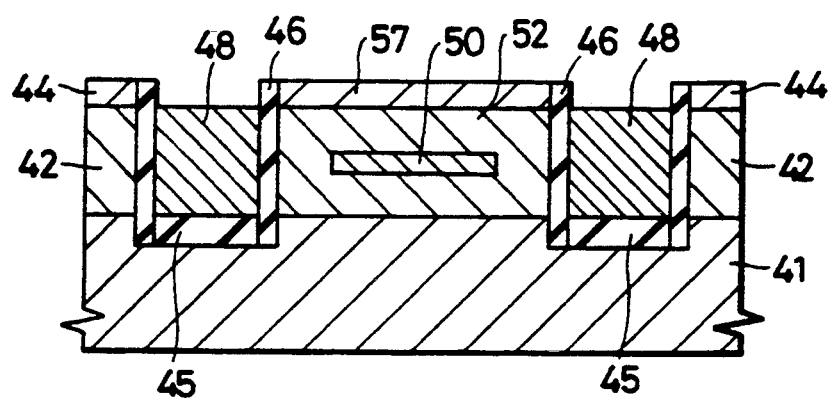

FIG. 103 shows an element section in the case where, among the steps elucidated in FIG. 45, the introduction of B is performed with a focused ion beam. The n+ region 41 of a substrate, and a p-type layer 42 are formed similarly to the steps in FIG. 102. When a heavily-doped p-type region 50 is formed, B ions are not implanted over the whole surface as in the preceding example, but the inner part of an insular p-type region 52 except the perimetric sides of 0.5 μm thereof is irradiated while being scanned with a B ion beam focused to a diameter of about 0.1 μm, thereby to obtain the shape of the high concentration region 50 as shown in FIG. 103. The formation of a surface n+ layer 44 is carried out also for the annealing of the implanted layer, and the succeeding formation of a gate/source insulator film 45, a gate oxide film 46 and a gate metal 48 is carried out as in the preceding example.

An advantage in the device operation achieved by the structure of the present element is the same as that explained in connection with FIG. 102, but the relative position and the dopant concentration and distribution of the heavily-doped p-type region 50 can be controlled at will. Therefore, in a case where gate electrodes are independently provided in different places within the identical insular p-type region 52, it is possible to fabricate a complex device of, for example, a structure wherein some FETs of unequal threshold voltages are connected in parallel. This is applicable to circuits for multi-level signal processing etc.

Figure 104:
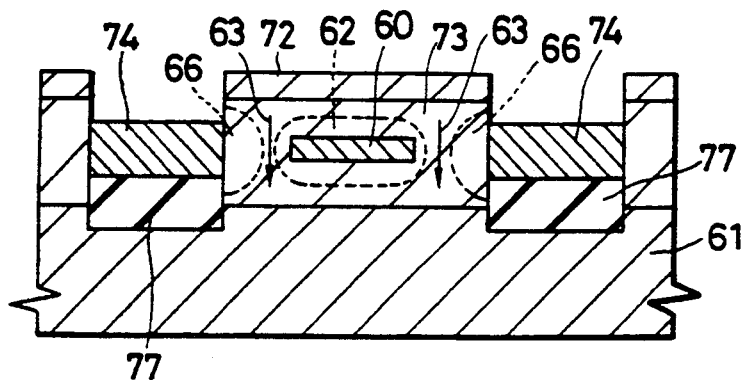

The process of doping at a fixed distance from a side wall can be applied to the junction type FET elucidated in FIG. 93 or to the Schottky barrier type FET. Thus, SITs of uniform characteristics can be formed at good reproducibility. Furthermore, the complex device as mentioned above can be fabricated. An example of the structure is shown in FIG. 104.

The structure of an element is formed with a p-type heavily-doped region 60 in an n-type high resistance layer 13. A substrate is provided with an n-type low resistance region 61, and an n-type low resistance region 12 through the n-type high resistance layer 13. At each side wall of the n-type high resistance layer 13, a metal gate 14 to define a Schottky junction therewith is provided in an manner to interpose an insulator film 17 between it and the source 61. The metal gate 14 may well be of low resistance p-type Si. In this case, a junction type FET structure is fabricated which is isolated by a p-n junction formed in such a way that some dopants diffuse from the p-type ASi into the n-type high resistance region 13.

In this structure, a source-drain current flows as indicated by arrows 63 through the gaps between depletion layers 66, which extend from the sides of the gates 14 formed on the side walls, and a depletion layer 62, which is formed between the n-type high resistance region 13 and the p-type heavily-doped region 60. While the size of the depletion layer gap depends upon the dopant concentration of the n-type high resistance region 13 and also upon the concentration of the p-type heavily-doped region 60 as well as the distance thereof from the side wall, these can be precisely controlled using a focused ion beam. Accordingly, the control level is higher than in the case where the size of the gap depends simply upon only the processing accuracy of the insular region 13 as in the prior art, and an operable element can be provided as to the insular region of any desired size.

The structure of the present invention is also applicable to a microminiaturized element. The impurity concentration of a semiconductor for use as the operating region of an element is $10^{15}$ cm$^{-3}$ or so, and this corresponds to the state in which $10^3$ impurity atoms are contained in 1 $\mu$m$^3$. In contrast, when one edge becomes about 0.4 $\mu$m, the number of impurity atoms contained in such a cube is less than 100, and statistical fluctuations make it difficult to uniformly realize the characteristics of elements. That is, a control by which quantized impurity atoms are contained in the elements is required. This problem can be solved in accordance with the purport of the present invention in such a way that, as shown in FIG. 105, the purity of a high resistance region 73 is raised to set a dopant concentration of $10^{13}$ cm$^{-3}$ or less by way of example, whereupon in this high resistance region 73, a heavily-doped region 78 which contains an impurity higher in concentration than that of the region 73 and in an amount determining the characteristics of an active region is formed using, for example, a focused ion beam.

Figure 105:
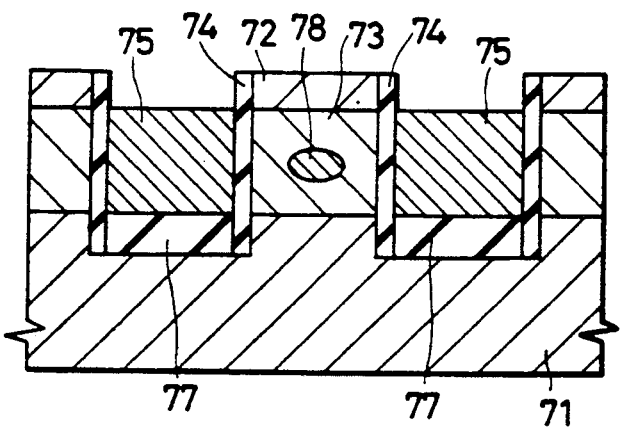

FIG. 105 shows the structure wherein the high resistance region 73 is formed in the shape of an island between an n-type low resistance region 71 provided in a silicon substrate and an-type low resistance region 72 provided at a front surface, and wherein the control of the element is performed by controlling the applied voltage of a gate electrode 75 which is disposed through a gate insulator film 74 provided at the side walls of the insular high resistance region 73. In the present element, the gate electrode 75 is isolated from the source 71 by an insulator film 77.

Since the high concentration p-type regions 78 are individually formed by the use of the focused ion beam, the impurity can be introduced into any desired device at an arbitrary dose in case of constructing an integrated circuit, and the threshold voltage etc. of, e.g., a MOS-FET can be set in controlled fashion. Besides, in a case where the width of the high resistance region in the direction parallel to the major surface of the substrate is below approximately 1 $\mu$m, the threshold voltage changes in proportion to the ion dose, and the quantity thereof suffices with $3 \times 10^{-16}$ c/$\mu$m or so in terms of a line density in the direction perpendicular to the sheet of FIG. 105. Accordingly, even when a focused beam having an output on the order of 1 nA is used, a depicting time period of 3'10$^{-7}$ sec/$\mu$m suffices, and a 4-inch wafer can be processed in a depicting time period of several minutes.

Figure 106:
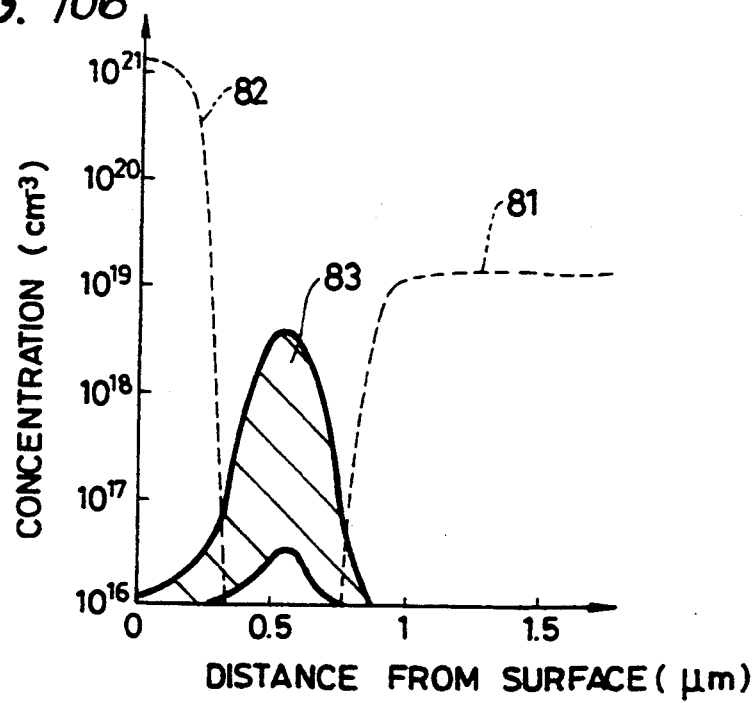

The concentration range of the p-type heavily-doped layer which is effective when used for the above purpose is illustrated in FIG. 106. This figure shows impurity concentration distributions which have been measured in the depthwise direction as to the middle part of the element exemplified in FIG. 102. Numeral 81 designates the P concentration of the high concentration n-type region provided in the substrate, numeral 82 designates the As concentration of the n-type low resistance region formed on the substrate surface, and a hatched region 83 designates the B concentration of the surface region which includes the p-type high concentration region formed by implantation.

In order to avoid the punch-through across the source and the drain elucidated in FIG. 101, a peak concentration of at least $10^{18}$ cm$^{-3}$ is sufficient in practical use, and even when this value is exceeded much, merely a long processing time is needed without any merit. Further, in the device shown in FIG. 103, the threshold voltage becomes too high to perform the device operation, and such a drawback as increase in crystal defects attributed to the introduction is incurred. On the other hand, in a case where the peak concentration is below $10^{16}$ cm$^{-3}$, the effect of the introduction of the impurity is not satisfactorily demonstrated.

Of course, FIG. 106 merely shows one example of the concentration distributions. In actuality, the range varies depending upon the shapes of the distributions, and as exemplified in FIG. 105, it is sometimes the case that the total amount of the impurity to be introduced contributes to the element characteristics. It will accordingly be understood important for the present invention that an intermediate layer is provided therein with a region which has an impurity concentration higher than a concentration in a semiconductor constituting the layer.

It will also be understood that, by reason of the operating characteristics of an element, the high concentration region of the present invention needs to be formed by introducing an impurity opposite in polarity to the conductivity type of regions which construct a source and a drain.

As set forth above, by applying the present invention, vertically operating elements which can be microminiaturized to attain various merits in element characteristics can be fabricated stably and reliably. Besides, by controlling the quantity of introduction of an impurity which constitutes a low resistance region to be formed by the present invention, element characteristics are controlled, and a new flexibility can be added in constructing an integrated circuit.

While the embodiments have principally explained the n-channel type, the present invention can also be applied to p-channel type elements by inverting the polarities of conductivity types. In addition, while silicon has been cited as an example of a semiconductor, it is needless to say that the invention is similarly applicable to a compound semiconductor such as GaAs.

Listed below are symbols in the drawings of FIGS. 63–106.

1, 11, 12 . . . capacitors, 2, 21, 22 . . . switching transistors, 3, 31, 32. . . bit lines, 4, 41, 42 . . . word lines, 5 . . . sense amplifiers, 6 . . . parasitic capacitance, 7 . . . active region, 8 . . . plate, 9 . . . contact hole, 10 . . . Si substrate, 11 . . . field oxide film, 12 . . . gate oxide film, 13 . . . first inter-layer, insulator film, 14 . . . second inter-layer insulator film, 15 . . . diffused layer, 16 . . . capacitor region, 17 . . . recess, 18 . . . capacitor SiO$_2$ film, 19 . . . capacitor Si$_3$N$_4$ film, 20 . . . isolation heavily-doped layer, 21 . . . protrusive Si portion, 22 . . . hole, 23 . . . filling insulator film, 24 . . . distance between a capacitor and a contact hole, 25 . . . capacitor electrode, 26 . . . protrusion, 27, 271, 272 . . . single crystal layer on an insulator film (SOI layer), 28 . . . switching transistor channel portion, 29 . . . substrate contact hole (capacitor electrode contact portion), 30 . . . polycrystalline Si oxide film, 31 . . . insulating substrate, 32 . . . Si$_3$N$_4$ film for LOCOS, 33 . . . strut, 34 . . . beam, 35 . . . seed crystal portion, 36 . . . unit memory cell, 37 . . . underlying insulator film, 38 . . . oxidation non-impermeable film, 39 . . . oxidation impermeable first inter-layer insulator film, 40 . . . junction gate.

What is claimed is:

1. A semiconductor memory comprising capacitors which are information storage portions, and insulated-gate field effect transistors which read out signal charges in said information storage portions, a part of said each capacitor being formed on side walls of an island region which is surrounded with a recess provided in a surface region of a semiconductor substrate, said island region being electrically isolated from other regions of said semiconductor substrate by said recess, wherein a plurality of said recesses are formed to provide a plurality of said islands, and wherein said plurality of recesses are respectively formed by the use of oxide regions spaced apart from one another;

wherein said oxide regions used to form said recesses include oxide mask regions and field oxide regions, wherein said oxide mask regions and said field oxide regions alternate with one another at the surface region of the semiconductor substrate;

wherein a pitch between said recesses is equal to ½ of a pitch between said oxide mask regions.

2. A semiconductor memory comprising capacitors which serve as information storage portions, and insulated gate field effect transistors which read out signal charges in said information storage portions, wherein each of said information storage portions of said capacitors is electrically isolated from a substrate, wherein a recess is formed in the substrate to form at least a part of each of said capacitors, wherein a side wall of said recess of each of said capacitors is surrounded by an insulating film and a plate electrode of the capacitor, and wherein a channel region of each of said insulated gate field effect transistors is formed over an information storage portion of a corresponding one of said capacitors, wherein each of said insulated gate field effect transistors is formed in a semiconductor layer on an insulating film.

3. A semiconductor memory comprising capacitors which serve as information storage portions, and insulated gate field effect transistors which read out signal charges in said information storage portions, wherein each of said information storage portions of said capacitors is electrically isolated from a substrate, wherein a recess is formed in the substrate to form at least a part of each of said capacitors, wherein a side wall of said recess of each of said capacitors is surrounded by an insulating film and a plate electrode of the capacitor, and wherein a channel region of each of said insulated gate field effect transistors is formed over an information storage portion of a corresponding one of said capacitors, wherein each of said insulated gate field effect transistors is a vertical transistor whose channel is perpendicular to a main surface of said substrate.

4. A semiconductor memory according to claim 3, wherein the plate electrode of each of said capacitors is formed over an insulating film.

5. A semiconductor memory according to claim 3, wherein a P-N junction is provided between each of said information storage portions of said capacitors and said substrate to electrically isolate the information storage portions from said substrate.

* * * * *